(12) United States Patent
Chan et al.

(10) Patent No.: US 10,507,913 B2
(45) Date of Patent: Dec. 17, 2019

(54) HYPERSONIC AIRCRAFT HAVING HOMOPOLAR MOTOR WITH GRADED RESISTANCE

(71) Applicant: North Carolina State University, Raleigh, NC (US)

(72) Inventors: Wan-Kan Chan, Raleigh, NC (US); Justin Schwartz, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 348 days.

(21) Appl. No.: 15/624,259

(22) Filed: Jun. 15, 2017

(65) Prior Publication Data

US 2019/0009903 A1  Jan. 10, 2019

Related U.S. Application Data

(60) Provisional application No. 62/350,485, filed on Jun. 15, 2016.

(51) Int. Cl.
*B64C 30/00* (2006.01)
*H01F 6/02* (2006.01)
(Continued)

(52) U.S. Cl.
CPC .............. *B64C 30/00* (2013.01); *B64D 27/24* (2013.01); *H01F 6/02* (2013.01); *H01F 6/06* (2013.01);
(Continued)

(58) Field of Classification Search
CPC ........... B64C 30/00; B64D 27/24; H01F 6/02; H01F 6/06; H01F 41/048; H01L 39/02
(Continued)

(56) References Cited

U.S. PATENT DOCUMENTS 3,678,306 A  7/1972 Garnier et al.
5,052,638 A * 10/1991 Minovitch ............. B64G 1/405
244/171.1
(Continued)

OTHER PUBLICATIONS

PCT/US2017/037719, "International Search Report and Written Opinion," dated Nov. 8, 2017, 23 pages.
(Continued)

*Primary Examiner* — Christopher P Ellis
(74) *Attorney, Agent, or Firm* — Kilpatrick Townsend & Stockton LLP

(57) ABSTRACT

A hypersonic aircraft having a homopolar motor with high temperature superconducting (HTS) non-insulated (NI) coil magnets is described. In some implementations, the HTS NI coil magnets can have a graded resistance design. In some implementations, the HTS NI coil magnets can include a series of stacked coils, each of the series of coils comprising multiple turns having turn-to-turn resistance, where the turn-to-turn resistance of the series of coils is graded coil-to-coil across the magnet. In some implementations, the HTS NI coil magnets can include an NI coil comprising multiple turns and two or more thermal barriers each disposed between two adjacent turns of the coil, where an electrically conductive portion of one of the thermal barriers does not overlap with an electrically conductive portion of a different adjacent one of the thermal barriers. Some implementations can include a disk-type homopolar motor/generator including one or more HTS NI coil magnets.

6 Claims, 39 Drawing Sheets
(22 of 39 Drawing Sheet(s) Filed in Color)

(51) Int. Cl.
 H01F 6/06 (2006.01)
 H01L 39/02 (2006.01)
 B64D 27/24 (2006.01)
 H01F 41/04 (2006.01)
 B64C 23/00 (2006.01)
(52) U.S. Cl.
 CPC ........... *H01F 41/048* (2013.01); *H01L 39/02* (2013.01); *B64C 23/005* (2013.01)
(58) Field of Classification Search
 USPC ...................................................... 244/53 R
 See application file for complete search history.

(56) References Cited

U.S. PATENT DOCUMENTS

| 7,982,566 | B2 | 7/2011 | Kasten et al. | |
|---|---|---|---|---|
| 9,117,578 | B2 | 8/2015 | Hahn et al. | |
| 2007/0126292 | A1* | 6/2007 | Lugg | F01D 5/03 310/11 |
| 2010/0087322 | A1* | 4/2010 | Yuan | H01B 12/16 505/163 |
| 2017/0240266 | A1* | 8/2017 | Clemen, Jr. | B64C 1/38 |
| 2019/0006072 | A1* | 1/2019 | Hull | H01F 6/00 |

OTHER PUBLICATIONS

Song, H. et al., "Winding, Fabrication, Engineering Design, and Other Considerations for 2G HTS Coils," Magnet Technology 2013, Session 5OrAB, Jul. 15-19, 2013, Boston, MA http://www.superpower-inc.com/system/files/2013_0715+MT23+HSong+-+2G=HTS+Coil_Final.pdf.

Wang, Y. et al., "Influence of turn-to-turn resistivity and coil geometrical size on charging characteristics of no-electrical-insulation REBCO pancake coils," Supercond. Sci. Technol. 29 (2016) 075006, 10 pages.

PCT/US2017/037719, "Invitation to Pay Additional Fees and Partial Search Report", dated Aug. 28, 2017, 3 pages.

* cited by examiner

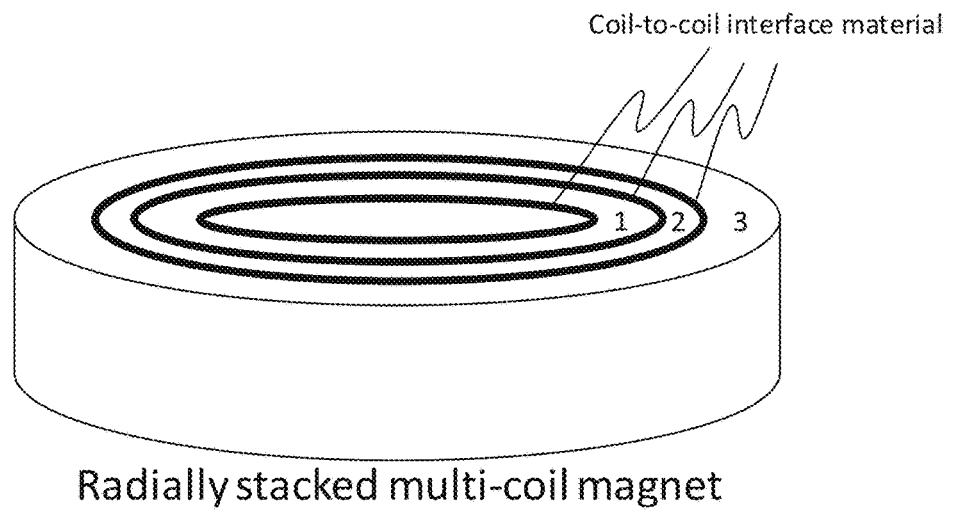
Radially stacked multi-coil magnet
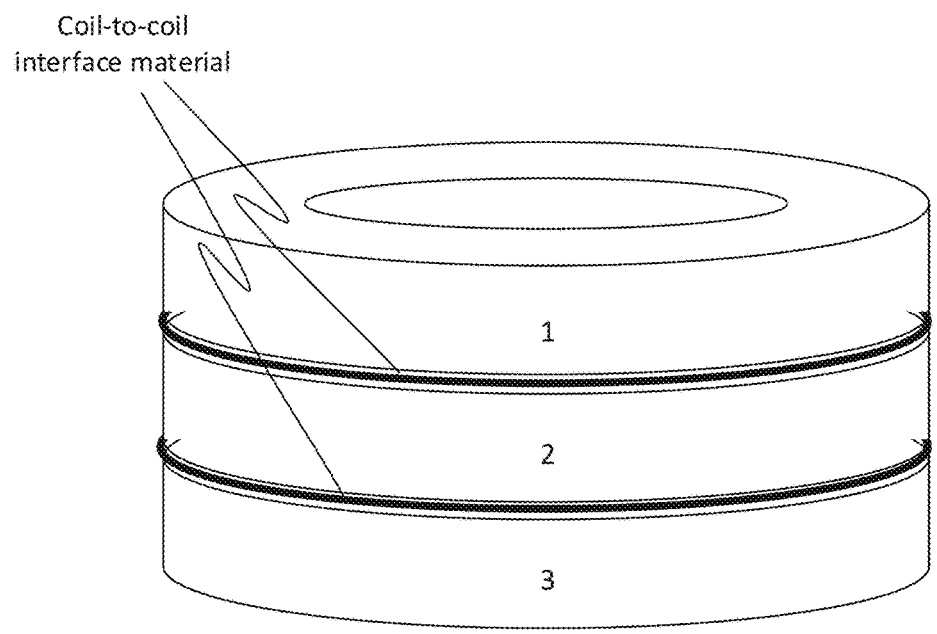
Axially stacked multi-coil magnet
FIG. 2D

TABLE I. SPECIFICATIONS OF THE DP COIL AND MAGNET SYSTEM

| Parameters | Coil & magnet |
| --- | --- |
| Turns of each DPC | 130×2 |
| Number of DPC (upper to lower) | 7 |
| Inner diameter of the magnet | 100 mm |
| Outer diameter of the magnet | 133 mm |
| Height of the magnet | 75 mm |
| Inductance of each DPC, $L_{coil}$ | 12 mH |
| Inductance of the Magnet, $L_{magn}$ | 295 mH |
| $B_z$ per amp at center | 16 mT |
| Turn-to-turn resistivity | 70 $\mu\Omega\cdot cm^2$ |
| $I_c$ @ 40 K, magnet | 110 A |

FIG. 3B

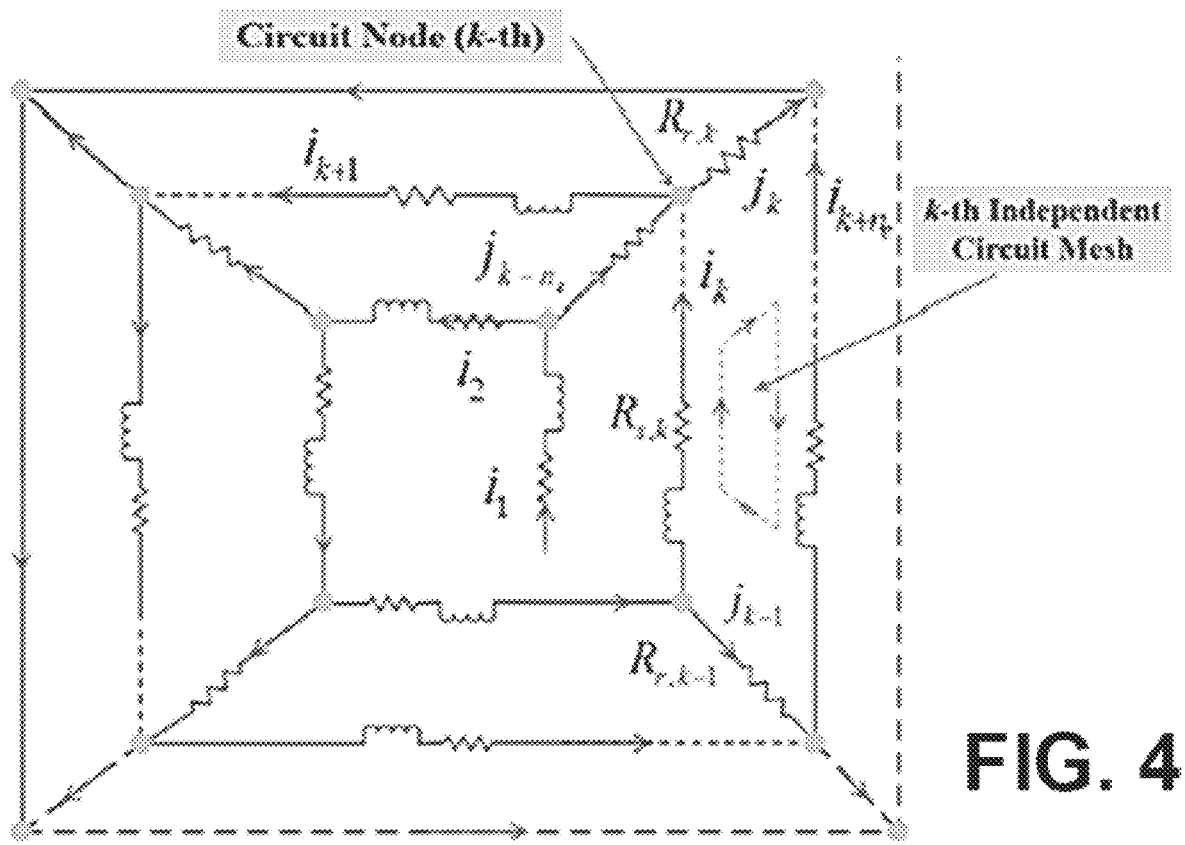

FIG. 4

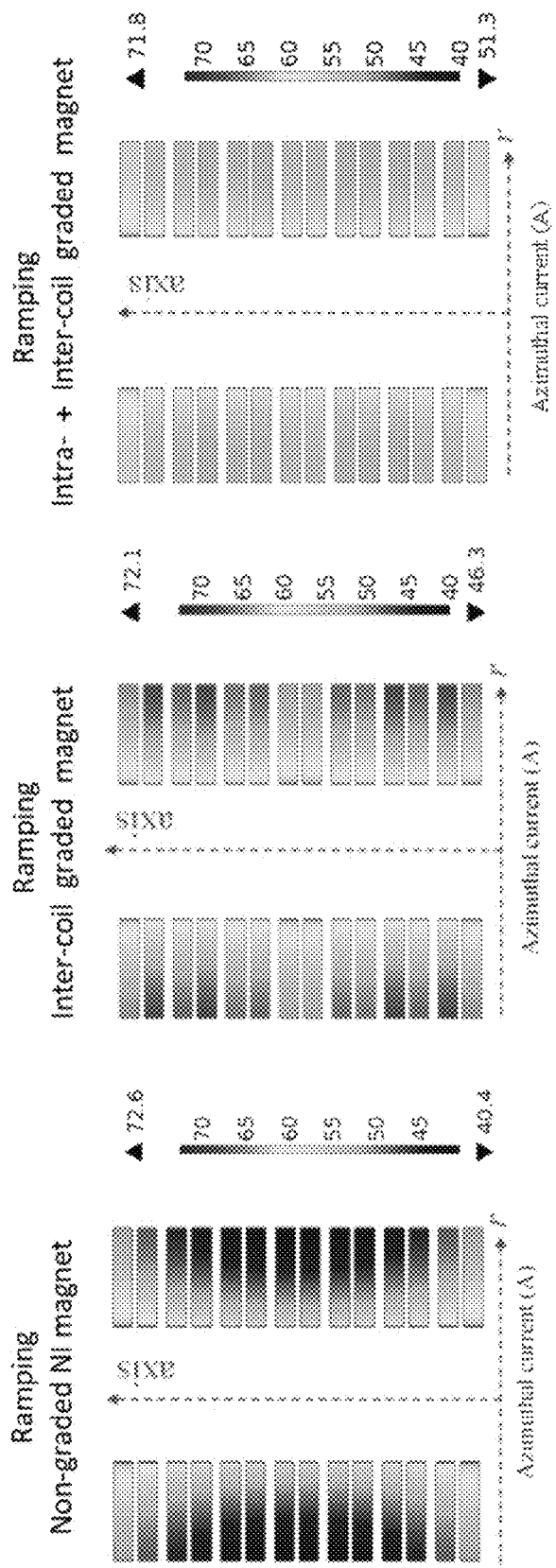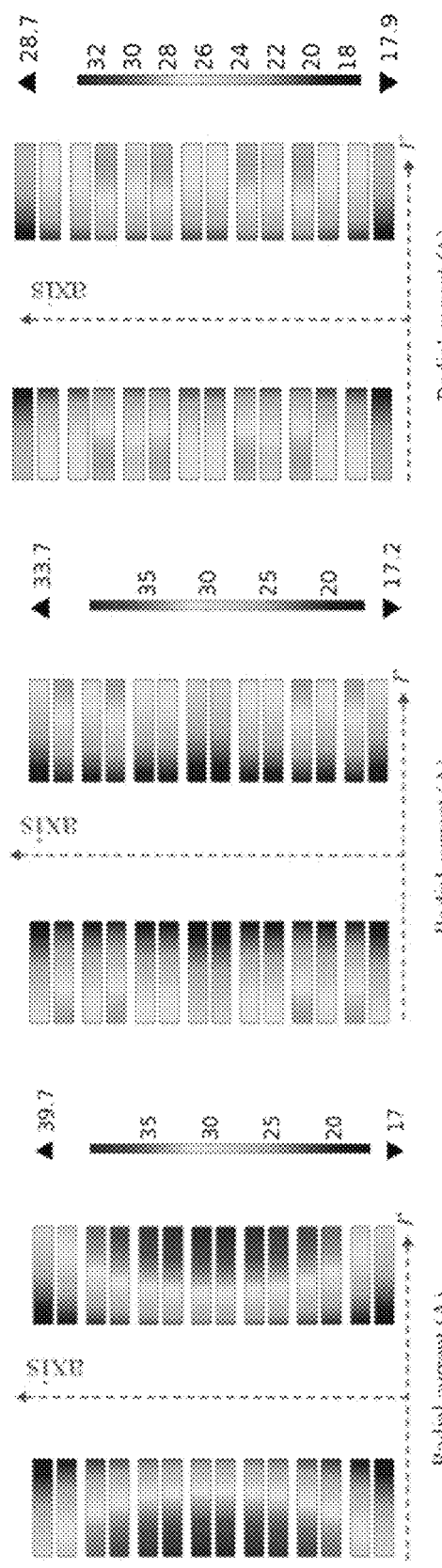
FIG. 5A  FIG. 5B  FIG. 5C

TABLE II. INDUCTANCES AND MUTUAL INDUCTANCE IN THE 7 DOUBLE PANCAKE COILS

|      | DPC1  | DPC2 | DPC3 | DPC4 | DPC5 | DPC6 | DPC7 |
|------|-------|------|------|------|------|------|------|
| DPC1 | 11.9* | 8.3  | 5.4  | 3.8  | 2.8  | 2.1  | 1.6  |
| DPC2 | 8.3   | 11.9 | 8.3  | 5.4  | 3.8  | 2.8  | 2.1  |
| DPC3 | 5.4   | 8.3  | 11.9 | 8.3  | 5.4  | 3.8  | 2.8  |
| DPC4 | 3.8   | 5.4  | 8.3  | 11.9 | 8.3  | 5.4  | 3.8  |
| DPC5 | 2.8   | 3.8  | 5.4  | 8.3  | 11.9 | 8.3  | 5.4  |
| DPC6 | 2.1   | 2.8  | 3.8  | 5.4  | 8.3  | 11.9 | 8.3  |
| DPC7 | 1.6   | 2.1  | 2.8  | 3.8  | 5.4  | 8.3  | 11.9 |

* Unit: mH

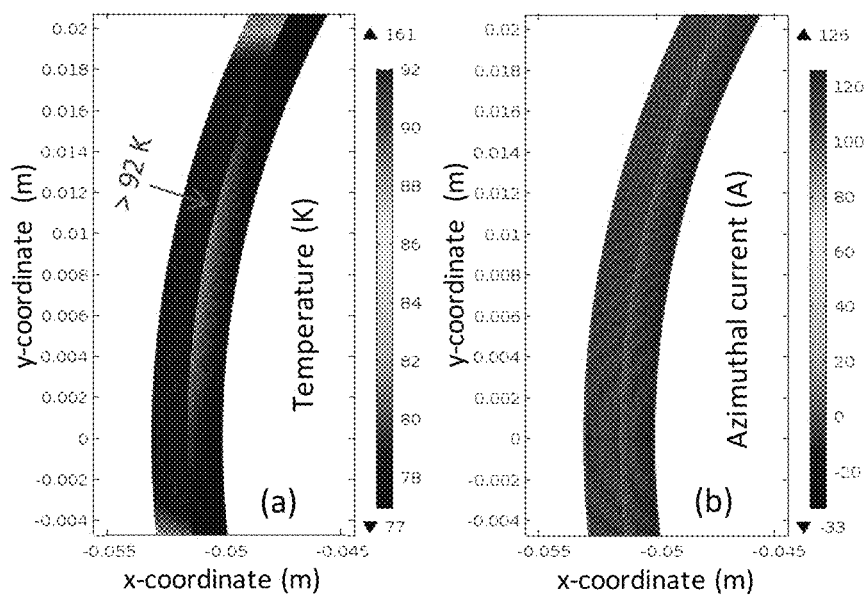
FIG. 19A  FIG. 19B
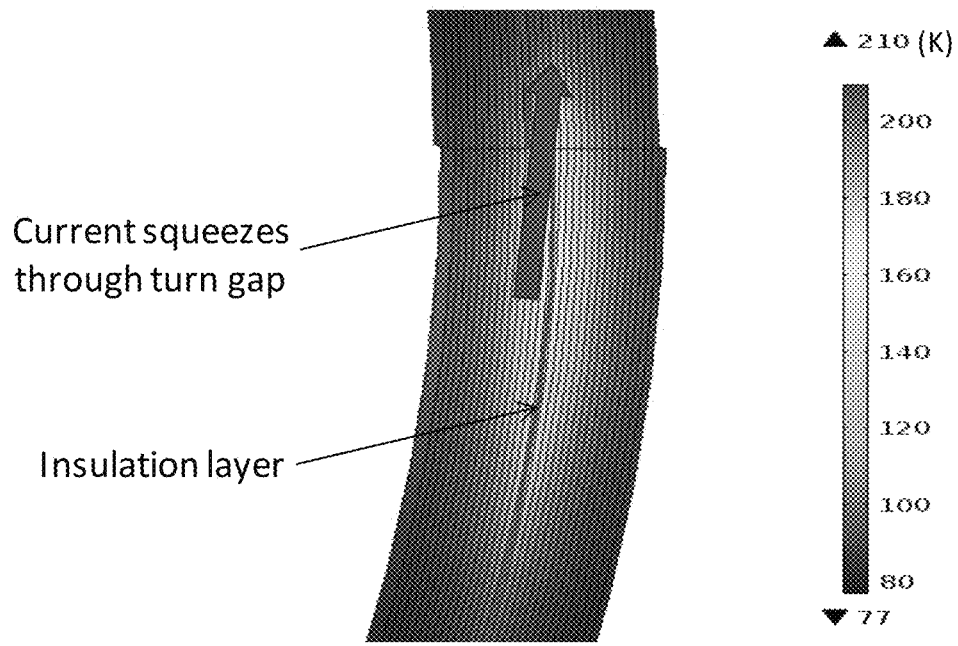
FIG. 20

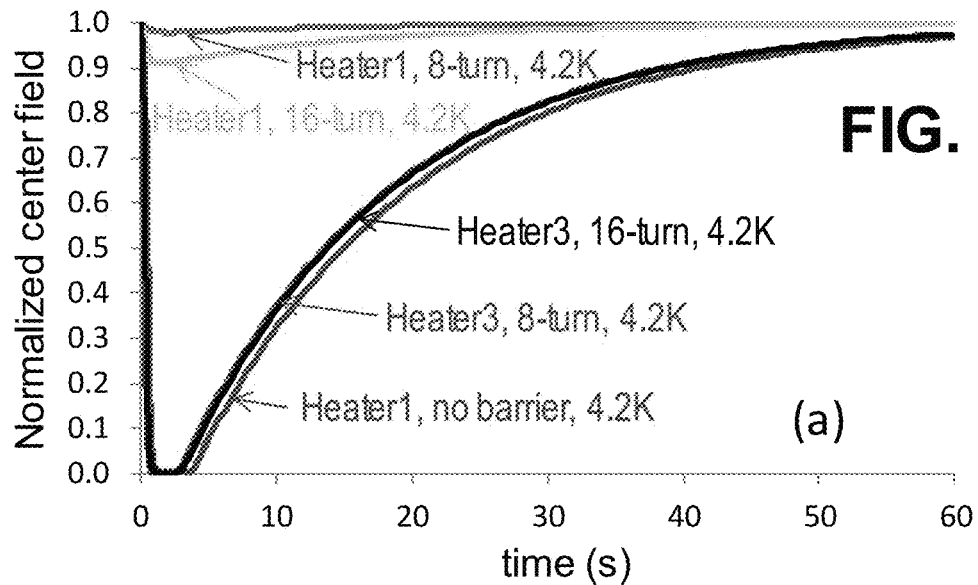
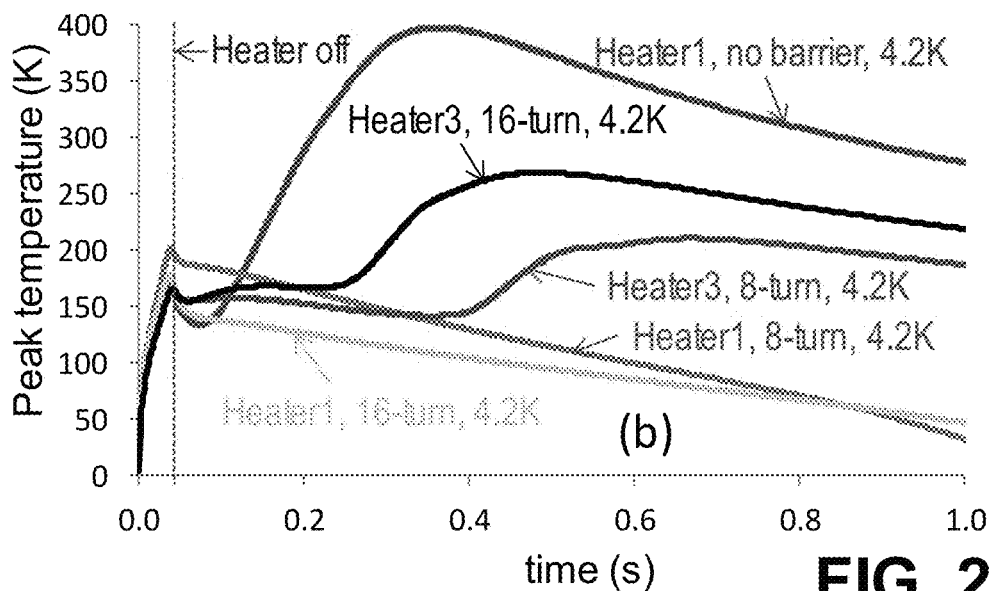

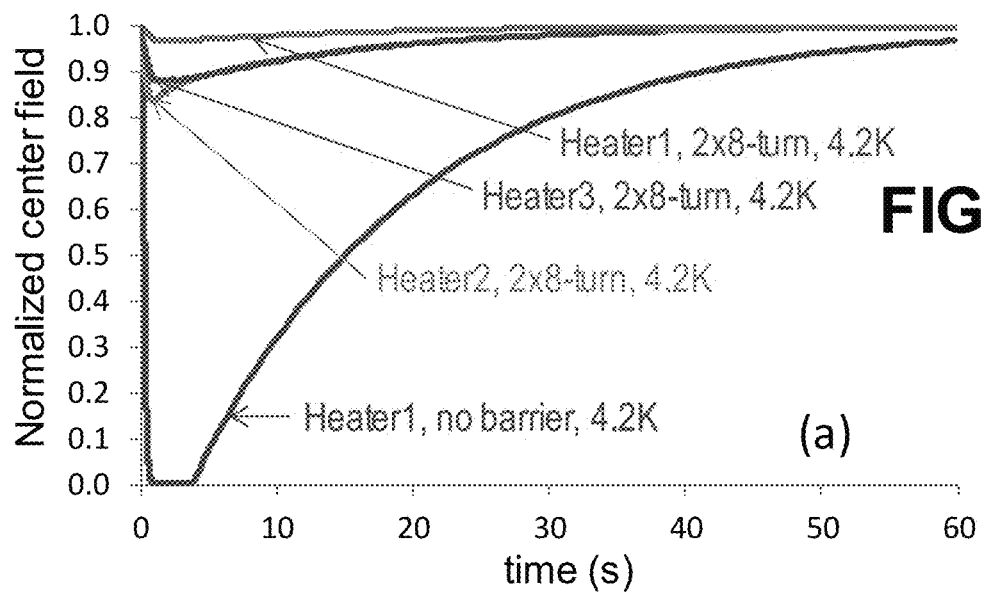
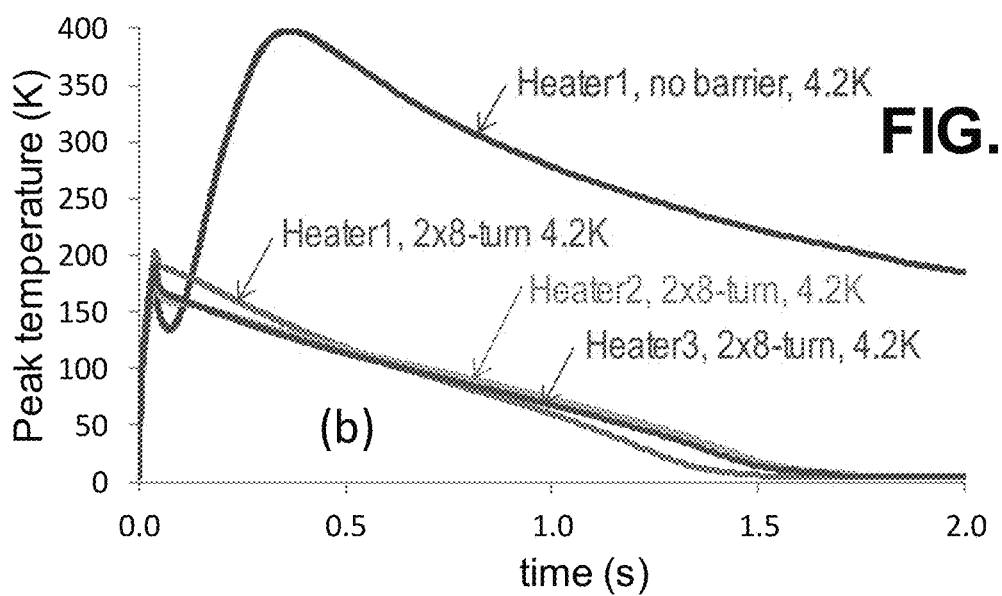

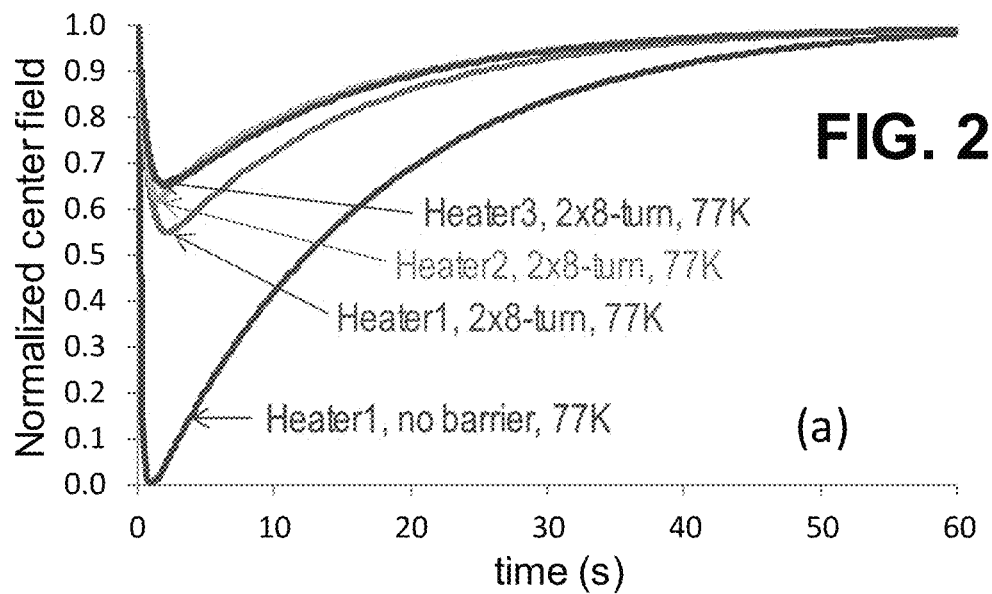
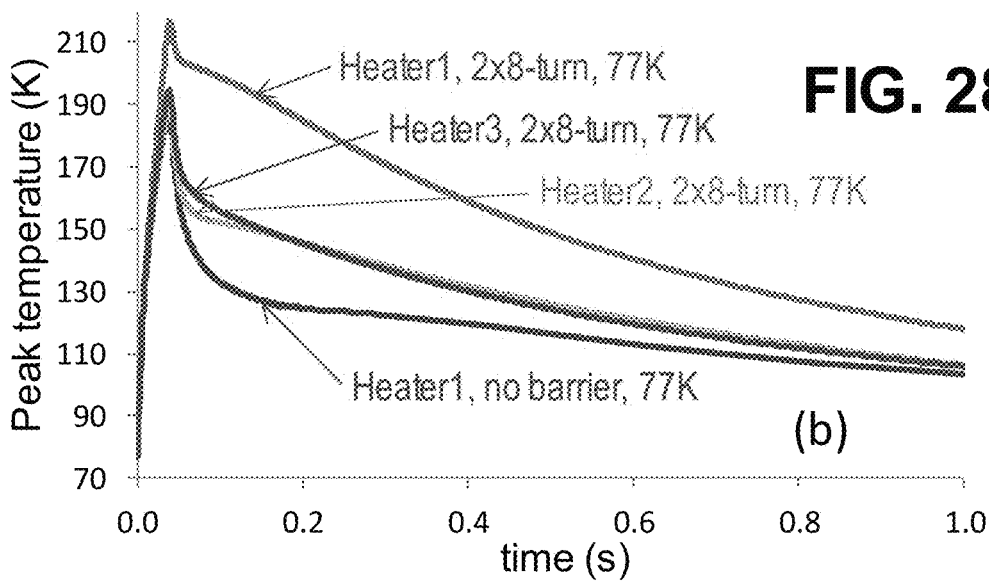

TABLE 1

| | |
|---|---|
| REBCO thickness | 1 µm |
| Total stabilizer thickness | 40 µm |
| Substrate thickness | 50 µm |
| Tape width | 4 mm |
| Tape thickness | ~0.1 mm |
| Coil inner diameter | 10 cm |
| Turn number (current input and output leads are at opposite sides) | 39.5 turns |
| Turn-to-turn contact resistivity, $\rho_r$ @ 77 K | 70 µΩ-cm$^2$ |
| Self-inductance, $L$ | ~4 mH |
| Heater energy (over 40 ms duration) | 19.04 J |

FIG. 35

TABLE 2

| | |
|---|---|
| Parameter $k$ in $I_c(B, \theta)$ (equation (7)) | 0.0605 |
| Parameter $b$ in $I_c(B, \theta)$ (equation (7)) | 0.7580 |
| Parameter $B_c$ in $I_c(B, \theta)$ (equation (7)) | 103 mT |
| Center magnetic field | 0.034 T |
| Critical current, self-field, $I_{c0} = I_c(\text{sf}, 77 \text{ K})$ | 220 A |
| Critical current, in-field, $I_c(B_{max}, 77 \text{ K})$ | 115.5 A |
| Operating current, $I_o$ | 80 A |
| Critical temperature, $T_c$ | 92 K |
| Operating temperature, $T_0$ | 77 K |
| Maximum of cooling power $P_c$ on cooling boundaries | 80 Watt |

FIG. 36

TABLE 3

| | |
|---|---|
| Parameter $k$ in $I_c(B, \theta)$ (equation (7)) | 0.03813 |
| Parameter $b$ in $I_c(B, \theta)$ (equation (7)) | 0.7122 |
| Parameter $B_c$ in $I_c(B, \theta)$ (equation (7)) | 631 mT |
| Center magnetic field | 0.104 T |
| Critical current, self-field @ 4.2 K, $I_{c0} = I_c(\text{sf}, 4.2 \text{ K})$ | 720 A |
| Critical current, in-field @ 4.2 K, $I_c(B_{max}, 4.2 \text{ K})$ | 360 A |
| Operating current, $I_o$ | 245 A |
| Critical temperature, $T_c$ | 92 K |
| Operating temperature, $T_0$ | 4.2 K |
| Cooling heat flux | LHe boiling |

FIG. 37

HYPERSONIC AIRCRAFT HAVING HOMOPOLAR MOTOR WITH GRADED RESISTANCE

This application claims the benefit of U.S. Provisional Application No. 62/350,485, entitled "Mechanisms Improving Performance of Superconducting Magnets" and filed on Jun. 15, 2016.

Embodiments relate generally to aircraft, and more particularly to hypersonic aircraft having a homopolar motor with a superconducting magnet.

Some implementations (first implementations) include a hypersonic aircraft having a disk-type homopolar motor/generator, the disk-type homopolar motor/generator comprising an electrically conductive metal disk, an electrically conductive shaft, a first electrical contact, a second electrical contact, and a high temperature superconducting (HTS) non-insulated (NI) coil magnet. The electrically conductive shaft can be coupled, mechanically and electrically, to the electrically conductive metal disk. The first electrical contact can be configured to be in electrical contact with an edge of the electrically conductive metal disk. The second electrical contact can be configured to be in electrical contact with the electrically conductive shaft. The HTS NI coil magnet comprising a series of coils that are stacked, each of the series of coils comprising multiple turns having turn-to-turn resistance, where the turn-to-turn resistance of the series of coils is graded coil-to-coil across the HTS NI coil magnet. The HTS NI coil magnet can be arranged so that a normal component of a magnetic field generated by the HTS NI coil magnet is substantially perpendicular to a face of the metal disk.

In some first implementations, the series of coils of the HTS NI coil magnet are axially stacked and graded coil-to-coil along an axial length of the HTS NI coil magnet. In some first implementations, the series of coils of the HTS NI coil magnet are radially stacked and graded coil-to-coil along a radius of the HTS NI coil magnet. In some first implementations, the turn-to-turn resistance of a first coil of the series of coils is different than the turn-to-turn resistance of a second coil of the series of coils, wherein the second coil is stacked adjacent to the first coil. In some first implementations, the turn-to-turn resistance of each of the series of coils has a constant turn-to-turn resistance. In some first implementations, the turn-to-turn resistance of each of the series of coils is graded turn-to-turn with respect to the multiple turns of that coil. In some first implementations, the turn-to-turn resistance is radially graded from a first innermost turn to a last outermost turn of the multiple turns. In some first implementations, turn-to-turn resistance varies as a step function of turn number. In some first implementations, the turn-to-turn resistance of each turn of the multiple turns increases from a first innermost turn to a last outermost turn of the multiple turns.

In some first implementations, turn-to-turn resistance varies piecewise continuously from a first innermost turn to a last outermost turn of the multiple turns. In some first implementations, the turn-to-turn resistance varies piecewise linearly or piecewise nonlinearly. In some first implementations, turn-to-turn resistance is an electrical resistance or a thermal resistance. In some first implementations, the turn-to-turn resistance of the series of coils is graded coil-to-coil across the HTS NI coil magnet using a layer selected from the group consisting of: a co-wound layer having thermal resistive and electrical conductive segments; a layer soldered or bonded to a winding conductor, the soldered or bonded layer having thermal resistive and electrical conductive segments; a printed layer on a co-wound layer, the printed layer on the co-wound layer having thermal resistive and electrical conductive segments; and a printed layer on a surface of a winding conductor, the printed layer on the surface of the winding conductor having thermal resistive and electrical conductive segments. In some first implementations, the NI coil includes a winding conductor that can be non-insulated YBCO superconductor tape, non-insulated REBCO superconductor tape, or non-insulated Bi-2223 multi-filamentary superconductor tape.

Some implementations (second implementations) include a high temperature superconducting (HTS) non-insulated (NI) coil magnet, comprising a series of coils that are stacked and coil-to-coil interfacial materials disposed between adjacent coils of the series of coils. Each of the series of coils that are stacked comprising multiple turns. The coil-to-coil interfacial materials comprising thin conductive materials with low coil-to-coil interfacial resistances that are graded coil-to-coil across the HTS NI coil magnet.

In some second implementations, the series of coils are axially stacked and graded coil-to-coil along an axial length of the HTS NI coil magnet or are radially stacked and graded coil-to-coil along a radius of the HTS NI coil magnet.

In some second implementations, the coil-to-coil interfacial resistance varies piecewise linearly or piecewise nonlinearly along the radius of the coil-to-coil interfacial materials of axially stacked coils or along an axial width of the coil-to-coil interfacial materials of the radially stacked coils. In some second implementations, the coil-to-coil interfacial resistance is an electrical resistance or a thermal resistance. In some second implementations, the coil-to-coil interfacial resistance of the multiple turns varies dynamically based upon local magnetic field strength. In some second implementations, the coil-to-coil interfacial resistance of the multiple turns varies dynamically based upon temperature.

In some second implementations, the coil-to-coil interfacial materials are formed as a layer having thermal resistive and electrical conductive segments, a layer soldered or bonded to a conductive layer, the soldered or bonded layer having thermal resistive and electrical conductive segments, or a printed layer on a conductive layer, the printed layer having thermal resistive and electrical conductive segments.

Some implementations (third implementations) include a homopolar motor/generator including an HTS NI coil magnet of the second implementations. Some implementations (fourth implementations) include an aircraft including the homopolar motor/generator of the third implementations. In some fourth implementations, the aircraft is a hypersonic aircraft.

Some implementations (fifth implementations) include an HTS NI coil magnet comprising a coil including multiple turns having turn-to-turn resistance, where the turn-to-turn resistance of the coil is graded turn-to-turn with respect to the multiple turns.

In some fifth implementations, the coil is axially stacked or radially stacked with a second coil including multiple turns having turn-to-turn resistance, where the turn-to-turn resistance of the second coil is graded turn-to-turn with respect to the multiple turns. In some fifth implementations, turn-to-turn resistance varies as a step function of conductor length. In some fifth implementations, turn-to-turn resistance increases as a step function of turn number from a first innermost turn to a last outermost turn of the multiple turns. In some fifth implementations, the turn-to-turn resistance varies as a piecewise linear or piecewise nonlinear function of conductor length. In some fifth implementations, the turn-to-turn resistance is an electrical resistance or a thermal resistance. In some fifth implementations, the turn-to-turn resistance of the multiple turns varies dynamically based upon local magnetic field strength. In some fifth implementations, the turn-to-turn resistance of the multiple turns varies dynamically based upon temperature.

In some fifth implementations, the turn-to-turn resistance of the coil is graded turn-to-turn with respect to the multiple turns using a layer selected from the group consisting of: a co-wound layer having thermal resistive and electrical conductive segments; a layer soldered or bonded to a winding conductor, the soldered or bonded layer having thermal resistive and electrical conductive segments; a printed layer on a co-wound layer, the printed layer on the co-wound layer having thermal resistive and electrical conductive segments; and a printed layer on a surface of a winding conductor, the printed layer on the surface of the winding conductor having thermal resistive and electrical conductive segments.

In some fifth implementations, the NI coil includes a winding conductor that can be non-insulated YBCO superconductor tape, non-insulated REBCO superconductor tape, or non-insulated Bi-2223 multi-filamentary superconductor tape.

Some implementations (sixth implementations) include a homopolar motor/generator including an HTS NI coil magnet of the fifth implementations. Some implementations (seventh implementations) include an aircraft including a homopolar motor/generator of the sixth implementations. In some seventh implementations, the aircraft is a hypersonic aircraft.

Some implementations (eighth implementations) include a hypersonic aircraft having a disk-type homopolar motor/generator comprising an electrically conductive metal disk, an electrically conductive shaft, a first electrical contact, a second electrical contact, and an HTS NI multi-coil magnet. The electrically conductive shaft can be coupled, mechanically and electrically, to the electrically conductive metal disk. The first electrical contact can be configured to be in electrical contact with an edge of the electrically conductive metal disk. The second electrical contact can be configured to be in electrical contact with the electrically conductive shaft. The HTS multi-coil magnet can comprise a plurality of NI coils and two or more thermal barriers. The plurality of NI coils can each comprise multiple turns. The two or more thermal barriers can each be disposed between a different two adjacent turns of the NI coil, where an electrically conductive portion of one of the thermal barriers does not overlap with an electrically conductive portion of a different adjacent one of the thermal barriers. The HTS NI coil magnet can be arranged so that a normal component of a magnetic field generated by the HTS NI coil magnet is substantially perpendicular to a face of the metal disk.

In some eighth implementations, the electrically conductive portion of the one of the thermal barriers is covered by a thermal resistive portion of the different adjacent one of the thermal barriers. In some eighth implementations, a thermal resistive portion of the one of the thermal barriers overlaps with a thermal resistive portion of the different adjacent one of the thermal barriers. In some eighth implementations, the NI multi-coil includes a winding conductor that can be YBCO superconductor tape, non-insulated REBCO superconductor tape, or non-insulated Bi-2223 multi-filamentary superconductor tape. In some eighth implementations, each of the two or more segmented barriers is formed as: a co-wound layer having thermal resistive and electrical conductive segments; a layer soldered or bonded to a winding conductor, the soldered or bonded layer having thermal resistive and electrical conductive segments; a printed layer on a co-wound layer, the printed layer on the co-wound layer having thermal resistive and electrical conductive segments; or a printed layer on a surface of a winding conductor, the printed layer on the surface of the winding conductor having thermal resistive and electrical conductive segments. In some eighth implementations, the coil is a circular pancake coil or a racetrack coil.

Some implementations (ninth implementations) include as HTS NI coil magnet comprising an NI coil, a first thermal barrier, and a second thermal barrier. The NI coil can comprise multiple turns. The first thermal barrier can be disposed between a first two adjacent turns of the coil, the first barrier comprising a first electrical conductive portion. The second thermal barrier can be disposed between a second two adjacent turns of the coil, the second barrier comprising a second electrical conductive portion. The first electrical conductive portion of the first thermal barrier not overlapping any portion of the second electrical conductive portion of the second thermal barrier.

In some ninth implementations, the first and second electrical conductive portions are gaps in the respective first and second thermal barriers. In some ninth implementations, the first electrical conductive portion of the first thermal barrier is covered by a thermal resistive portion of the second thermal barrier. In some ninth implementations, the first thermal barrier further comprises a first thermal resistive portion, the second thermal barrier further comprises a second thermal resistive portion, and the first thermal resistive portion of the first thermal barrier overlaps with the second thermal resistive portion of the second thermal barrier. In some ninth implementations, an overlapping length of the first thermal resistive portion of the first thermal barrier and the second thermal resistive portion of the second thermal barrier is confined in 45°.

In some ninth implementations, the HTS NI coil magnet of further comprises a current input lead and a current output lead. The current input lead can be disposed at an innermost turn or an outermost turn of the coil and at a first half portion of the coil. The current output lead can be disposed at a different one of the innermost and outermost turns than the current input lead and at a second half portion of the coil opposite the first half portion.

In some ninth implementations, the first thermal barrier is an innermost barrier or an outermost barrier, and the first electrical conductive portion of the first thermal barrier is covered by a thermal resistive portion of the second thermal barrier. In some ninth implementations, the first thermal resistive portion of the first thermal barrier overlaps with the thermal resistive portion of the second thermal barrier. In some ninth implementations, the HTS NI coil magnet further comprises a third thermal barrier disposed between a third two adjacent turns of the coil. The third barrier can comprise a third electrical conductive portion. The third thermal barrier can be between the first and second thermal barriers, the third electrical conductive portion not overlapping any portion of the first electrical conductive portion of the first thermal barrier and not overlapping any portion of the second electrical conductive portion of the second thermal barrier. The third electrical conductive portion can be covered by a thermal resistive portion of the first thermal barrier, and covered by a thermal resistive portion of the second thermal barrier. In some ninth implementations, the third thermal barrier further includes a third thermal resistive portion. The third thermal resistive portion can be overlapped by the first thermal resistive portion of the first thermal barrier, and overlapped by the second thermal resistive portion of the second thermal barrier.

In some ninth implementations, an overlapping length of the first thermal resistive portion of the first thermal barrier, the second thermal resistive portion of the second resistive portion, and the third thermal resistive portion of the third resistive portion is confined in 45°.

In some ninth implementations, the coil is a circular pancake coil or a racetrack coil. In some ninth implementations, the HTS NI coil magnet further comprises one or more additional NI coils. The one or more additional coils and the coil can be connected. Each of the one or more additional coils can have two or more thermal barriers each disposed between a different two adjacent turns of the respective one of the one or more additional coils.

In some ninth implementations, the two or more thermal barriers of at least one of the one or more additional barriers has a different arrangement than that of the first and second thermal barriers of the coil. In some ninth implementations, the first thermal barrier is a co-wound layer having thermal resistive and electrical conductive segments. In some ninth implementations, the first thermal barrier is a layer soldered or bonded to a winding conductor, the soldered or bonded layer having thermal resistive and electrical conductive segments. In some ninth implementations, the first thermal barrier is a printed layer on a co-wound layer, the printed layer having thermal resistive and electrical conductive segments. In some ninth implementations, the first thermal barrier is a printed layer on a surface of a winding conductor, the printed layer having thermal resistive and electrical conductive segments.

Some implementations (tenth implementations) include a homopolar motor/generator including an HTS NI coil magnet of the ninth implementations. Some implementations (eleventh implementations) include aircraft including a homopolar motor/generator of the tenth implementations. In some eleventh implementations, the aircraft is a hypersonic aircraft.

Some implementations (twelfth implementations) include an HTS NI coil magnet comprising an NI coil including multiple turns, and two or more segmented barriers. Each of the segmented barriers can be disposed between a different two adjacent turns of the NI coil. Each of the two or more segmented barriers can include one or more electrical conductive segments and one or more thermal resistive segments.

In some twelfth implementations, each of the one or more electrical conductive segments of a first barrier of the two or more segmented barriers is covered by a thermal resistive segment of a second barrier of the two or more segmented barriers, the second barrier being adjacent to the first barrier. In some twelfth implementations, each of the one or more electrical conductive segments of the first barrier is covered by a thermal resistive segment of a third barrier of the two or more segmented barriers, the third barrier being adjacent to the first barrier. In some twelfth implementations, each of the one or more thermal resistive segments of a first barrier of the two or more segmented barriers overlaps with a thermal resistive segment of a second barrier of the two or more segmented barriers, the second barrier being adjacent to the first barrier.

In some twelfth implementations, each of the one or more thermal resistive segments of the first barrier overlaps with a thermal resistive segment of a third barrier of the two or more segmented barriers, the third barrier being adjacent to the first barrier. In some twelfth implementations, an overlapping length of the thermal resistive segments of a first barrier of the two or more segmented barriers and the thermal resistive segments of a second barrier of the two or more segmented barriers are confined in 45°, the second barrier being adjacent to the first barrier. In some twelfth implementations, an overlapping length of the thermal resistive segments of a first barrier of the two or more segmented barriers, the thermal resistive segments of a second barrier of the two or more segmented barriers, and the thermal resistive segments of a third barrier of the two or more segmented barriers are confined in 45°, the second barrier being adjacent to the first barrier, the third barrier being adjacent to the first barrier. In some twelfth implementations, each of the one or more electrical conductive segments of a first barrier of the two or more segmented barriers does not overlap with an electrical conductive segment of a second barrier of the two or more segmented barriers, the second barrier being adjacent to the first barrier. In some twelfth implementations, each of the one or more electrical conductive segments of the first barrier does not overlap with an electrical conductive segment of a third barrier of the two or more segmented barriers, the third barrier being adjacent to the first barrier.

In some twelfth implementations, each of the two or more segmented barriers is: a co-wound layer having thermal resistive and electrical conductive segments; a layer soldered or bonded to a winding conductor, the soldered or bonded layer having thermal resistive and electrical conductive segments; a printed layer on a co-wound layer, the printed layer on the co-wound layer having thermal resistive and electrical conductive segments; or a printed layer on a surface of a winding conductor, the printed layer on the surface of the winding conductor having thermal resistive and electrical conductive segments. In some twelfth implementations, the NI coil includes a winding conductor that can be non-insulated YBCO superconductor tape, non-insulated REBCO superconductor tape, or non-insulated Bi-2223 multi-filamentary superconductor tape. In some twelfth implementations, the coil is a circular pancake coil or a racetrack coil.

Some implementations (thirteenth implementations) include a homopolar motor/generator including an HTS NI coil magnet of the twelfth implementations. Some implementations (fourteenth implementations) include an aircraft that includes a homopolar motor/generator of the thirteenth implementations. In some fourteenth implementations, the aircraft is a hypersonic aircraft.

Some implementations (fifteenth implementations) include an HTS NI coil magnet comprising a coil including multiple turns and one or more thermal barriers each disposed between a different two adjacent turns of the coil. The one or more thermal barriers can include a material that is thermal resistive and electrical conductive to block heat propagation while permitting substantially full capacity turn-wise current sharing between the adjacent turns. In some fifteenth implementations, the NI coil includes a winding conductor that can be non-insulated YBCO superconductor tape, non-insulated REBCO superconductor tape, or non-insulated Bi-2223 multi-filamentary superconductor tape. In some fifteenth implementations, the coil is a circular pancake coil or a racetrack coil.

Some implementations (sixteenth implementations) include a homopolar motor/generator including an HTS NI coil magnet of the fifteenth implementations. Some implementations (seventeenth implementations) include an aircraft that includes a homopolar motor/generator of the sixteenth implementations. In some seventeenth implementations, the aircraft is a hypersonic aircraft.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 2A through 2E illustrate examples of intra-coil, inter-coil and/or coil-to-coil grading of HTS non-insulated (NI) coil magnets of FIGS. 1A and 1B, in accordance with various embodiments of the present disclosure.

FIGS. 3A and 3B is a perspective view illustrating an example of a multiple turn HTS NI coil magnet system including double pancake coils (DPCs), in accordance with various embodiments of the present disclosure.

FIG. 4 is a schematic diagram illustrating an example of a circuit network model of the multi-turn HTS NI coil of FIG. 3A, in accordance with various embodiments of the present disclosure.

FIGS. 5A, 5B and 5C illustrate examples of azimuthal current distributions (top plots) and radial current distributions (bottom plots) on an unmodified, inter-coil graded and intra+inter-coil graded NI-coil magnets during ramping, in accordance with various embodiments of the present disclosure.

FIGS. 19A and 19B are graphs showing partial thermal-cutoff (FIG. 19A) and overcurrent (FIG. 19B) at 77 K on a NI coil modified by adding a single turn of Kapton thermal barrier to the center turn of the winding pack, in accordance with various embodiments of the present disclosure.

FIG. 20 illustrates local heating created by current "squeezing" through the turn gap of the full-turn Kapton thermal barrier, in accordance with various embodiments of the present disclosure.

FIG. 25A is a graph showing normalized center magnetic field versus time profiles during quench-recovery at 4.2 K, taken from two NI coils installed with the 8-turn or 16-turn barrier design and from a non-graded counterpart, and FIG. 25B is a graph showing the corresponding temperature versus time profiles, in accordance with various embodiments of the present disclosure.

FIG. 27A is a graph showing normalized center magnetic field versus time profiles during quench-recovery at 4.2 K, taken from a NI coil installed with the 2×8-turn design and from a non-graded counterpart, and FIG. 27B is a graph showing the corresponding temperature versus time profiles, in accordance with various embodiments of the present disclosure.

FIG. 28A is a graph showing normalized center magnetic field versus time profiles during quench-recovery at 77 K, taken from a NI coil installed with the 2×8-turn design and from a non-graded counterpart, and FIG. 28B is a graph showing the corresponding temperature versus time profiles, in accordance with various embodiments of the present disclosure.

FIG. 35, is a table listing parameters common to 77 K and 4.2 K simulations, in accordance with various embodiments of the present disclosure.

FIG. 36 is a table listing parameters used 77 K simulations, in accordance with various embodiments of the present disclosure.

FIG. 37 is a table listing parameters used 4.2 K simulations, in accordance with various embodiments of the present disclosure.

DETAILED DESCRIPTION

Figure 1A:
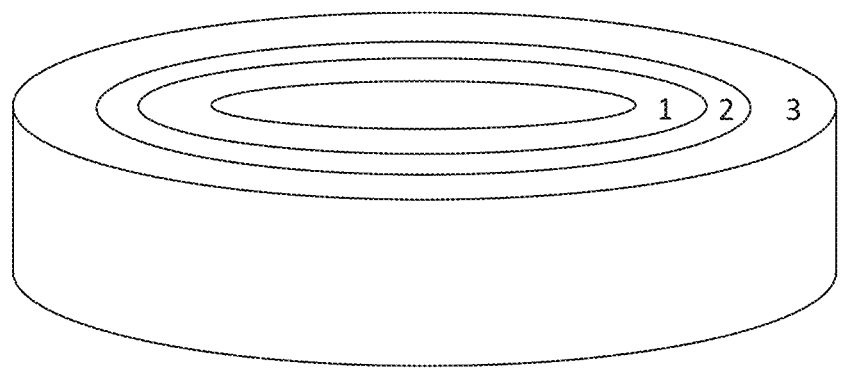
FIGS. 1A and 1B illustrate examples of high temperature superconducting (HTS) magnets including multiple coils, in accordance with various embodiments of the present disclosure.

In a high temperature superconducting (HTS) magnet, the operating current, or more specifically the operating current density, is limited not only by the in-field performance of the HTS conductor but also by the protection requirement. If a quench, by definition when a superconducting magnet accidently loses its superconductivity, occurs in an insulated HTS magnet operated at a very high current density, for example, above 30 kA/cm², the magnet will burn even with a protection scheme.

A quench can be induced in a high temperature superconducting (HTS) magnet by a large enough local heat disturbance. The heat disturbance can come from many sources, for example, the AC losses during current ramping (charging and/or discharging) and local fluctuations in cooling of the coils. If a quench is not stopped soon enough, the rising temperature created by the quench will eventually destroy the magnet. Some methods to prevent such a scenario from happening include initially detecting an onset of a quench by monitoring the temperature, voltage or other measurable quantities of the coils and, once detected, cutting of the power source from the coils and allowing the stored magnetic energy to dissipate at a fast but controlled speed to prevent damaging the coils by limiting the peak temperature and the discharge-induced inductive voltage. However, it is a great challenge to detect a quench reliably and fast enough to activate the quench protection mechanism. This is mainly because the quench propagation speed in a HTS magnet is very slow. It is also challenging to implement an effective quench protection mechanism.

Disclosed herein are various examples related to mechanisms for improving the performance of superconducting magnets. These mechanisms can enhance the thermal stability and reduce the risk of quenching in existing superconducting magnets composed of multiple superconducting coils with low turn-to-turn thermal and/or electrical resistances, while maintaining or improving the advantage of the fast ramping rates of these magnets, as compared to their counterparts composed of no-insulation or non-insulated (NI) coils, and partially-insulated (PI) coils. While NI coils are used in the discussions presented herein and as examples for comparison to the disclosed mechanisms for improving the performance of superconducting magnets, the disclosed mechanisms can also be applied to other types of magnet coils such as PI coils. These benefits can make a superconducting magnet modified by the disclosed mechanisms more stable and reliable, and can provide a practical superconducting coil with a reasonable ramping time and a longer mean time between failures. The disclosed mechanisms not only provide benefits to NI coils or coils with low turn-to-turn resistances that already have high thermal stability, but also to self-protecting superconducting NI coils. When applied to self-protecting magnets, these mechanisms can greatly reduce the risk of quenching, improve the recovery time after a recovered quench and thus improve the operational stability, availability and reliability of the coils.

Self-protecting NI coil magnets fabricated in accordance with the present disclosure are well-suited for mission critical applications such as aviation propulsion motors. This is because such magnets have low risk of quenching; had a quench happened, they need no external protection mechanism and thus have smallerform factor and are easier to maintain. Other applications for these enhanced superconducting magnets include, but are not limited to, high field magnets for accelerators, wind power superconducting generators, superconducting motors for general uses and mission critical applications such as aviation propulsion, superconducting magnetic energy storage, MRI and high field magnets for scientific research. Reference will now be made in detail to the description of the embodiments as illustrated in the drawings, wherein like reference numbers indicate like parts throughout the several views.

Figure 1B:
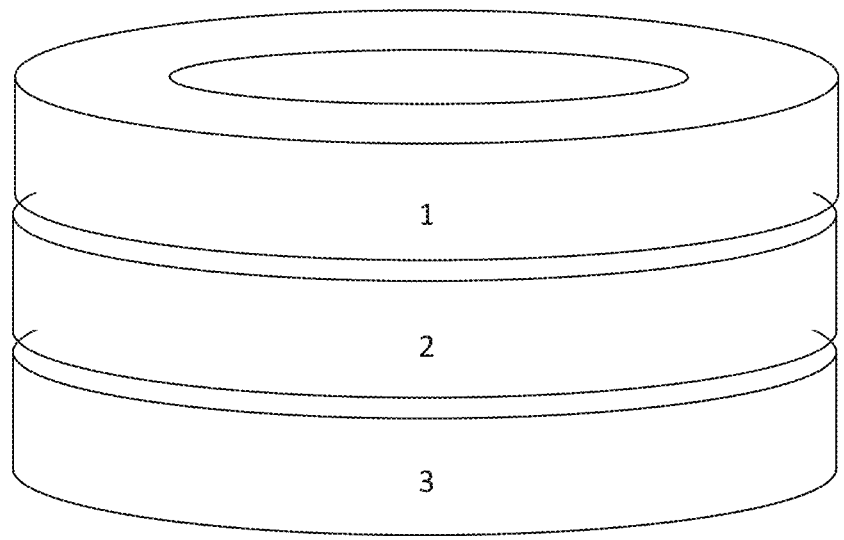

HTS magnets can be composed of a single or multiple superconducting coils, each coil is further composed of multiple turns. Examples of HTS magnets including multiple coils (1-3) are provided in FIGS. 1A and 1B. In the case of multi-coil magnets, the coils (1-3) can be connected radially to increase the diameter as illustrated in FIG. 1A or stacked axially to increase the axial length of the coil as shown in FIG. 1B, or configured in a mixture of both radial and axial connections. Some HTS coils are fabricated by co-winding the conductor with a layer of electrically and thermally insulated material. These kinds of insulated coils can have low to moderate thermal stability in the sense that any finite heat disturbance energy that is large enough can induce a sustainable quench (as opposed to a recoverable quench, which eventually subsided). In a new type of HTS coils, the co-winding insulation layer is either removed completely or replaced by a co-winding layer of very low resistance, either electrically or thermally, or both, to improve the thermal stability of HTS coils. The co-winding layer can be either co-wound with the conductor during fabrication of the coil or pre-soldered to the conductor before winding. These kinds of coils with very low turn-to-turn resistances are called no-insulation or non-insulated or simply NI coils. Extensive studies have shown that NI coils intrinsically possess much higher thermal stability than insulated coils. Some coils are even shown to be self-protecting, in the sense that during a quench, its magnetic energy stored in a coil is dissipated within the coil itself safely without external quench protection mechanism. The main reason that NI coils are highly stable is that the low turn-to-turn thermal and electrical resistances allow heat and current to diverge both in the azimuthal and radial directions away from the hot-spot, which is generated first by a heat disturbance and later by induced Joule heating, to the neighboring turns. This results in reduced heat buildup and Joule heating, a sustainable quench is therefore difficult to be initiated. For any highly stable NI coil, even if it is self-protected, if a quench happens in the NI coil, the consequences are operationally disruptive, expensive and even catastrophic. For example, the operation of a quenched magnet is degraded or even stopped when the stored energy has been dissipated; and the magnet's current has to be recharged again through a ramping process that can be very slow. Thus, it is advantageous to minimize the risk of quenching.

A major drawback associated with these NI coils is that their current ramping times during charging and discharging are much longer than those of their insulated counterparts. The ramping times in a large magnet composed of NI coils (i.e., a NI-coil magnet) with a large inductance can be in tens of hours, which is excessive for practical operation in some or most application cases. The reason that NI coils have slow ramping rates is that the inductive impedance induced by the time-varying current increases the current flow resistance along the length of the conductor, meanwhile, a low turn-to-turn electrical resistance between the turns allows some of the current to "leak" through a diverged, lower resistance path across the turns directly to the current output lead, thus reducing the azimuthal current, which flows along the length of the conductor, that is needed to charge the superconductor in the coil.

Few methods are available to solve or improve the slow ramping rate issue in NI-coil magnets. Some methods are based on the same principle, that of limiting the amount of diverging current that bypasses the longitudinal path along the turns and flows across the turns to the current output lead. These methods are realized either by reducing the inductance of the magnet or by increasing the turn-turn electrical resistance in the NI coils. The former method is impractical and the later may be implemented either by co-winding a layer of low electrical resistance, which is higher than the intrinsic turn-to-turn electrical resistance of the un-modified NI coil, or by laminating a thin metallic layer on the conductor. The commonly used laminated metallic layers are copper, brass and steel thin sheets. Many of these methods uniformly increase the turn-to-turn electrical resistance between all the turns of the entire magnet by a single, fixed electrical resistance value. It has been shown through experimental and computational analyses that the higher the turn-to-turn electrical resistance, the faster the ramping rates are for both charging and discharging in single and multi-coil magnets.

There is also a partially-insulated coil fabrication method which is similar to the co-wound NI coil method. This method can be implemented by co-winding an insulated material at selected places within the coil, for example, one or more turns of Kapton layer for every 10 turns. A coil fabricated by this method is called a partially-insulated (PI) coil. Such coils possess improved thermal stability when compared to their insulated counterparts and improved ramping rates when compared to their NI counterparts. The improvement in ramping rates, however, are in general much less effective than in the co-wound and laminated NI-coil counterparts mentioned above. As a result, PI coils are less commonly studied and used. Herein, only the NI coils will be referred in discussions and comparisons, but the same concepts also apply to PI coils.

Some methods that increase the turn-to-turn electrical resistance with a fixed value across the entire magnet, however, also reduce the thermal stability of the modified NI-coil magnet. The higher the turn-to-turn electrical resistance, the larger the reduction in thermal stability. When the resistance of a modified NI coil is larger than a certain value, the coil behaves essentially like an insulated coil counterpart, in particular, the coil's thermal stability becomes the same as that of an insulated counterpart. In general, even with added low turn-to-turn resistance, the thermal stability of the NI coil is still much higher than that of its insulated counterpart. Another problem associated with NI-coil magnet with or without added (low) resistances is that localized current concentrations form within the magnet during ramping and fast discharging.

Embodiments disclosed herein include single-coil or multi-coil magnets composed of NI coils that can mitigate all the drawbacks discussed above. Some such embodiments include adding graded turn-to-turn electrical resistances and/or graded coil-to-coil electrical resistances in the case of multi-coil magnets, to control the current flow within the NI coils, such that the current leak and local current concentration phenomenon can be greatly reduced during ramping and quenching. In contrast, some NI magnets use only a single fixed constant turn-to-turn electrical resistance value (normally with coil-to-coil insulation material, including air gap, placed between every two adjacent coils) across the entire magnet to improve the ramping times. The same concepts of grading turn-to-turn and coil-to-coil electrical resistances on NI coils also apply to turn-to-turn and coil-to-coil thermal resistance. Graded turn-to-turn and/or coil-to-coil thermal resistances can be used to control the heat flow in a modified NI coil or NI-coil magnet to direct the heat propagation of a hot spot in a designed, beneficial way, for example, away from a less stable region. Hereafter, unless otherwise stated, resistance can refer to either an electrical resistance or a thermal resistance or both. Also, graded values refer to a set of generally distinct values that can be carefully selected to meet some functional purposes by means of analytical equations, computational simulations or experiments; and the values can have the same repeated values. Graded NI coils can enhance the thermal stability (especially in non-self-protecting NI coils), reduce the risk of quenching (especially in self-protecting NI coils), and maintain or improve the charging and discharging ramping rates of NI-coil magnets, including those with added turn-to-turn resistance.

Figure 2A:
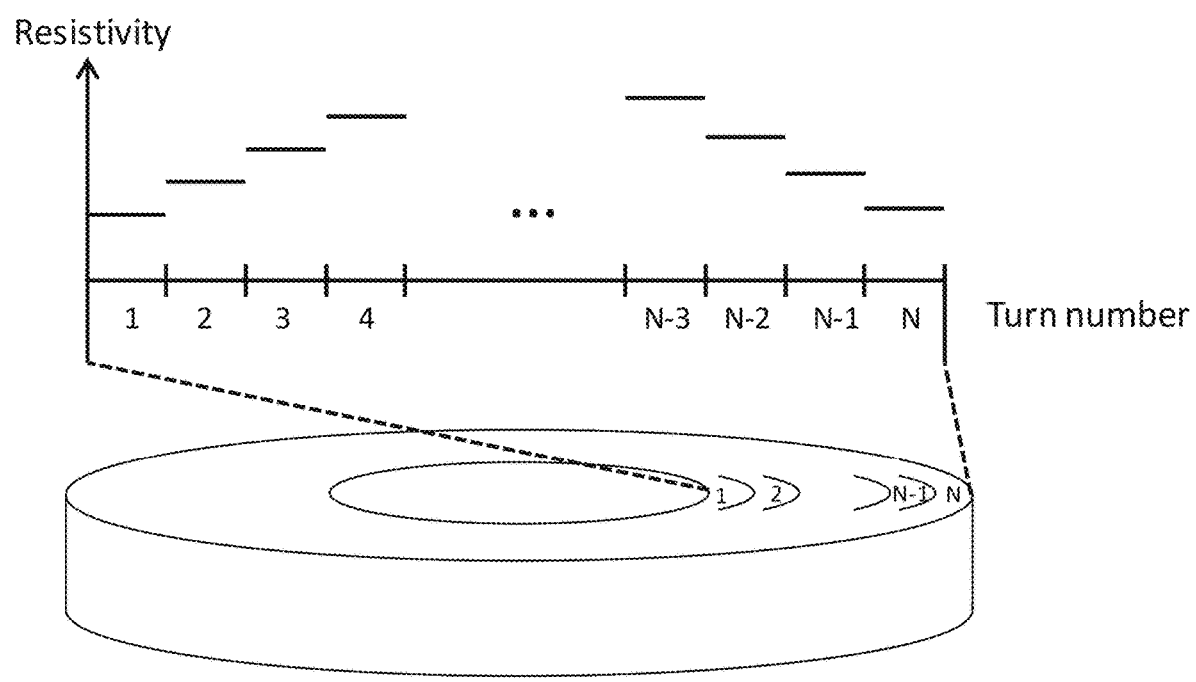
Figure 2B:
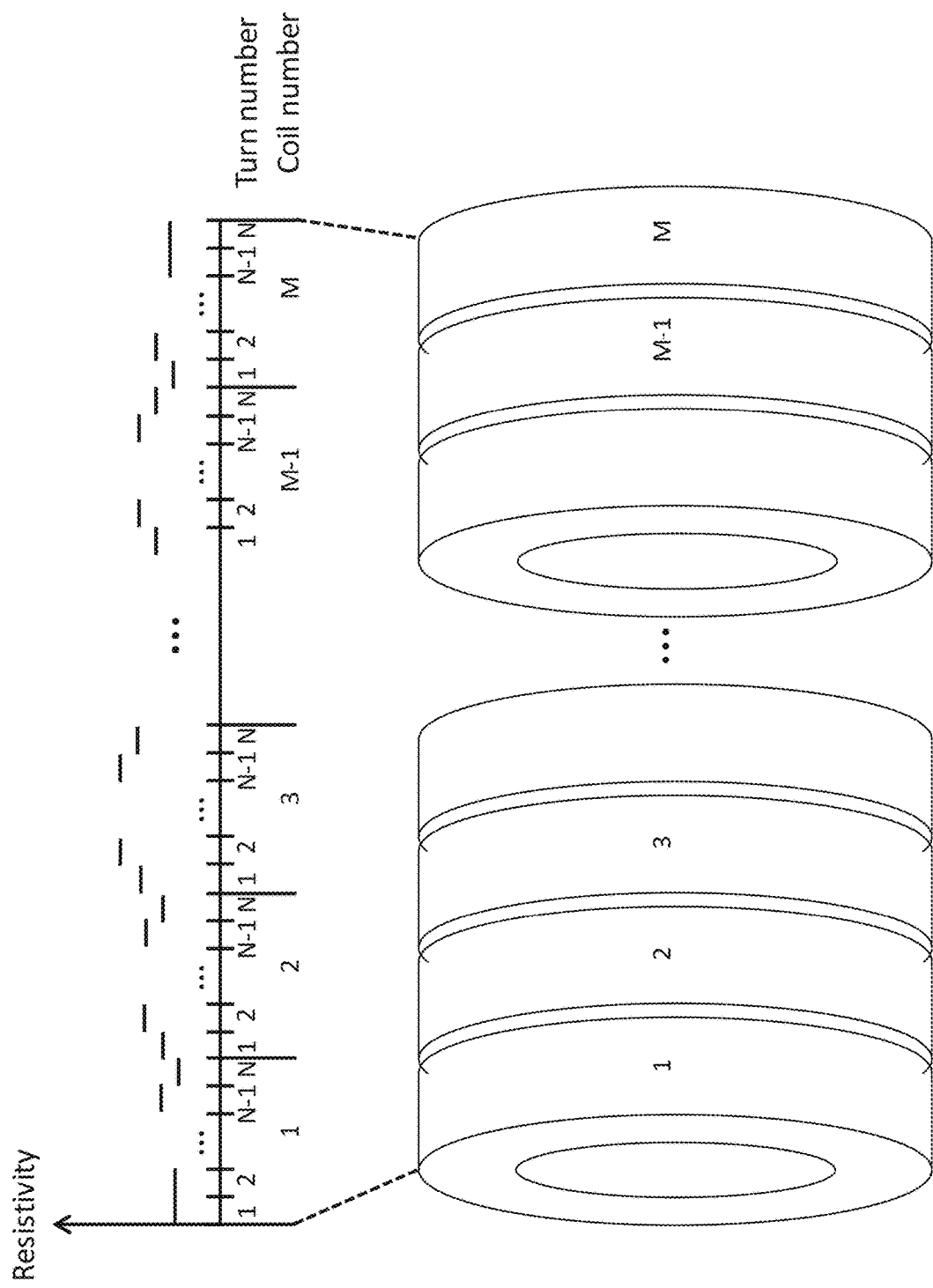
Figure 2C:
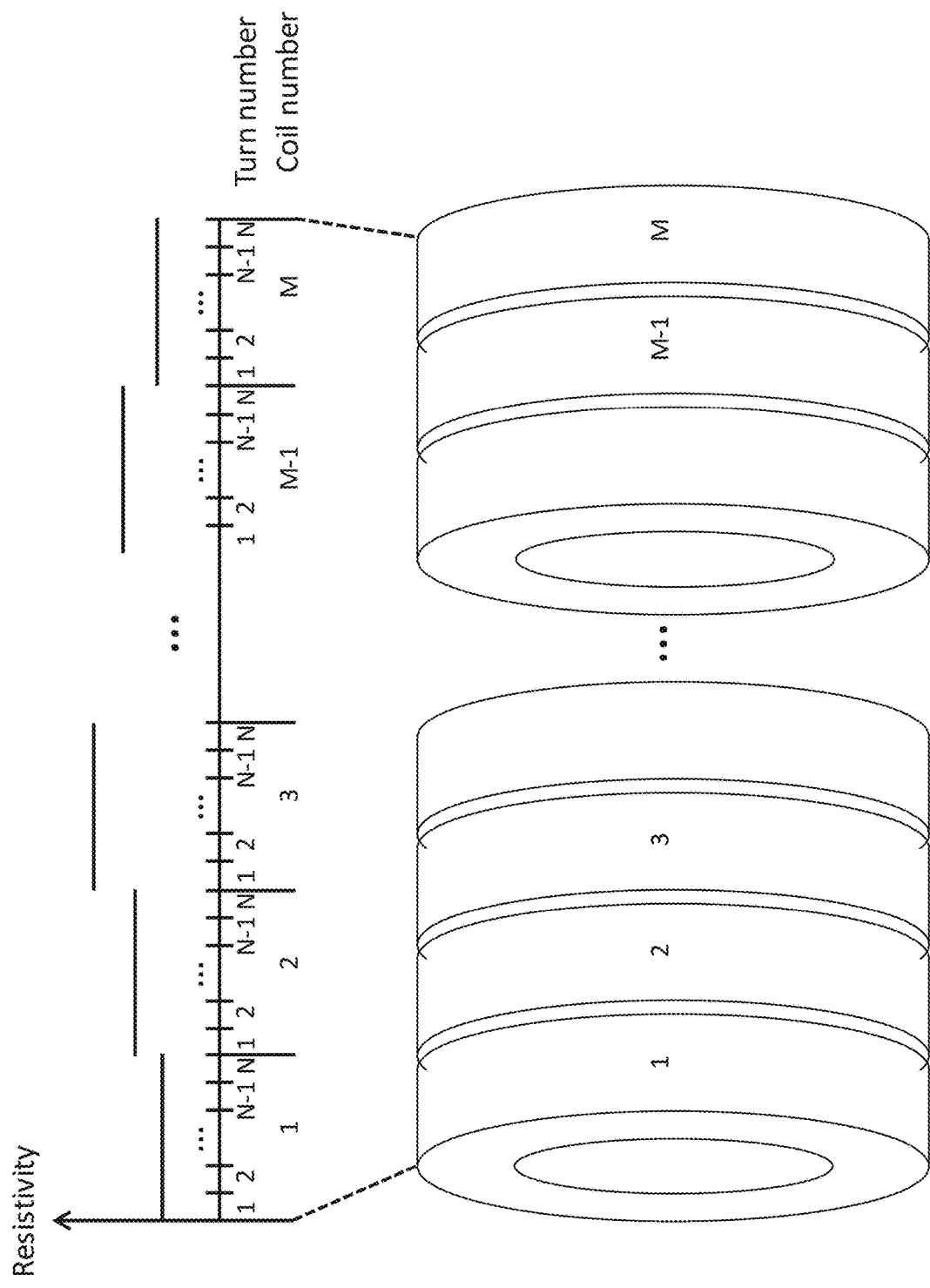

There are two ways to apply graded turn-to-turn resistances to a NI-coil magnet: intra-coil grading and inter-coil grading. With intra-coil grading, the turn-to-turn resistances are graded with respect to all the turns within the same coil. Under intra-coil grading, the turn-to-turn resistance between two adjacent turns can be different from those of other turns within the same coil. FIGS. 2A and 2B graphically illustrate examples of intra-coil grading on a radially wound coil and on each individual radially wound coil of an axially stacked NI-coil magnet, respectively. With inter-coil grading, the turn-to-turn resistances are graded with respect to all the coils within the same magnet. Under inter-coil grading, every coil among the magnet has its own fixed turn-to-turn resistance, but the resistance can be different from those of other coils within the same magnet. FIG. 2C graphically illustrates an example of inter-coil grading on an axially stacked NI-coil magnet. Combinations of intra+inter-coil grading are also possible. For example, the intra-coil grading can be varied differently between some or all of the coils of the magnet, which results in inter-coil grading of the magnet. FIG. 2B illustrates an example of an intra+inter-coil graded NI-coil magnet with axially stacked coils. While shown with axially stacked coils, the inter-coil grading of FIG. 2C and the intra+inter-coil grading of FIG. 2B are equally applicable to radially stacked coils. In other embodiments, a combination of radial intra-coil grading and axial inter-coil grading can be implemented.

Figure 2E:
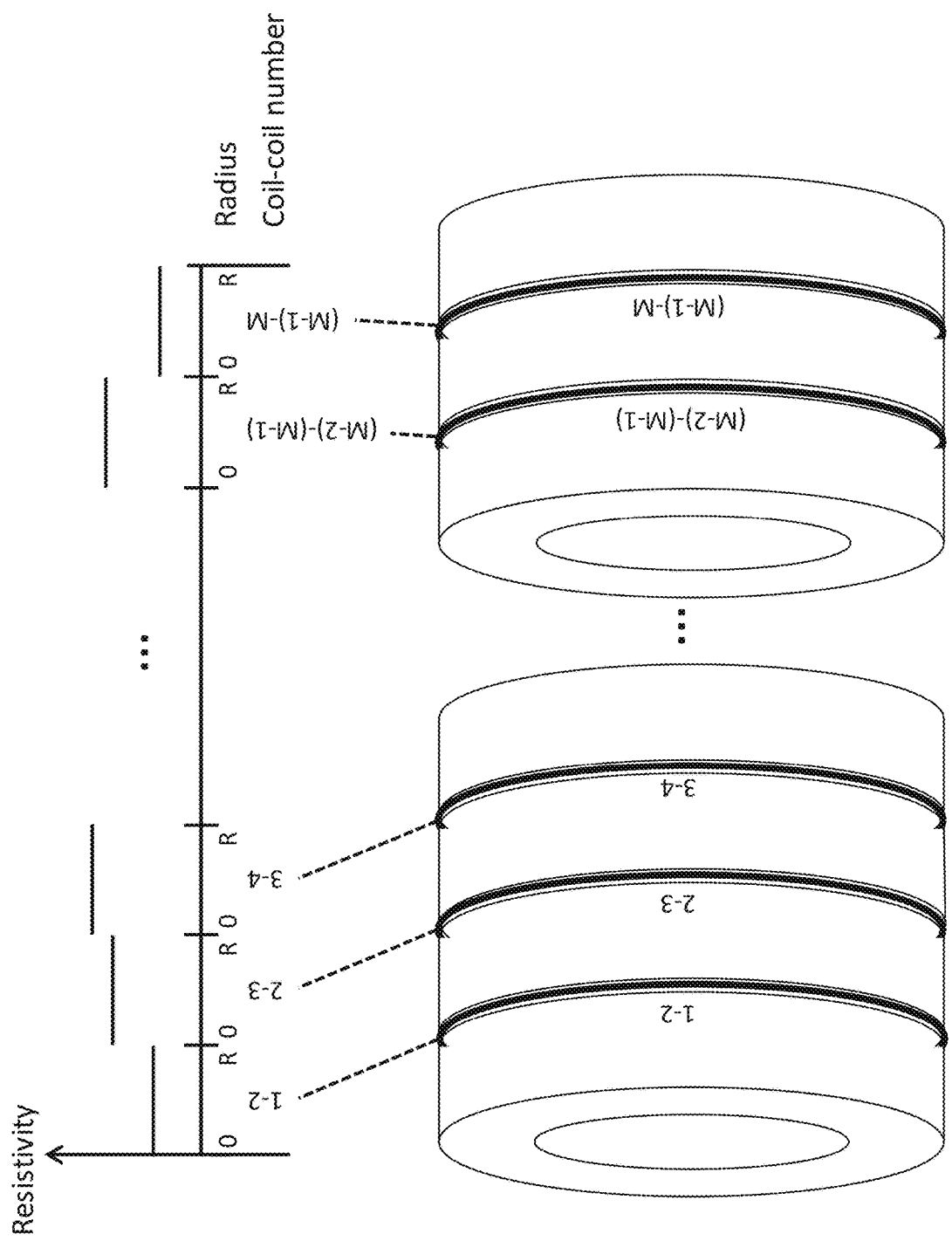

Coil-to-coil grading can be applied to the material inserted between any two adjacent coils (coil-to-coil interfacial material) of a radially stacked or axially stacked NI multi-coil magnet, as graphically illustrated in FIG. 2D. In the case of a some multi-coil magnets, the material inserted between every two adjacent coils is an insulation material having the same resistance between all coils, including air gap. In the proposed method, the coil-to-coil interfacial material can be replaced by thin conductive materials with low resistances, which are graded with respect to all the interfacial layers (between every two adjacent coils) within the magnet. In addition, the coil-to-coil interfacial material can also be graded with respect to the axial length within the same coil-to-coil interfacial material in the case of a radially stacked multi-coil magnet, or with respect to the radius within the same coil-to-coil interfacial material in the case of an axially stacked multi-coil magnet, or in a mixture of both ways in a radially and axially stacked multi-coil magnet. This kind of grading is called coil-coil grading. FIG. 2E graphically illustrates an example of coil-to-coil grading on an axially stacked multi-coil magnet with a distinct constant value across the radius on each individual coil-to-coil interfacial material. The basic working principle behind the intra-coil grading lies in the fact that the larger the turn-to-turn electrical resistance, the smaller is the radial current flowing across the turn-to-turn interfacial contact area and thus per the conservation of current, the larger is the azimuthal current flowing along the turn that "pushes out" the radial current. So, higher turn-to-turn electrical resistances can be applied to an area with higher radial current concentration (and lower azimuthal current concentration) to lower the concentration. Similarly, lower turn-to-turn resistances can be applied to areas with higher azimuthal current concentrations. This principle also works on inter-coil grading. Thus, grading of turn-to-turn resistances in NI-coil magnets mitigates localized current concentration issue while improving the ramping rates.

Hereafter, a NI-coil magnet fabricated with the proposed method by applying an intra-coil grading, an inter-coil grading, a coil-coil grading, or a mixture of all types of grading is called a graded-resistance NI-coil magnet. In contrast, a NI-coil magnet having a single fixed turn-to-turn resistance across the entire magnet is called a uniform-resistance NI-coil magnet. The beneficial consequences of applying the proposed method include an improved thermal stability and risk of quenching than the uniform-resistance coil counterpart with the same ramping rates. Recall that a uniform-resistance NI-coil magnet has better ramping rates but slightly lower thermal stability than an unmodified NI-coil counterpart, and that an unmodified NI-coil magnet has much higher thermal stability than an insulated counterpart. Overall, a graded-resistance NI-coil magnet can be operationally more efficient, stable and reliable than its insulated, NI and uniform-resistance counterparts.

Both NI coils and metallic insulation (MI) coils, which are those with co-wound low-electrical-resistance metallic strips, including the co-wound coils described above, have been investigated for high temperature superconducting (HTS) coils employing $(RE)Ba_2Cu_3O_{7-x}$ conductors. Due to the direct metal contact between turns, the overall thermal stability and quench protection can be improved. In the case of a quench initiated by a local heat disturbance, heat and electrical current can be spilled off into neighboring turns, so that quench is harder to sustain and hot areas can be protected from overheating or mechanical damage. However, delay between field and current ramping has been found during a charging process and it may limit the maximum ramping rate. This may be attributed to the electrical current flowing in both in the azimuthal direction and in radial direction, when an induced voltage occurs at coil terminals. The higher the end-to-end voltage is, the higher the ratio between the radial and azimuthal component, and the less the current directly contributes to the magnet center field.

However, a majority of large superconducting system such as MRI or NMR magnets consist of quite a few coils in series. Owing to mutual inductance between coils, the current distributions may be much more complex than in a single coil. This is a very practical problem in NI and MI coil development. Most experimental or simulated results apply to a single NI and/or MI coil, where non-uniform current distributions in the multiple coils may not be able to be discovered. Both the voltage and current in multiple coils stacked on the same axis can be studied during both charging and discharging processes. Current distributions will be compared in coils at various locations along with the voltage and magnetic field dynamic changes, to illustrate a non-uniform current distribution during the dynamic processes.

Multiple Coil Model of HTS Magnet System. Simulations of charging and discharging characteristics were carried out on a magnet system which comprises 7 double pancake coils that are on the same axis and are made by employing $(RE)Ba_2Cu_3O_{7-x}$ conductors using a no-insulation winding approach. A numerical circuit network model was developed to take turn-to-turn contact resistivity into account and to determine the azimuthal and radial current components during charging and discharging. It was found that the current distribution is not uniform from the upper coil to the middle and from the coil inner diameter to the outer diameter. In addition, the current distribution tendency is opposite to each other in the charging and discharging processes. The voltage and magnetic field were calculated and correlated to the current distribution analysis to understand uneven electromagnetic phenomena in the multiple coils system.

Figure 3A:
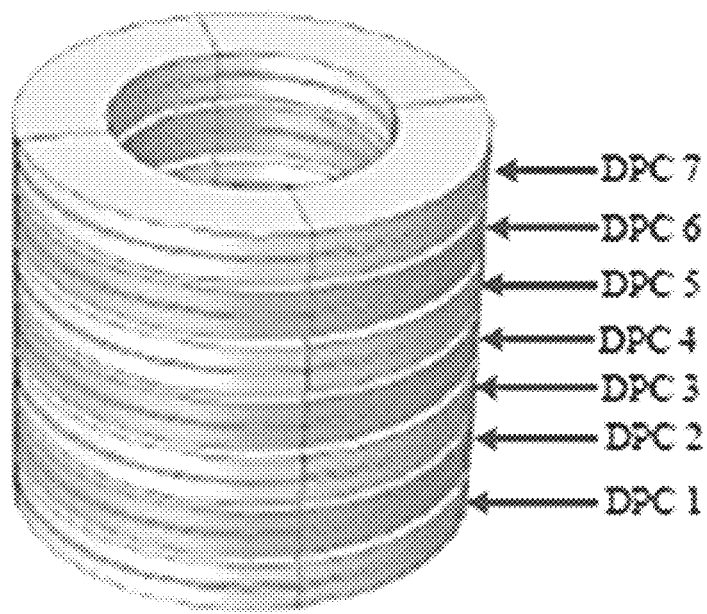

Referring to FIG. 3A, shown is a schematic diagram illustrating an example of a multiple turn HTS NI coil magnet system. The HTS NI coil magnet of FIG. 3A comprises a stack of seven double pancake (DP) coils on the same axis and in series (DPC1-DPC7), with HTS referring to (RE)Ba2Cu3O7-x conductors. HTS NI coil magnets can include one or more turns. The turns can be identical NI DP coils stacked in series. The table in FIG. 3B provides details about the multi-turn HTS NI coil magnet used in various simulations. Each DP coil was wound employing REBCO tapes with 130*2 turns. The width and thickness of the tape was 4 mm and 0.125 mm, respectively. The inner diameter of the coil was 100 mm. The distance between upper and lower coil inside the DP was 1 mm and the distance between two adjacent DP coils was 2 mm. The operating temperature of the magnet was designed at 40 K where its critical current of the tape was 390 A and the critical current of the magnet was about 100 A at 40 K.

Network Model for the Multiple Coil System. To analyze the current distribution inside the NI coil, an equivalent circuit network model was developed. FIG. 4 shows a schematic illustration of the analysis model for NI pancake coils. In this model, the transport current inside the NI coil is decomposed into that along the azimuthal direction and radial direction. The anticlockwise direction is defined as the positive direction of the azimuthal current. The centrifugal direction is defined as the positive direction of the radial current. Each turn of the coil is subdivided into $n_e$ fine arc elements ($n_e$=24 in this simulation), with each arc element represented by circuit parameters. In the example shown in FIG. 4, $n_e$=4 and in the simulation, $n_e$=24. The whole coil is equivalent to the network circuit. The magnet of FIG. 3A with 7 DPCs is equivalent to 14 circuit networks in series.

In each independent circuit mesh, the governing equations can be derived from the Kirchhoff's voltage law. At each circuit node, the governing equations can be derived from Kirchhoff's current law as:

$$\begin{cases} i_k - i_{k+1} + j_{k-n_e} - j_k = 0 \\ u_k - u_{k+n_e} - j_{k-1}R_{r,k-1} + j_k R_{r,k} = 0 \end{cases} \quad (1)$$

where i and j represent the azimuthal and radial currents, respectively. The term $R_{r,k}$ is the equivalent radial resistance (equivalent to turn-to-turn resistance) of the k-th arc element including that of turn-to-turn contact, substrate and laminations. The intrinsic equivalent radial resistivity of the NI coils can range from 10 μO·cm² to 100 μO·cm². In this study, the intrinsic turn-to-turn resistivity is set to be 70 μO·cm². The term $u_k$ represents the voltage on the k-th arc element, which is induced by the azimuthal inductance and resistance.

The azimuthal resistance $R_{s,k}$ can be neglected when the transport current is below the critical current. Therefore, the voltage of the k-th arc element can be calculated by:

$$u_k = L_k \frac{di_k}{dt} + \sum M_{k,l} \frac{di_l}{dt} \quad (2)$$

where $L_k$ represents the self-inductance of k-th arc element. The term $M_{k,l}$ is the mutual inductance with all the other arc elements, which includes that of the same pancake coil and all the other pancake coils.

Figure 6A:
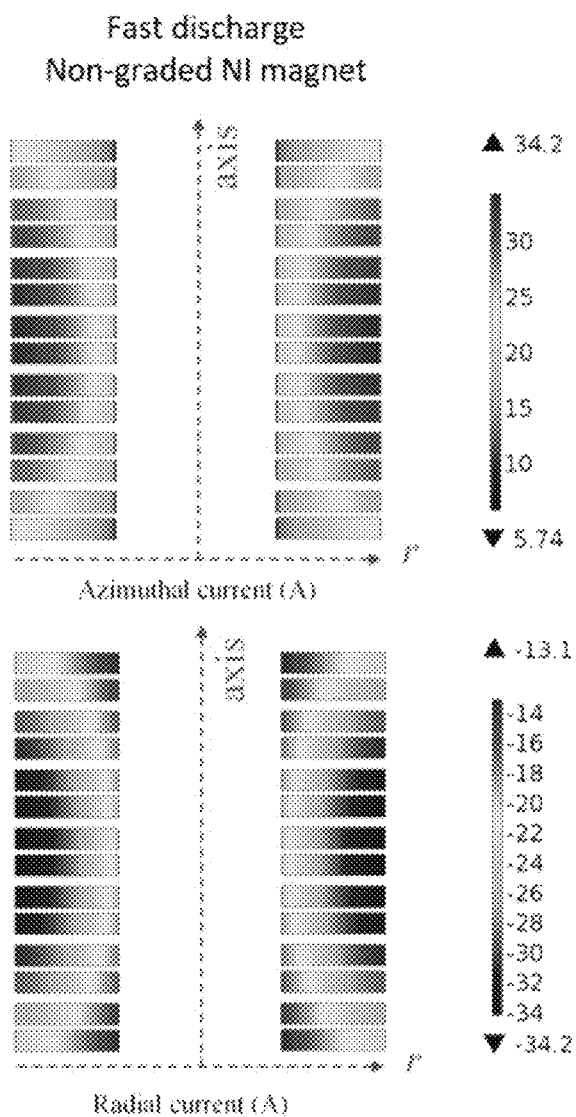
FIGS. 6A and 6B illustrate examples of azimuthal current distributions (top plots) and radial current distributions (bottom plots) on the unmodified and inter-coil graded multi-NI-coil magnets of FIGS. 5A and 5B during fast discharging, in accordance with various embodiments of the present disclosure.
Figure 6B:
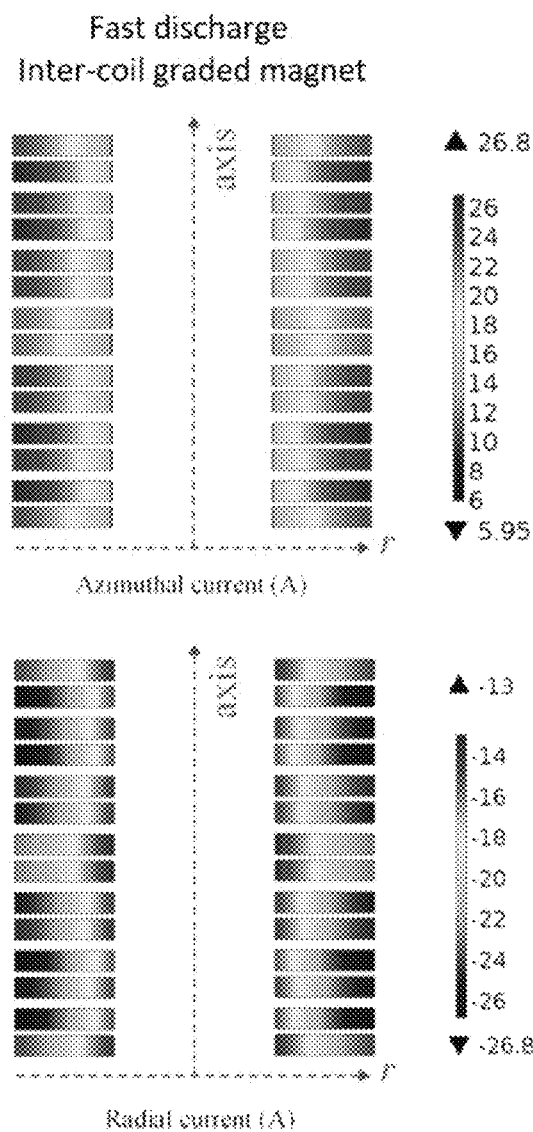

FIGS. 5A, 5B and 5C illustrate examples of azimuthal current distributions (top plots) and radial current distributions (bottom plots) on an unmodified, inter-coil graded and intra+inter-coil multi-NI-coil magnets during ramping and FIGS. 6A and 6B illustrate examples of azimuthal current distributions (top plots) and radial current distributions (bottom plots) on the unmodified and inter-coil graded multi-NI-coil magnets of FIGS. 5A and 5B during fast discharging. Referring to FIGS. 5A and 6A, shown are the distributions of the azimuthal (top plots) and radial (bottom plots) currents in a multi-coil magnet comprising original, regular, unmodified NI coils with intrinsic turn-to-turn resistance during a ramping up and fast discharging, respectively. It can be seen in FIG. 5A that during the ramping up, a large concentration of azimuthal current occurs near the inner turns of the top few and bottom few coils, and a large concentration of radial current occurs near the outer turns of the coils clustered around the center of the magnet. During the fast discharge of FIG. 6A, large concentrations of azimuthal current and negative (radially inward) radial current occur near the outer turns of the coils clustered around the center of the magnet. These high current concentration areas are the locations that have lower thermal stability and higher risk of quenching.

Figures 7A, 7B:
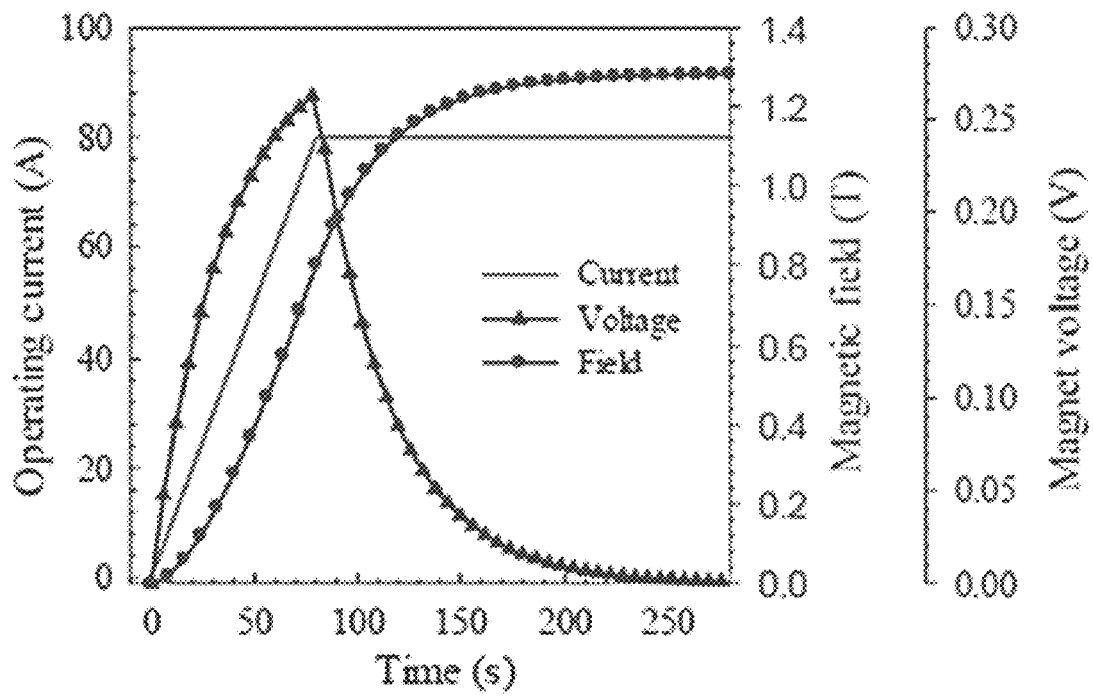
FIGS. 7A through 7D illustrate simulation results of the unmodified NI-coil magnet of FIG. 5A during ramping, in accordance with various embodiments of the present disclosure.

Ramping Behavior. Ramping simulations were performed on the magnet with the 7 DP coils of FIGS. 3A and 3B using the circuit network model of FIG. 4. FIG. 7A shows the ramping transport current from the power supply applied to the magnet, the magnet voltage and the magnetic field induced at the coil magnet center during a ramping operation with a ramping rate of 1 A/s. The magnet voltage is the sum of all the DP coil voltages. Some current flows through the turn-to-turn contact in the ramping process, due to the voltage on each turn induced by the inductance as shown in FIG. 7A. Therefore, the magnetic field does not increase proportionately with the operating current and a significant delay is observed.

Figure 7C:
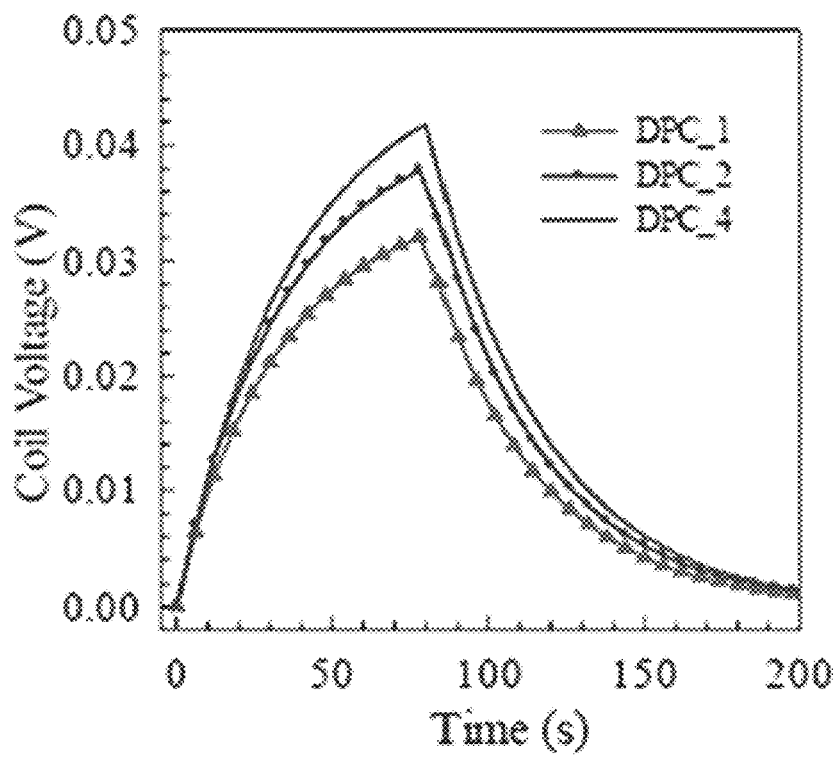

The table in FIG. 7B summarizes the inductance and mutual inductances between the 7 DP coils (DPC1-DPC7), upon which the ramping voltages were simulated. FIG. 7C plots voltages on the 1st and 2nd DP coils (DPC1 and DPC2) from the upper end of the NI coil magnet, and the 4th (middle) DP coil (DPC4) during the ramping process. As seen in FIG. 7C, the middle coil (DPC4) has a larger voltage than the upper end coils (DPC1 and DPC2). Their peak voltages are about 0.032 V, 0.038 V and 0.042 V, respectively. Before the current arrives at the steady target value 80 A, both the azimuthal and radial current component increases, but the middle coil (DPC4) has a higher radial current, so that it has higher voltage. When the current is kept constant at 80 A, the radial current component starts to merge into the azimuthal component, so the voltage starts to decrease.

In each NI coil, the azimuthal and radial current shows an approximately homogenous distribution along the angular direction in most regions during the time-varying process. To describe the distribution of the azimuthal and radial current in different coils, two variables were defined as follows:

$$\begin{cases} I_{sav} = \sum_{k=1}^{n_e} i_k / n_e \\ I_{rsum} = \sum_{k=1}^{n_e} j_k \end{cases} \quad (3)$$

where $I_{sav}$ is the average azimuthal transport current on each turn, and $I_{rsum}$ is the total radial current flowing through each turn.

FIG. 5A shows the distributions of $I_{sav}$ and $I_{rsum}$ during a ramping process with the same ramping rate of 1 A/s. When the operating current from power supply increases to 80 A at t=80 s, the azimuthal transport currents (top plot) of most turns are still much lower than that. The NI coils at different locations are not charged at the same rate. The coils at the upper and lower end of the magnet are charged faster than others. The coils in the middle of the magnet show a more significant charging delay. In each coil, the turns near the inner diameter is charged faster than those near the outer diameter. This may be attributed to a different electromagnetic field for the different turns. In contrast, more radial current (bottom plot) is generated in the middle coils and the radial current near the outer diameter is much higher than that near the inner diameter. Larger radial currents will generate more Joule heat, and as a result the thermal non-equilibrium may hurt the charging process.

Figure 7D:
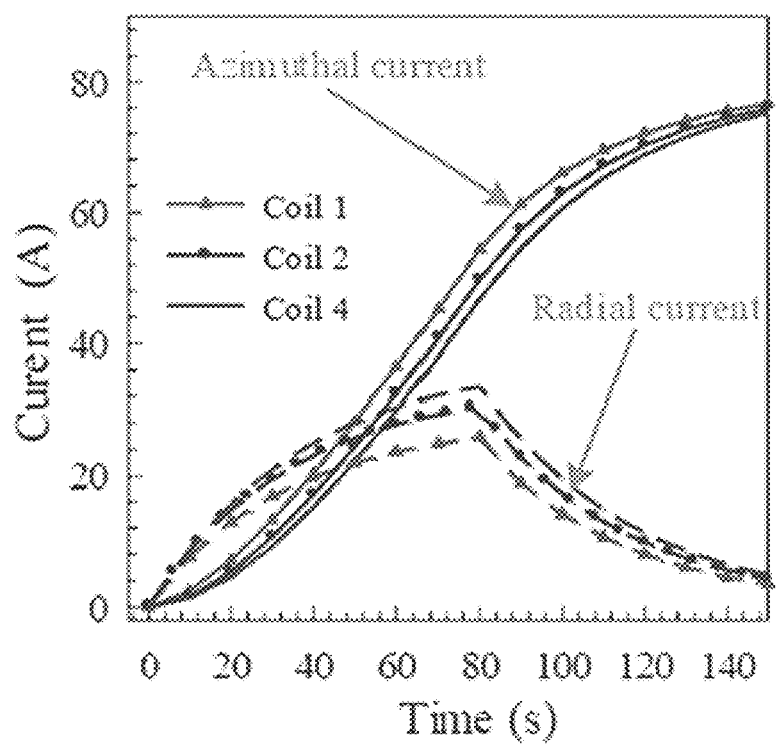

FIG. 7D quantitatively plots the amount of azimuthal and radial current components in the 1st, 2nd, and 4th coils (DPC1, DPC2, and DPC4 from the upper end to the middle of the NI coil magnet) during the entire ramping process at the rate of 1 A/s. As indicated by their voltage, the 1st coil (upper most DPC1) has the largest azimuthal current but the smallest radial current, which is desired from the magnet charging point of view. At the same time, the 4th coil (middle DPC4) has less current in azimuthal direction but more in radial direction. As the result, the middle coil DPC4 has a higher ramping voltage. Furthermore, when the current levels off, the radial component starts to decrease, merging into the azimuthal component, until the 80 A transport current begins flowing in the azimuthal direction.

Figure 8A:
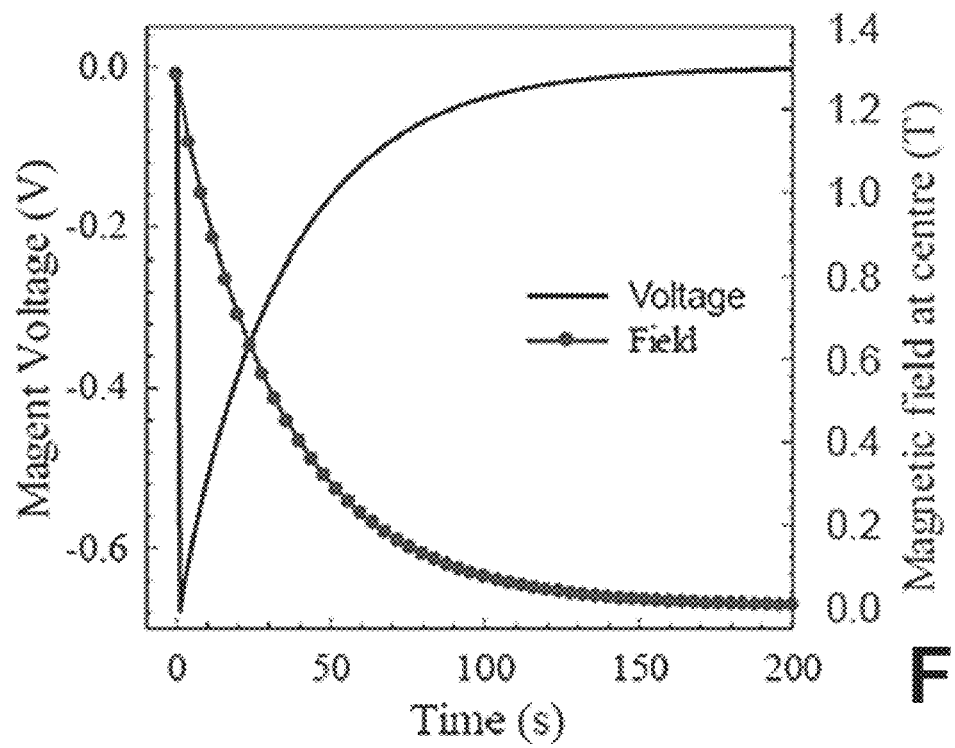
FIGS. 8A through 8C illustrate simulation results of the unmodified NI-coil magnet of FIG. 5A during fast discharging, in accordance with various embodiments of the present disclosure.

Fast-discharging Behavior. In contrast with the ramping process, the discharging process may exhibit contrary phenomena in terms of the current distributions and induced voltages. FIG. 8A shows a plot of a typical voltage and magnetic field versus time during the fast-discharge process. The voltage dramatically increases (negatively) to a value due to sudden change in the external circuit and then gradually decreases back to zero based on the internal contact resistance RL circuit.

Figure 8B:
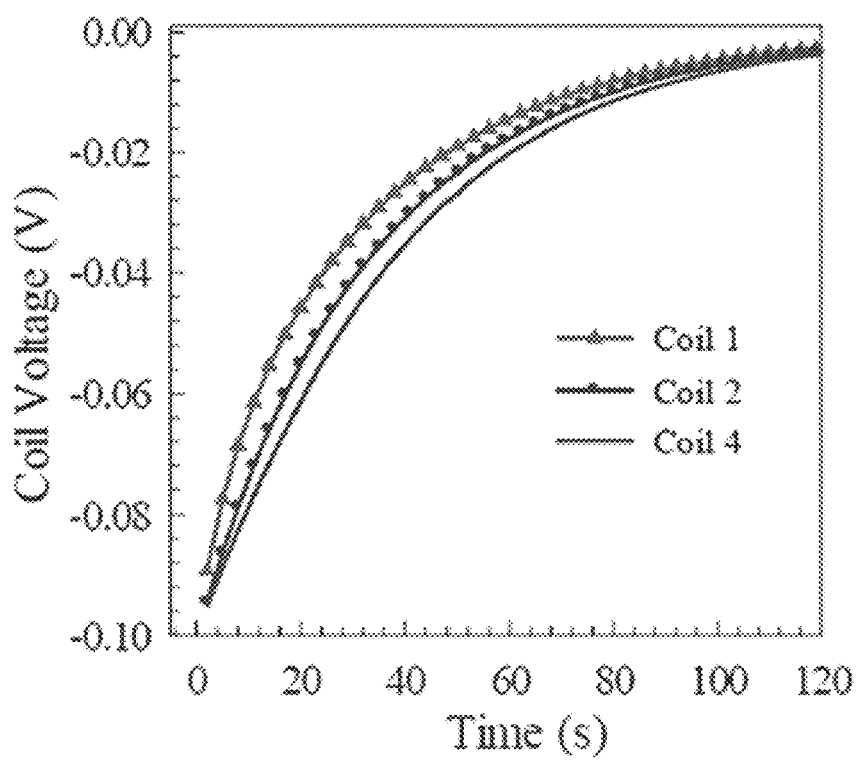

Meanwhile the magnetic field decreases in an approximately exponential curve. For each of the coil, the 4th coil (DPC4) has a slightly higher voltage than the 1st coil (DPC1), which is balanced by both the azimuthal and radial current. FIG. 8B shows the voltages of the coils at different locations during the fast discharge process.

Figure 8C:
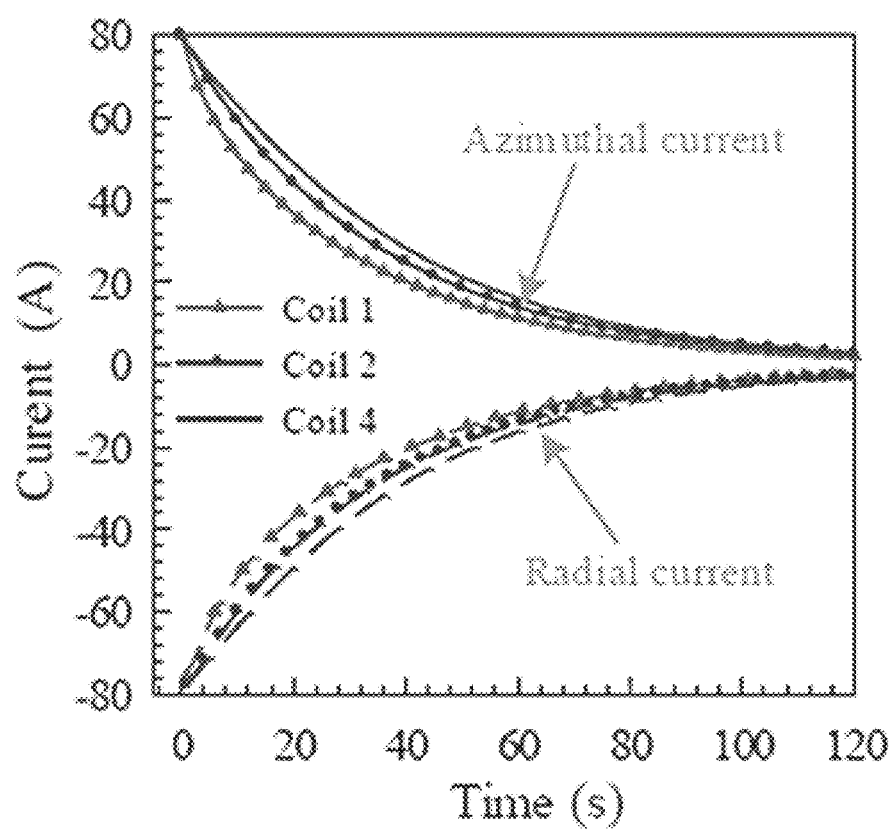

FIG. 6A in the fast discharging process has a strong contrast with FIG. 5A in the ramping process in terms of the current, voltage and magnetic field. At 40 s after the external circuit is switched open, the upper coil (DPC1) not only has less azimuthal current but also has less radial current though most concentrate around the outer diameter, while the middle coil (DPC4) has both more azimuthal component and more radial component which concentrates on the outer diameter. In another word, regions near the middle & outer turns in the magnet are under high current density and dynamic changes. FIG. 8C provides the quantitative current flowing in the azimuthal and radial directions. FIG. 8C shows the average azimuthal transport current and radial current in the 1st (upper DPC1), 2nd (DPC2) and 4th (middle DPC4) coil during the fast discharging process. As the currents are decreasing, they are equal to each other but their signs are opposite due to the existing circuit being only inside the coil. Note that the radial current is negative which indicates the radial current direction is reversed, flowing from outer diameter to inner diameter. Also note that changing the distance between adjacent DPCs will change the mutual inductance, which will affect the current distributions in the multiple coils, but the main trend will be very similar.

Referring next to FIGS. 5B and 6B, shown are the distributions of the azimuthal (top plots) and radial (bottom plots) currents in a multi-NI-coil magnet modified with inter-coil grading during a ramping and discharging, respectively, which is the counterpart of the unmodified multi-NI-coil magnet shown in FIGS. 5A and 6A. In this simulation example, the same constant turn-to-turn resistance was added between all the turns within the same coil. The constant resistances are graded from coil to coil, depending on their locations in the magnet. In the example of FIGS. 5B and 6B, the constant turn-to-turn resistivity in each coil, which is not optimized, counting from the top to the bottom coil, is 70, 80, 90, 100, 90, 80, 70 $O\cdot m^2$, respectively. Here, 70 $O\cdot m^2$ was assumed to be the intrinsic turn-to-turn resistivity.

In practice, the intrinsic turn-to-turn resistivity depends on the winding tension, the roughness of the surface of the conductor and the uniformity of the turn-to-turn contact surface. It can be seen from FIGS. 5B and 6B that when the turn-to-turn resistances are graded from coil to coil (but kept constant within each coil), the current distributions of both the azimuthal and radial currents are much more uniform axially across the entire magnet as compared to those in the unmodified magnet shown in FIGS. 5A and 6A. Note that in comparison to the original NI-coil magnet, the peaks and ranges of the currents become smaller and narrower upon the application of grading. However, the currents are still not uniformly distributed within the same coil in the radial direction. This intra-coil non-uniformity can be reduced by applying intra-coil grading to each coil by grading the turn-to-turn resistances within the same coil.

Referring now to FIG. 5C, shown is the distributions of the azimuthal (top plot) and radial (bottom plot) currents in the multi-NI-coil magnet of FIGS. 5B and 6B, but now modified with intra-coil grading in addition to the inter-coil grading, during a ramping. In the example of FIG. 5C, the turn-to-turn resistivities (not optimized) in coil 1 (the top coil), 2, 13 and 14 (the bottom coil) are graded from 70 $O\cdot m^2$ on the innermost turn to 91 $O\cdot m^2$ on the outermost turn; 75-97.5 $O\cdot m^2$ in the coil 3, 4, 11 and 12; 80-104 $O\cdot m^2$ in coil 5, 6, 9 and 10; and 85-110.5 $O\cdot m^2$ in coil 7 and 8. In comparison to the original NI-coil magnet of FIG. 5A, the peaks and ranges of the currents become smaller and narrower upon each application of grading. When compared to FIG. 5B, the current distributions are now much more uniform in the radial direction within all the individual coils, and in the axial direction across the entire magnet.

In some embodiments, an optimal set of turn-to-turn resistances graded by both the intra-coil grading and inter-coil grading may be determined to distribute the currents uniformly across the entire magnet, both radially and axially. It is important to notice that the differences between the maximum and minimum values of the azimuthal and radial currents are smaller after applying the grading, indicating that the currents are more uniform. Also, the peak value of the radial current is smaller after applying grading, indicating that more current is directed back to the conductor as azimuthal current to charge the magnet. By increasing the turn-to-turn resistances via grading, the ramping rates in graded-resistance NI-coil magnets can be improved over the unmodified NI counterparts.

Figure 9:
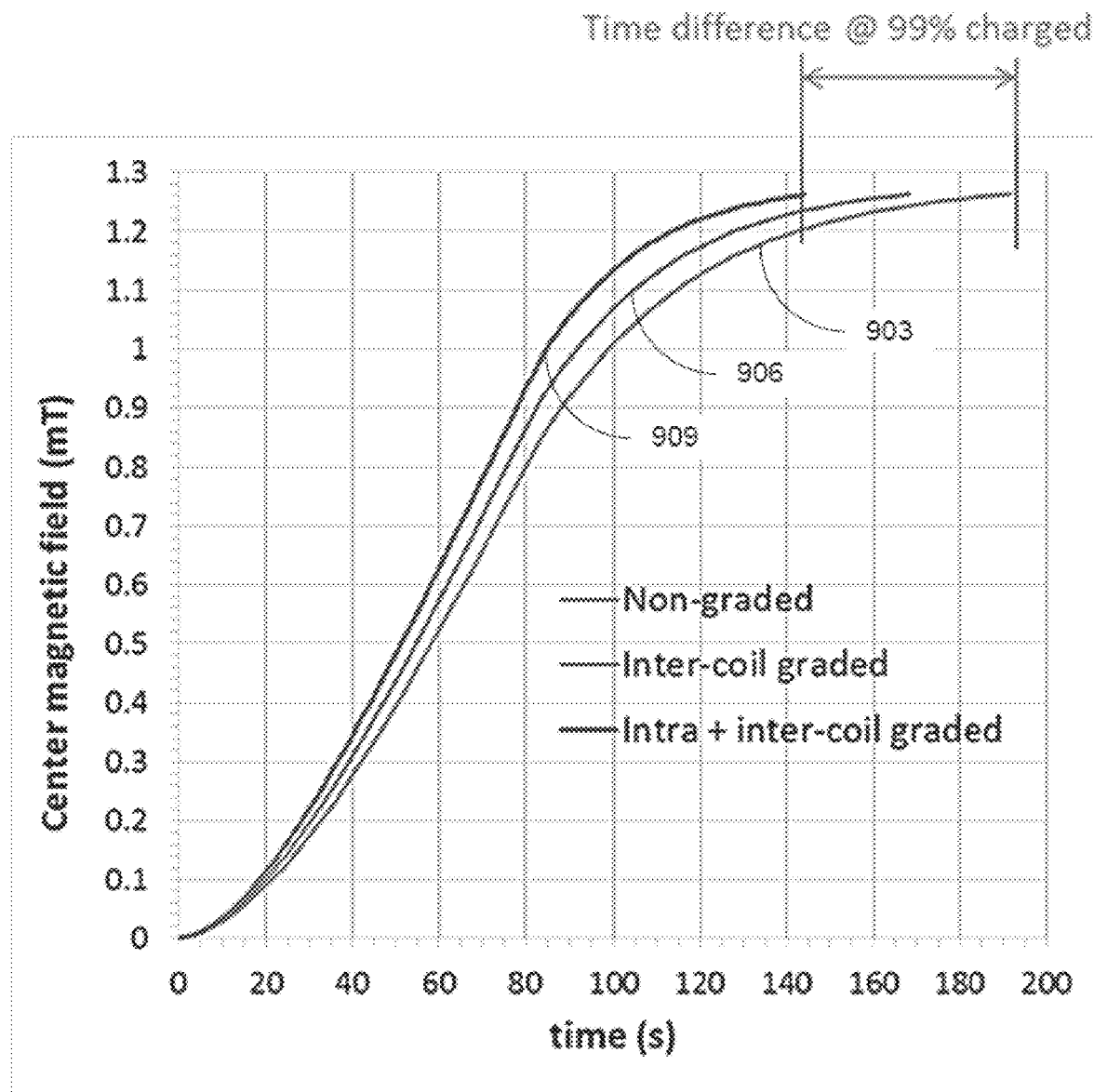
FIG. 9 illustrates a comparison of ramping times of the unmodified NI-coil magnet of FIGS. 5A and 6A, the inter-coil graded magnet of FIGS. 5B and 6B, and the intra+inter-coil graded magnet of FIG. 5C, in accordance with various embodiments of the present disclosure.

FIG. 9 illustrates the improvements of ramping time in graded-resistance multi-coil magnets, by applying the inter-coil grading of FIGS. 5B and 6B, and by applying both the intra- and inter-coil grading of FIG. 5C, as compared to the unmodified NI-coil magnet of FIGS. 5A and 6A. Curve 903 shows the ramping time for the original unmodified NI-coil magnet of FIGS. 5A and 6A, curve 906 shows the ramping time for the inter-coil graded magnet of FIGS. 5B and 6B, and curve 909 shows the ramping time for the inter+intra-coil graded magnet of FIG. 5C. The simulations stopped when the center field reached 99% of the steady field. When compared to uniform-resistance NI-coil magnet during ramping, the uniformly distributed currents in a graded-resistance NI-coil magnet counterpart with the same ramping performance results in better thermal stability and lower risk of quenching.

The charging and discharging characteristics of the HTS NI coils stacked on the same axis has been examined. As discussed with respect to the unmodified NI coil magnet, the electromagnetic behaviors in the charging and discharging are opposite and the azimuthal and radial current component are not uniform in the coils from the upper to the middle. This may be attributed to not only the turn-to-turn metal contacts but also the difference in the self-inductance and mutual inductance at different locations. Note that only the azimuthal component of current contributes to the desired magnetic field, but both the azimuthal and radial components of current may result in Joule heating. During the ramping process, the unmodified coil magnet has more azimuthal current in the upper and lower coils near the inner diameter, but has more radial component in the middle coils near the outer diameter. On the contrast, during the fast discharging process, the unmodified NI coil magnet has both higher radial and azimuthal currents in the middle coils near the outer diameter.

Graded turn-to-turn resistances (thermal, electrical or both) can be realized by controlling the winding tension, by changing the roughness of the contact surfaces of the conductor, or more practically, by co-winding (including pre-soldered) a thin plate with controlled resistance variation along the length of the conductor. The transverse (not sheet) resistivity of a co-winding thin plate can be adjusted in several ways, including but not limited to control the thickness and material properties of the co-wound layer, deposit a resistive thick film on a conductive thin substrate by sputtering or screen printing process as used in manufacture of thin/thick film resistors. One such example is to co-wind the conductor with segments of thin plates of the same thickness but of different material properties at different sections of the length of the conductor. For example, for the first 10 turns, the conductor can be co-wound with a layer of thin copper plate, for the next 10 turns with brass plate and for the third 10 turns with steel, and so on. Yet another way is to manufacture the thin plate as a thin-plate composite composed of two strips of distinctly different resistivities bounded side by side along their thin edges or wide surfaces. The effective transverse resistivity is controlled by adjusting the ratio of the widths or thicknesses of the two strips. And yet another way is to manufacture the thin plate with a functional pattern along the length, including but not limited to a pattern formed by alternating low resistance and high resistance segments. By controlling the length ratio of the alternating high and low resistance segments, the effective transverse resistance of the patterned layer can be controlled.

Figure 10A:
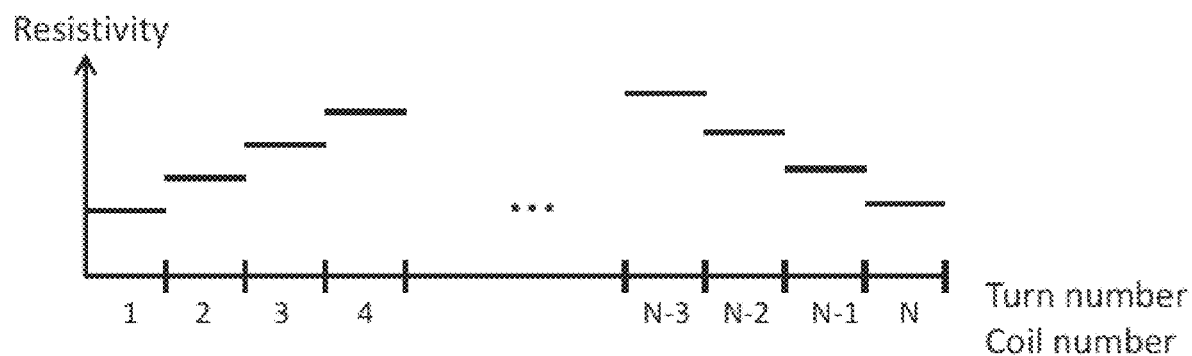
FIGS. 10A through 10C illustrate examples of grading types, in accordance with various embodiments of the present disclosure.
Figure 10B:
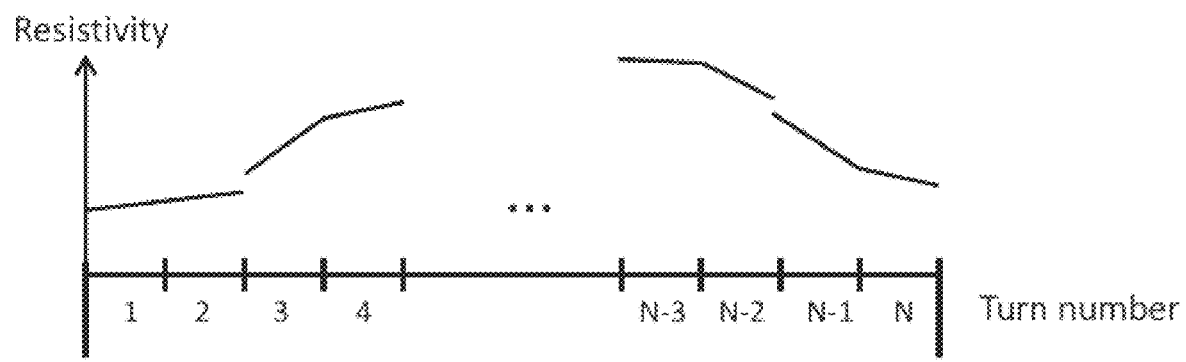
Figure 10C:
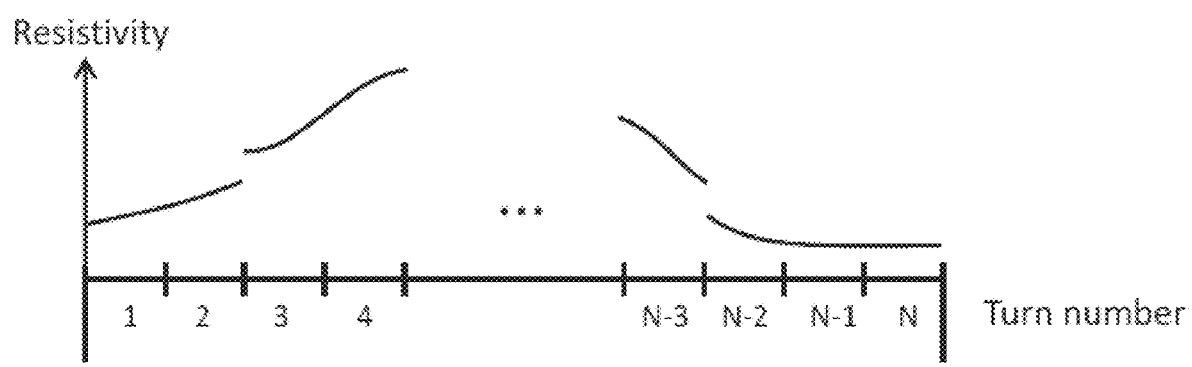

The grading of resistances can be implemented in many ways, including but not limited to using a step function (as shown in FIG. 10A), a piecewise linear function (as shown in FIG. 10B), or a piecewise nonlinear function (as shown in FIG. 10C) of the conductor length, or a step function (FIG. 10A) of turn or coil number. The patterning example in the co-winding layer described above is one example of using step function of the conductor length. A piecewise continuous function (FIG. 10B and FIG. 10C) of length produces a graded-resistance NI-coil magnet in which the turn-to-turn resistance within a single coil varies (linearly as in FIG. 10B or nonlinearly as in FIG. 10C) as a continuous function 1 in the first length segment of the total length of the winding conductor, then as a continuous function 2 in the second connected length segment (connected from the first segment), and so on up to the last connected length segment as another continuous function. A step function of turn number produces a graded-resistance NI-coil magnet in which the turn-to-turn resistance is a constant between every two adjacent turns (or fraction of turn) but differs from those in other turns. The grading of resistance can even be controlled dynamically depending on the strength of the local magnetic field by using, for example, magnetoresistance materials. In some implementations, materials where their resistances depend strongly on temperature over the range above the operating temperature can be used. This allows the turn-to-turn resistance to be adjusted dynamically during a quench.

The graded coil-to-coil interfacial resistance (FIG. 2E) can be implemented in a similar way as a thin layer of material sandwiched between every two adjacent coils. For each coil-to-coil interfacial resistance, it can be a constant value, can be patterned or can even be controlled dynamically by local magnetic field or local temperature as in the control of turn-to-turn resistances. In addition, each coil-to-coil interfacial resistance can also be graded axially across the width of the interfacial material in a radially stacked NI-coil magnet and radially across the radius of the interfacial material in an axially stacked NI-coil magnet in a piecewise linear or piecewise nonlinear fashion.

Figure 11:
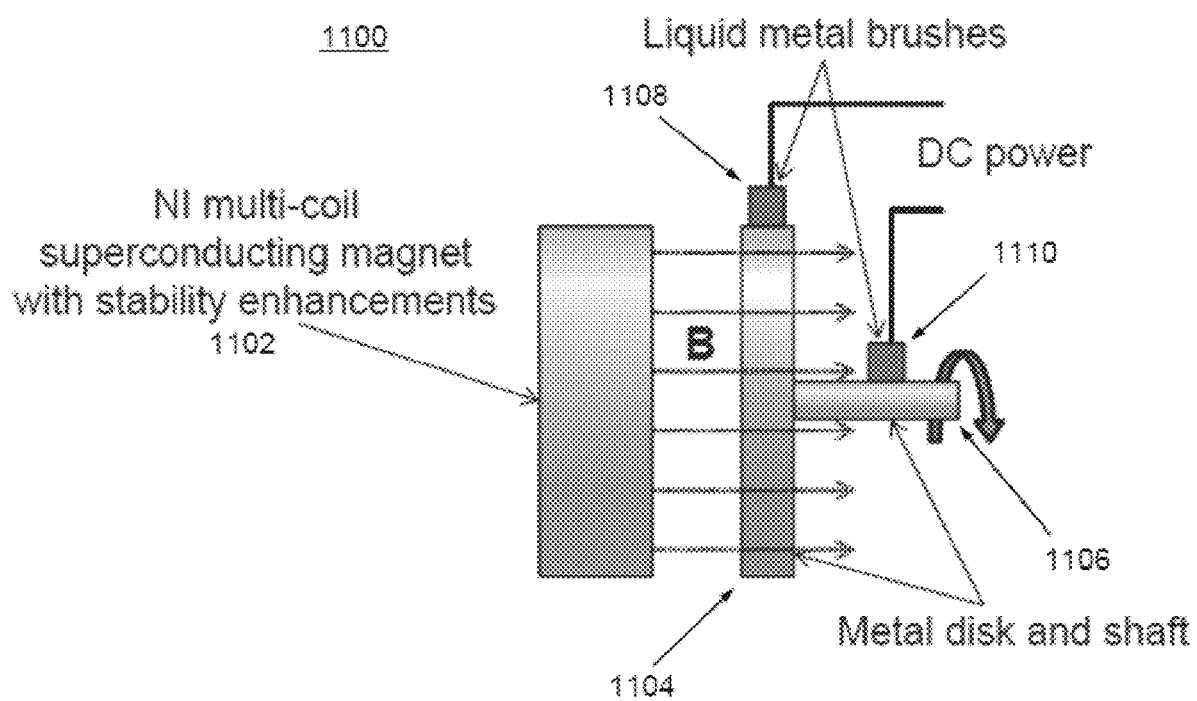
FIG. 11 is an illustration of a homopolar motor including an NI multi-coil superconducting magnet with grading stability enhancements, in accordance with various embodiments of the present disclosure.

FIG. 11 is an illustration of a disk-type homopolar motor/generator 1100 including an HTS NI coil or multi-coil superconducting magnet 1102 with grading stability enhancements, in accordance with various embodiments of the present disclosure. The motor 1100 includes an electrically conductive metal disk 1104 (as a rotating conductor), an electrically conductive shaft 1106 mechanically and electrically coupled to the electrically conductive metal disk 1104, and liquid metal brushes (1108 and 1110) electrically contacting an edge of the electrically conductive metal disk 1104 and the electrically conductive shaft 1106, respectively. The disk-type homopolar motor/generator 1100 can be DC operated with no AC losses or ripple fields.

In operation, a normal component (B) of the magnetic field generated by the HTS NI coil or multi-coil superconducting magnet 1102 is substantially or generally perpendicular to a face of the electrically conductive metal disk 1104 and acts on the metal disk 1104, which rotates when DC power is applied to first and second electrical contacts (e.g., liquid metal brushes 1108 and 110) or generates DC power from the first and second electrical contacts (e.g., liquid metal brushes 1108 and 1110) when the electrically conductive metal disk 1104 is rotated. It will be appreciated that liquid metal brushes are shown and described as examples and that other types of contacts suitable for rotational contact can be used, such as slip rings.

Figure 12:
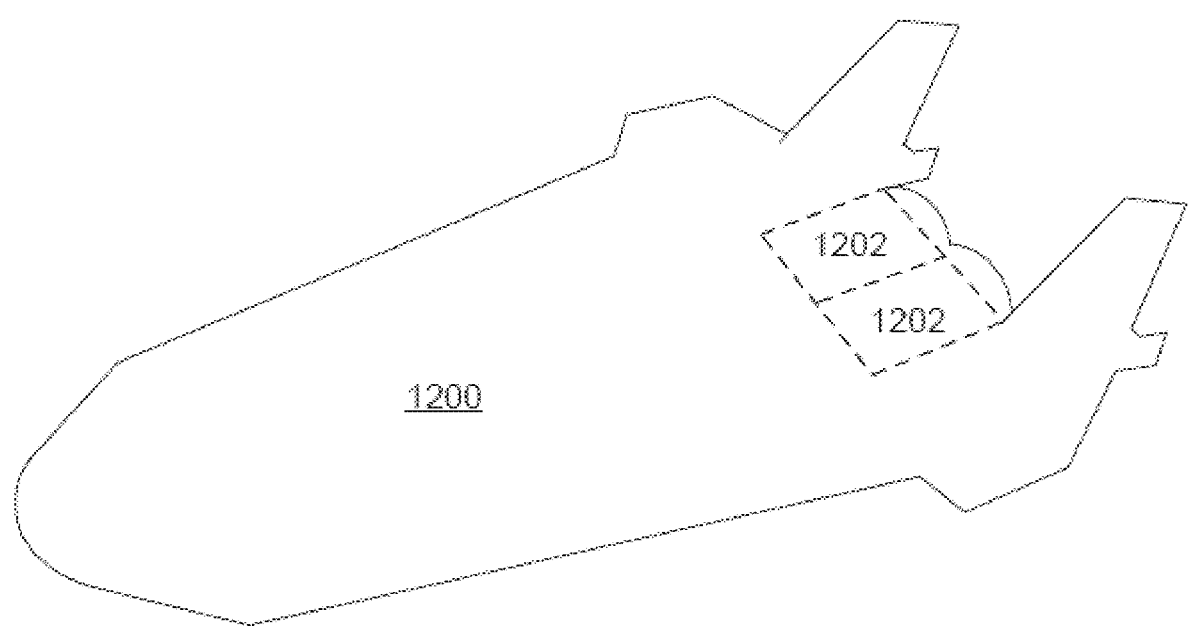
FIG. 12 is a diagram of an example hypersonic aircraft having a homopolar motor/generator with an HTS NI coil magnet, in accordance with various embodiments of the present disclosure.

A disk-type homopolar motor/generator as described above can have application in numerous devices and systems including aircraft such as hypersonic aircraft, among many others. FIG. 12 shows a diagram of an example hypersonic aircraft 1200 having one or more homopolar motor/generators 1202 in accordance with the present disclosure. The homopolar motor/generator(s) 1202 can include an HTS NI coil or multi-coil magnet as described herein. In some embodiments, homopolar motor/generator(s) 1202 can include one or more HTS NI coil or multi-coil magnets such as those shown in FIGS. 1A, 1B, 2A, 2B, 2C, 2D, 2E, 3A, 15, 16, 21, 26, and 31-34, and/or combinations thereof.

In some applications in which an HTS NI coil or multi-coil magnet is used to generate power, such as, for example, in homopolar motor/generator 1202 of a vehicle/aircraft as shown in FIG. 12, it may be desirable for the magnet to be configured to contain the propagation of a hot spot such that at least a fraction of the transport current is preserved in the winding pack (e.g., homopolar motor/generator 1202 does not lose power during/after a quench occurs and can provide continuous power) and provide a faster recharge time during self-protecting recovery and a reduced magnetic field transient. For example, in some embodiments, homopolar motor/generator(s) 1202 can include an HTS NI multi-coil magnet comprising two or more coils connected in series, in parallel, or in a mixed combination, the coils having the same or different thermal barrier designs configured to contain the propagation of a hot spot while still permitting turn wise current sharing such as, for example, those barrier designs shown in FIGS. 26, 26, and 31-34, and described below.

The no-insulation (NI) approach to winding (RE)Ba$_2$Cu$_3$O$_X$ (REBCO) high temperature superconductor (HTS) solenoids has shown significant promise for maximizing the efficient usage of conductor while providing self-protecting operation. Self-protection in a NI coil, however, does not diminish the likelihood that a recoverable quench occurs. During a disturbance resulting in a recoverable quench, owing to the low turn-to-turn contact resistance, transport current bypasses the normal zone by flowing directly from the current input lead to the output lead, leading to a near total loss of the azimuthal current responsible for magnetic field generation. The consequences are twofold. First, a long recovery process is needed to recharge the coil to full operational functionality. Second, a fast magnetic field transient is created due to the sudden drop in magnetic field in the quenching coil. The latter could induce a global inductive quench propagation in other coils of a multi-coil NI magnet, increasing the likelihood of quenching and accelerating the depletion of useful current in other coils, lengthening the post-quench recovery process.

Embodiments include a graded-resistance construction designed to tackle the mentioned problems while maintaining the superior thermal stability and self-protecting capability of NI magnets. Through computational modeling and analysis on a hybrid multiphysics model, patterned resistive-conductive layers are inserted between selected turn-to-turn contacts to contain hot-spot heat propagation while maintaining the turn-wise current sharing required for self-protection, resulting in faster post-quench recovery and reduced magnetic field transient. Effectiveness of the designs have been studied at 4.2 K and 77 K. Embodiments include REBCO magnets with high current density, high thermal stability, low likelihood of quenching, and rapid, passive recovery, and also with high operational reliability and availability.

The no-insulation (NI) approach to (RE)Ba$_2$Cu$_3$O$_x$ (REBCO) high temperature superconducting (HTS) magnets is one of the most innovative new approaches to high field superconducting magnet design, resulting in higher winding pack density and superior thermal stability, as compared to some insulated REBCO magnets. NI coils are expected to be self-protecting, recovering from quenches without external quench protection mechanisms or other active measures. As a result, the NI approach reduces the costs of fabrication and operation of REBCO magnets. For many applications, the NI approach may resolve many of the long-standing challenges preventing the advancement of REBCO-based applications. Yet the rapid advancement of the NI coil concept has also identified a number of important challenges and issues; these are defined here as Issues 1-4.

Issue 1: During a current ramping, the inductive impedance along the conductor increases, causing part of the transport current to "leak" through the turn-to-turn contact, which has very low electrical contact resistance, as a radial current. The consequence is much slower charging/discharging rate as compared to an insulated counterpart. Results have shown that the higher the total turn-to-turn electrical resistance, the faster is the charging/discharging rate. In general, the charge and discharge times are proportional to the time constant:

$$\tau = \frac{L}{R_r} \quad (4)$$

where L is the coil inductance and $R_r$ is the characteristic resistance, which is essentially the sum of the turn-to-turn contact resistances of the coil.

Issue 2: During charging or discharging, local current concentrations form within a large NI magnet composed of one or multiple NI coils. The regions with high local current concentration have increased likelihood of quenching in the event of a heat disturbance.

Issue 3: During a quench in a NI coil, even if it is a recoverable one, when the hot-spot creates a large normal zone, the azimuthal current responsible for the generation of magnetic field can drop abruptly, even to nearly zero. This has two consequences. One consequence is that current has to be recharged to fill the current-depleted turns from a low remaining value during recovery and thus the coil goes through a lengthy period without generating significant magnetic field, impacting its operational availability. The other consequence is a fast magnetic field transient which leads to a stability issue described below as "Issue 4."

Issue 4: Experiment and simulation results show that in a multi-coil NI magnet, the fast decreasing magnetic field transient caused by a fast discharge in a quenching coil can induce a quench that propagates to the adjacent coils in the magnet via AC losses and inductive coupling. This generates a rapid, wide-spread quench propagation in the multi-coil NI magnet. Fast, global quench propagation is desirable in insulated HTS magnets, since a quick but controlled energy dump can prevent destructive overheating. In the case of a NI magnet composed of individually self-protecting NI coils, however, the effects of a wide-spread quench propagation are twofold: i) the recovery process is dramatically lengthened, since instead of recharging only the initially quenched coil, it is now necessary to recharge all the coils that quenched, and ii) the stability and reliability of the NI magnet are reduced.

Embodiments include Graded-Resistance NI (GRNI) methods that maintain the advantages of the NI approach while mitigating the challenges described above. Embodiments include a GRNI construction method that tackles specifically the slow recovery issue described in Issue 3 on a single NI coil. The method involves constructing GRNI magnets by manipulating the turn-to-turn contact resistances via grading and patterning to contain the propagation of a hot-spot such that a fraction of the transport current is preserved in the winding pack. Benefits of this technique and construction can include much faster recharge time during self-protecting recovery and reduced magnetic field transient. The method, when applied to multi-coil NI magnets, also mitigates the problem described in Issue 4, since the reduction in magnetic field transient reduces the likelihood of the occurrence of inductive quench propagation, thus increasing the stability of multi-coil NI magnets. An additional benefit of this method is improved ramping rate. The method has been studied computationally via hybrid multiphysics NI coil models at both the 77 K and 4.2 K operating temperatures. Embodiments include self-protecting REBCO magnets with high current density, high thermal stability, low likelihood of quenching, and rapid, passive recovery that also have high operational reliability and availability.

Figure 13:
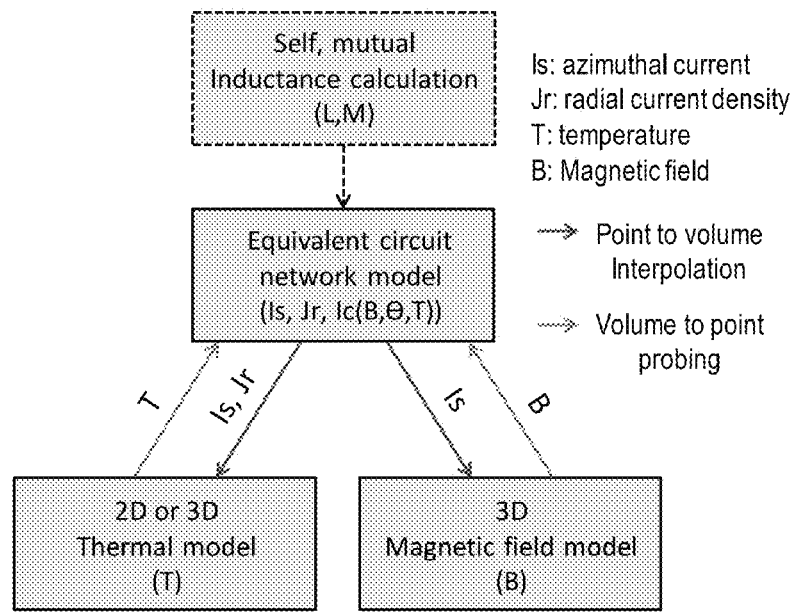
FIG. 13 is a block diagram of a hybrid coupled multiphysics NI coil model, in accordance with various embodiments of the present disclosure.

Due to the low turn-to-turn contact resistance, current can flow in both azimuthal and radial directions throughout the entire NI coil. As result, every individual turn in a NI coil must be taken into account in simulation. The most viable way to model the electrical behavior of the entire NI coil is by using a spirally-wound equivalent circuit network model. FIG. 13 shows a block diagram of a hybrid NI magnet model. The equivalent circuit network model calculates the currents distributions. The calculated nodal current distributions are input into a finite element (FE) thermal magnet model (T) as heat sources and into a FE electromagnetic magnet model (B) to calculate the magnetic field distribution. Meanwhile, the calculated temperature and magnetic field are fed back to the equivalent circuit network model for the calculation of the critical current. The entire coupled hybrid magnet model is run in COMSOL Multiphysics simulation software.

Figure 14:
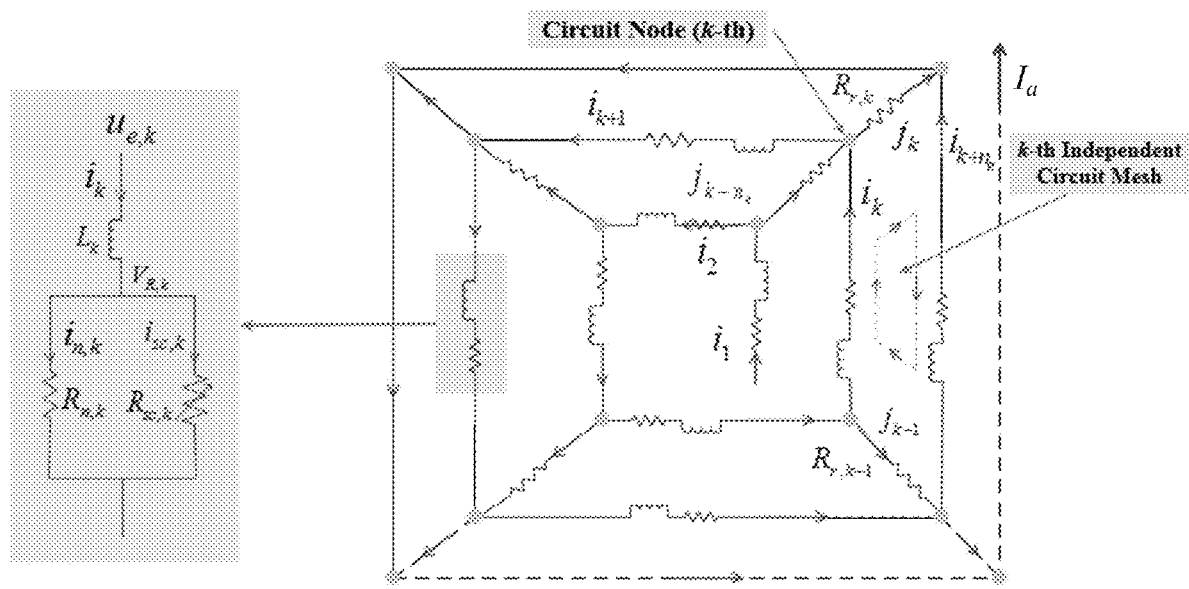
FIG. 14 is a schematic of a spirally-wound equivalent circuit network model for NI coils, in accordance with various embodiments of the present disclosure.

FIG. 14 shows a schematic circuit diagram for a representative spirally-wound equivalent circuit network model for a single NI coil. Equivalent circuit network model of NI coils is well-established and experimentally validated. A network model for the multi-coil NI magnet is built by cascading multiple single-coil network models in series via connecting the current output lead of the previous coil to the current input lead of the next coil. For simplicity, the following description of the network model is based on a single-coil model. The current calculated by the network model is decomposed into an azimuthal current and a radial current that flows through the turn-to-turn contact in the radial direction. Each turn of the coil is subdivided into $n_e$ ($_{ne}=4$ in the example shown) fine arc elements along the azimuthal direction; each arc element is represented by an inductance-resistor circuit. The arc number ($_n$e) per turn is adjusted adaptively according to the dynamics of the electrical behavior. For example, turns that are closer to the hot-spot are modified with larger $_{ne}$ per turn, and those further away, with a lower $_{ne}$ per turn. In this way, the size of the system of equations representing the network can be reduced significantly, especially in a multi-coil magnet model. At each circuit node, the governing equation is derived from Kirchhoff's current law and in each independent circuit mesh, from Kirchhoff's voltage law:

$$\begin{cases} i_k - i_{k+1} + j_{k-n_e} - j_k = 0 \\ u_k - u_{k+n_e} - j_{k-1} R_{r,k-1} + j_k R_{r,k} = 0 \end{cases} \quad (5)$$

where $i_k$ and $j_k$ represent the azimuthal current and radial current of the $k^{th}$ arc element, respectively, $u_k$ is the voltage across the $k^{th}$ arc element circuit and $R_{r,k}$ is the radial turn-to-turn resistance of the $k^{th}$ arc element. The azimuthal current i includes that in the superconducting layer and normal layers in a REBCO conductor, including the substrate, stabilizer and metallic thin-film laminations. A positive i flows in the anticlockwise direction and a positive j flows in the radially outward direction. Hereafter, the subscripted index k of a variable refers to the variable of the $k^{th}$ arc element, unless stated otherwise. The equivalent turn-to-turn resistance, which includes the contact resistance and transverse resistance of the conductor, is calculated as:

$$R_{r,k} = \frac{\rho_r}{S_k} \quad (6)$$

where $S_k$ is the contact surface area and $\rho_r$ is the equivalent radial contact resistivity, which is found experimentally to be typically 70 $\mu\Omega \cdot cm^2$ at 77 K.

The voltage $u_k$, across the $k^{th}$ arc element is the sum of resistive and inductance voltages calculated as:

$$u_k = L_k \frac{di_k}{dt} + \sum_{l \neq k} M_{k,l} \frac{di_l}{dt} + V_{R,k}(i_k, I_{c,k}, T_k) \quad (7)$$

where $L_k$ represents the self-inductance and $M_{k,l}$ is the mutual inductance coupled with other arc elements. The inductances are calculated by Biot-Savart Law via an integration method. $V_{R,k}$ is the voltage across the azimuthal resistance of the $k^{th}$ arc element, which consists of two parallel resistances: the resistance of the superconducting layer $R_{sc,k}$ (inset of FIG. 14) and that of the normal layers $R_{n,k}$ (inset of FIG. 14). $V_{R,k}$ depends on the azimuthal current $i_k$, critical current $I_{c,k}$ and temperature $T_k$, and is calculated from the following relationships:

$$\begin{cases} E_0 l_k \left( \frac{i_{sc,k}}{I_{c,k}} \right)^\alpha - (i_k - i_{sc,k}) R_{n,k} = 0, \\ V_{R,k} = E_0 l_k \left( \frac{i_{sc,k}}{I_{c,i}} \right)^\alpha, \\ i_{n,i} = i_k - i_{sc,k}, \\ R_{n,k} = \rho_n(T_k) \frac{l_k}{S_c}, \\ I_{c,k} = I_{c0} \cdot I_c(T_k) \cdot I_c(B_{\Box,k}, B_{\perp,k}) \end{cases} \quad (8)$$

where $i_{sc,k}$ is the current in the superconducting layer. $l_k$ and $S_c$ are the length of the arc element and cross sectional area of the conductor, respectively. $\rho_n$ is the temperature-dependent equivalent resistivity of all the normal layers, including the substrate, stabilizer and metallic thin-film laminations, and is estimated by using the parallel rule of mixtures. $i_{n,k}$ is the normal-layer current flowing through $R_{n,k}$. The voltage $V_{R,k}$ in equation (8) equals the voltage across $R_{sc,k}$, and is expressed as the E-I power law of HTS conductors with $E_0=1\times10^{-4}$ V/m and $\alpha=31$. The critical current $I_{c,k}$ depends on the temperature $T_k$ and magnetic field $B_k$. $I_{c0}$ is the self-field critical current of the REBCO conductor.

The temperature-dependent critical current $I_c$ in (5) is calculated as:

$$I_c(T) = \begin{cases} I_{c0}\dfrac{T_c - T}{T_c - T_o} & \text{if } T < T_c, \text{ for } T \geq T_0 \\ 0 & \text{if } T \geq T_c \end{cases} \quad (9)$$

where $T_o$=77 K or 4.2 K is the operating temperature, $T_c$=92 K is the critical temperature. The field- and angular-dependent critical current in (5) is calculated as:

$$I_c(B, \theta) = I_c(B_\square, B_\perp) = \dfrac{1}{\left[1 + \sqrt{(kB_\square)^2 + B_\perp^2}\Big/B_c\right]^b} \quad (10)$$

where $B_\square r$ and $B_\perp$ represent the magnetic fields parallel and perpendicular to the wide tape surface, respectively. Here k, b and $B_c$ are parameters curve-fitted from experimental data of the conductors used. For 77 K simulations, the experimental data are generated from in-house measurements and for 4.2 K simulations, they are taken from Xu A, Jaroszynski J J, Kametani F, Chen Z, Larbalestier D C, Viouchkov Y L, Chen Y, Xie Y and Selvamanickam V 2010 Angular dependence of J(c) for YBCO coated conductors at low temperature and very high magnetic fields *Supercond. Sci. Technol.* 23 014003. FIGS. 35-37 show Tables 1-3, respectively, listing the key parameters used in the 77 K and 4.2 K simulations. Table 1 shown in FIG. 35 lists key parameters common to both the 77 K and 4.2 K simulations. Tables 1 and 2 shown in FIGS. 35 and 36, respectively, list the key parameters used in the 77 K simulations. Tables 1 and 3 shown in FIGS. 35 and 37, respectively, list the key parameters used in the 4.2 K simulations.

Figure 15:
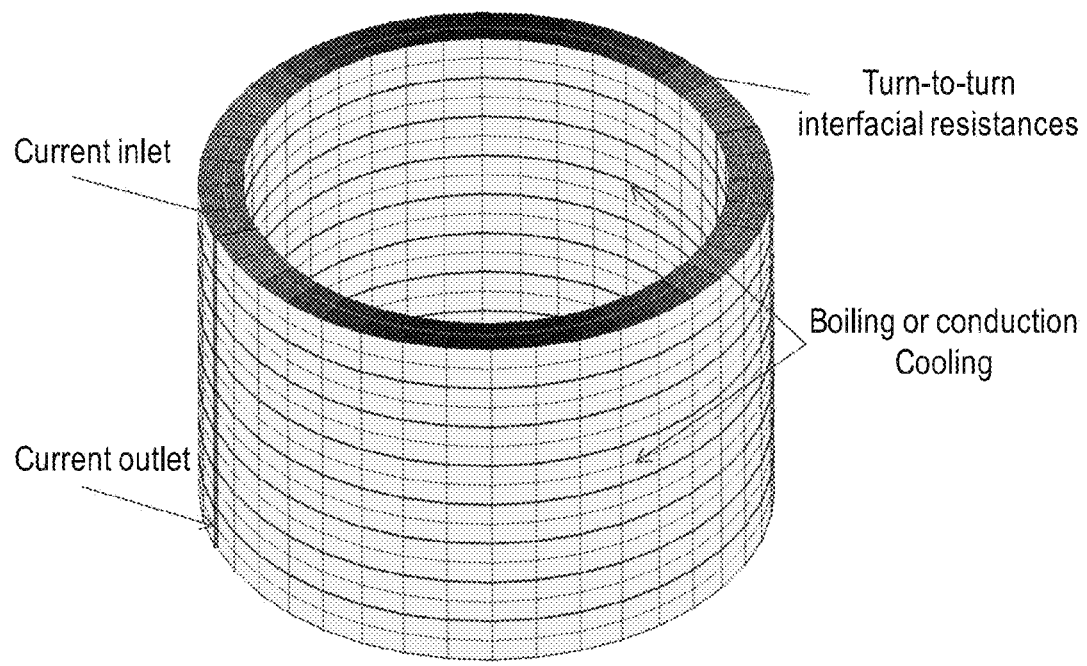
FIG. 15 illustrates geometry for coupled 3D spirally-wound thermal and electromagnetic multi-coil models, in accordance with various embodiments of the present disclosure.

For a single coil with an approximation that temperature is uniformly distributed across the height of the coil, a 2D FE thermal model can be used to reduce the degree of freedom. For a multi-coil magnet, the FE thermal and electromagnetic models are always 3D and always share the same geometry of the magnet; the difference is that the electromagnetic model has an air region. FIG. 15 shows an example of the geometry for 3D FE thermal and electromagnetic multi-coil magnet models; the air region for the electromagnetic model is not shown. The FE models are spirally-wound with the same turn number and dimensions specified in the network model. The REBCO conductor used is approximated as a homogenous conductor with the effective homogenous thermal and electrical material properties estimated using the rule-of-mixtures.

The governing equations of the homogenous 2D or 3D thermal model are expressed as (with the arc element number k ignored):

$$\begin{cases} d(T)C_p(T)\dfrac{\partial T}{\partial t} + \nabla \cdot (-k\nabla T) = Q_n = \rho_n(T)(i_{nl}/S_c)^2 & \text{in } \Omega, \\ -n\cdot(-k\nabla T) = 0.5Q_r = 0.5\rho_r(j_l/S_k)^2 & \text{on } \partial\tilde{\Omega}, \\ -n\cdot(-k\nabla T) = -P_c(T - T_o) & \text{on } \partial\Omega_c \end{cases} \quad (11)$$

where d and $C_p$ are the temperature-dependent equivalent density and specific heat capacity. $Q_n$ is the Joule heating on the normal layers and $Q_r$ is the radial Joule heating on $\partial\tilde{\Omega}$, which is the union of all the internal turn-to-turn contact surfaces. $i_{nl}$ and $j_l$ are the interpolated normal-layer and radial currents, and $P_c$ is a cooling function of temperature difference imposed on the boundary $\partial\Omega_c$, which is the union of the innermost and outermost surfaces of the magnet ($\partial\Omega$ is the union of all the external boundaries). For 77 K simulations, $P_c$ represents a cooling power similar to the heat load (lift) curve of a commercial cryocooler. For 4.2 K simulations, $P_c$ represents the pool boiling heat transfer curve (as heat flux) of liquid helium (LHe) under 1 atm pressure. The nodal normal-layer current $i_n$, azimuthal current i and radial current j obtained from the network model are populated along the conductor length to form 3D (or 2D) current distributions $i_{nl}$, $i_l$ and $j_l$ using 3D (or 2D) interpolations for the calculations of Joule heating in the thermal model and magnetic field in the electromagnetic model (see FIG. 13). The interpolated currents are assumed to be uniform across the conductor thickness and width. A heater located inside the thermal model is used to simulate a local heat disturbance.

The 3D FE electromagnetic model is coupled to the network model to calculate the magnetic field generated by the interpolated coil current. The inductive voltage term in equation (7), which calculates the voltage induced by a changing current, implicitly takes into account the voltage induced by the changing magnetic field. As a result, static Maxwell equations are used for the calculation of magnetic field as follows:

$$\begin{cases} \nabla \times \nabla \times A = \mu J_e & \text{in } \Omega \\ B = \nabla \times A & \text{in } \Omega \\ \nabla \cdot A = 0 & \text{in } \Omega \\ B \cdot n = 0 & \text{on } \partial\Omega \end{cases} \quad (12)$$

where B is the magnetic flux density, A is the vector magnetic potential and μ is the permeability. The current density $J_e = \langle j_l/S_k, i_l/S_c, 0\rangle$ ($\langle,,\rangle$ means 3D vector in cylindrical coordinates). The third equation is added for gauge fixing.

The calculated temperature and magnetic field distributions (spatially continuous variables) are extracted from the thermal and electromagnetic models, respectively, at the same set of physical, discrete point locations (along the conductor length) associated to the network model's nodes. The extractions are done by using point probes (as a "domain point probe" data monitoring function in COMSOL) (see FIG. 13). In each time step, the extracted temperature and magnetic field are input to the network model to derive the temperature-dependent material properties and calculate the critical current $I_c$ in equations (9) and (10).

Embodiments include GRNI methods based on the idea of manipulating the turn-to-turn thermal and electrical resistances in a NI coil to control its electrical and thermal behaviors. In the hybrid model, turn-to-turn thermal and electrical resistances are added to the contact between two adjacent turns, namely turn n−1 and turn n, by inserting interfacial equations (as internal boundary conditions in COMSOL):

$$\begin{cases} -n\cdot(-k\nabla T) = -\tilde{k}_{s,n}(\phi)\dfrac{T_{n-1} - T_n}{d_s} & \text{on } \partial\tilde{\Omega}_n, \\ -n\cdot(-k\nabla T) = -\tilde{k}_{s,n}(\phi)\dfrac{T_n - T_{n-1}}{d_s} & \text{on } \partial\tilde{\Omega}_{n-1} \end{cases} \quad (13)$$

where $\partial\tilde{\Omega}_{n-1}$ and $\partial\tilde{\Omega}_n$ are the two adjacent internal turn-to-turn contact boundaries on turn n−1 and turn n. $\tilde{k}_{s,n}(\phi)$ is the thermal conductivity of the insertion as a function of the arc length angle ($\phi$). This function allows a graded or patterned thermal resistance to be defined for the insertion between turn n−1 and turn n. $T_n$ is the temperature measured on the boundary $\partial\tilde{\Omega}_n$ and $d_s$ is the thickness of the insertion.

Graded or patterned turn-to-turn electrical resistance insertion is added by two steps. First, by changing the radial turn-to-turn contact resistance $R_{r,k}$ (defined in equation (6)) in the same pattern defined by $\tilde{k}_{s,n}(\phi)$. For example, wherever a section $\tilde{k}_{s,n}(\phi)$ is defined as thermal insulation, all the $R_{r,k}$ that falls within the same section are changed to electrical insulation too. Second, by changing the radial Joule heating on the contact between turn n−1 and turn n to match the changes in $R_{r,k}$. The radial Joule heating term in equation (11) is modified as $$-n\cdot(-k\nabla T)=0.5\tilde{\rho}_{r,n}(\phi)(j_r/S_k)^2 \text{ on } \partial\tilde{\Omega}_{n-1} \text{ and } \partial\tilde{\Omega}_n, \quad (14)$$

where $\tilde{\rho}_{r,n}(\phi)$ is a function of the arc length angle for the turn-to-turn electrical resistivity for the insertion between turn n−1 and turn n. Its value is modified from $R_{r,k}$ accordingly to match the pattern defined in $\tilde{k}_{s,n}(\phi)$.

Figure 16:
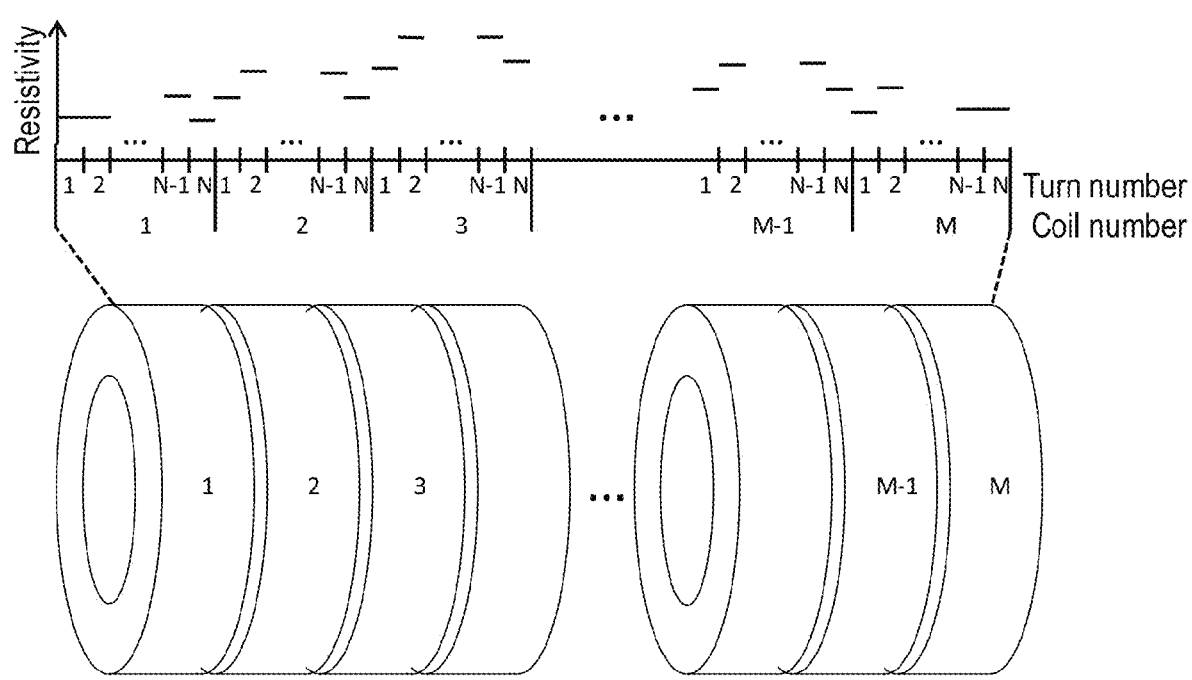
FIG. 16 illustrates an example GRNI implementation that involves both intra-coil grading and inter-coil grading, in accordance with various embodiments of the present disclosure.

GRNI designs/methods disclosed herein are developed to mitigate Issues 1-4 described above. The methods engineer the thermal and electrical behaviors of NI coils by manipulating the turn-to-turn contact resistance via grading and patterning. Two types of grading can be applied to a multi-coil magnet: intra-coil grading and inter-coil grading. Intra-coil grading involves manipulating the turn-to-turn resistance with respect to all turns within a single coil. Inter-coil grading involves manipulating the turn-to-turn resistance with respect to all coils within the same magnet. FIG. 16 shows an example of GRNI multi-coil magnet with both intra- and inter-coil grading using arbitrary values. Embodiments disclosed herein address Issue 3 and significantly reduce the magnetic field transient which also mitigates Issue 4.

Figure 17:
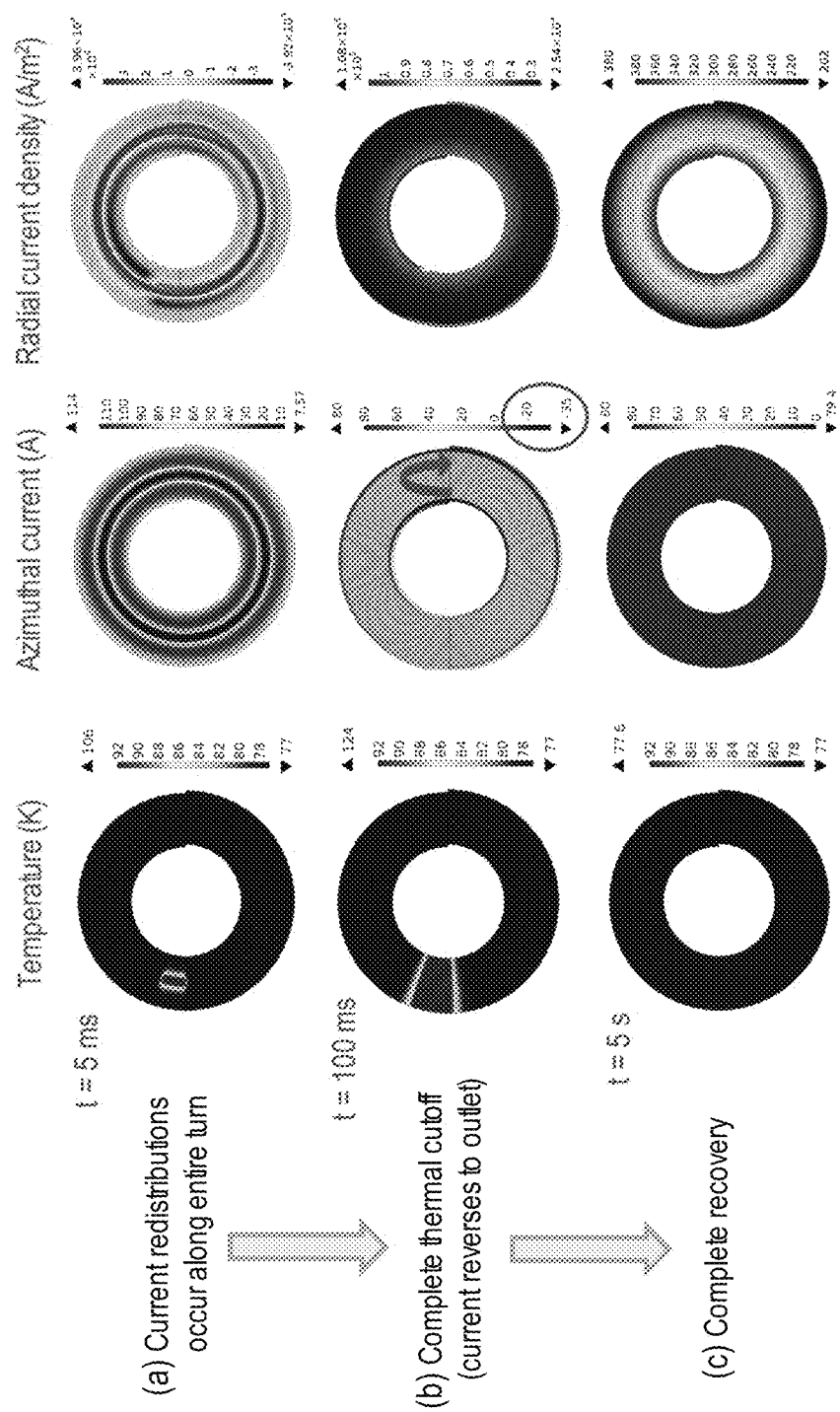
FIG. 17 illustrates distributions of temperature, azimuthal and radial currents during a quench-recovery process in a 20-turn NI pancake coil at 77 K, in accordance with various embodiments of the present disclosure.

The GRNI designs/methods disclosed herein are based on a comprehensive understanding of the underlying mechanisms that give HTS NI magnets their high thermal stability and self-protecting capability. FIG. 17 (first row, t=5 ms) shows that during the formation of a local normal zone in a 20-turn NI pancake coil operated at 77 K, transport current redistribution occurs turn-wise, i.e., along the entire turn in which the normal zone is growing, instead of just bypassing the local normal zone as commonly believed. A turn in which a local normal zone has formed is referred thereafter simply as a "normal turn". This turn-wise current sharing effect causes the azimuthal current (mainly from the superconducting layer) to be "pushed away" from all the normal turns and "absorbs" by the neighboring superconducting turns as a radial current, resulting in an overcurrent in those neighboring turns. Note that as more turns become normal, the overcurrent in the neighboring turns becomes higher. A local normal zone that causes a turn-wise loss of azimuthal current is referred hereafter as a "thermal-cutoff" region, to highlight that this peculiar behavior only happens in coils with very low turn-to-turn resistance, including the NI coils. FIG. 17 (second row, t=100 ms) shows that once complete thermal-cutoff occurs, i.e., the hot-spot has propagated to thermally-cutoff an entire radial cross section of the coil, the azimuthal current is nearly zero across the entire coil. Much of the transport current flows directly from the input to the output current lead, bypassing the thermal-cutoff region. FIG. 17 (third row, t=5 s) shows that the hot-spot eventually retreats and the coil recovers from the transient quench. In addition to good heat conduction across the turn-to-turn contact, the turn-wise current sharing-and-absorption and the input-to-output-lead current bypass prevents Joule heating at the hot-spot from creating normal zone growth, resulting in a self-protecting coil.

Figure 18A:
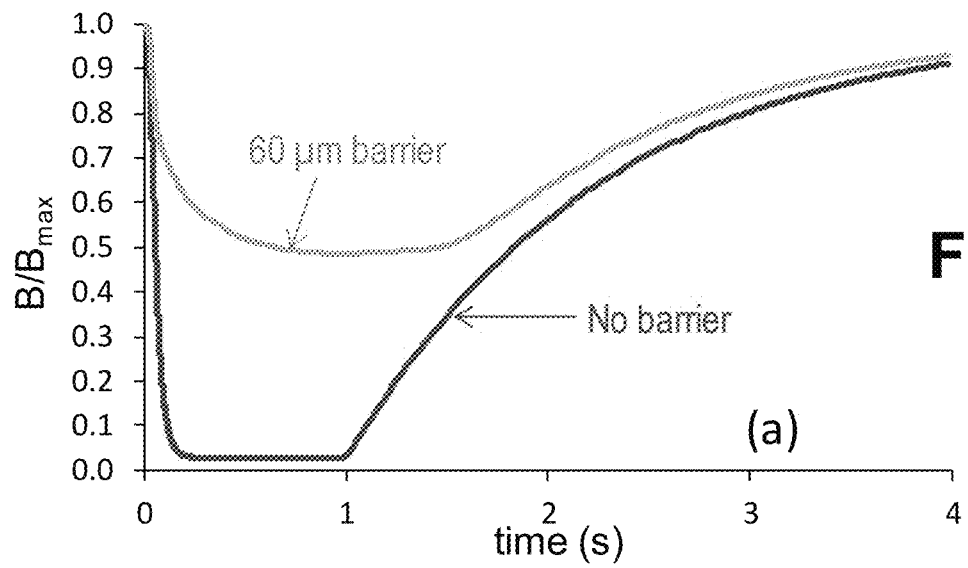
FIG. 18A is a graph showing normalized center magnetic field versus time profiles during quench-recovery at 77 K, taken from an NI coil and a modified counterpart with a single-turn of Kapton strip added.
Figure 18B:
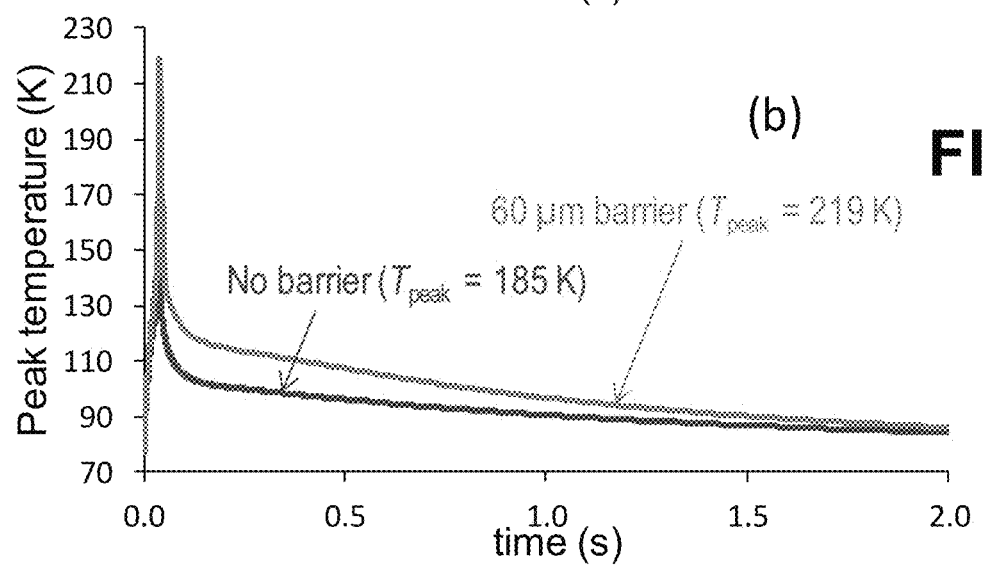
FIG. 18B is a graph showing the corresponding temperature versus time profiles, in accordance with various embodiments of the present disclosure.

Notice that in FIG. 17, much of the azimuthal current at the vicinity of the current leads is negative, indicating that the current bypasses the thermal-cutoff zone by reversing (clockwise) from the current input lead to the output lead. The consequences of this current redirection include potential heating around the current leads and a near total-depletion of "useful" azimuthal current responsible for magnetic field generation. The "No barrier" curve in FIG. 18A shows that the normalized center magnetic field drops abruptly to nearly zero when complete thermal-cutoff begins in the same NI coil. As a result, even if the coil is self-protecting and recovers fully, a lengthy recharge process is required before the magnet returns to full functionality. The "No barrier" curve in FIG. 18B shows that the hot-spot peak temperature, which tops at 185 K, caused by a large disturbance in the same coil decreases steadily after the heat source ends, indicating that even if a complete thermal cutoff occurs, recovery still occurs. During the entire quench-recovery process, the power supply remains connected and the magnetic field returns slowly and much later to its final operating value.

To tackle the slow recovery issue (Issue 3), a GRNI approach is used to limit the depletion of "useful" (azimuthal) current during a quench. The key idea is demonstrated in FIGS. 19A and 19B. A straightforward, simple resistance grading composed of a single full-turn of 60 μm Kapton insulation is inserted as a thermal barrier between two center turns of the same NI coil shown in FIG. 18. The heater is placed at the middle of the outer half-section of the coil. The Kapton thermal barrier limits heat propagation from the hot-spot to the inner half-section of the coil. Thus the temperature there remains below the critical temperature $T_c$ and the transport current on the inner half section remains. Notice that the turns on the cold side of the barrier, i.e., on the inner-half of the coil, are overcurrent (126 A>$I_c(B_{max}$, 77 K)=115.5 A, see Table 2 of FIG. 36). The curve "60 μm barrier" in FIG. 18A shows that this simple implementation maintains about half of the center magnetic field during a quench-recovery process with the power supply constantly applied. Since the thermal barrier also renders less heat dissipation, the peak hot-spot temperature also increases, as FIG. 18B shows. Moreover, since in general, a thermal insulator is also an electrical insulator, this simple implementation also prevents turn-wise current sharing from redistributing to the neighboring turns. As a result, current only flows to the neighboring turns through the narrow turn gap in the Kapton barrier, shown in FIG. 20, resulting in unwanted local heating which eventually causes a non-recoverable quench. Thus, a more complex design is needed not only to prevent complete thermal-cutoff and local heating but also to maintain the turn-wise current sharing mechanism required for self-protection.

Figure 21:
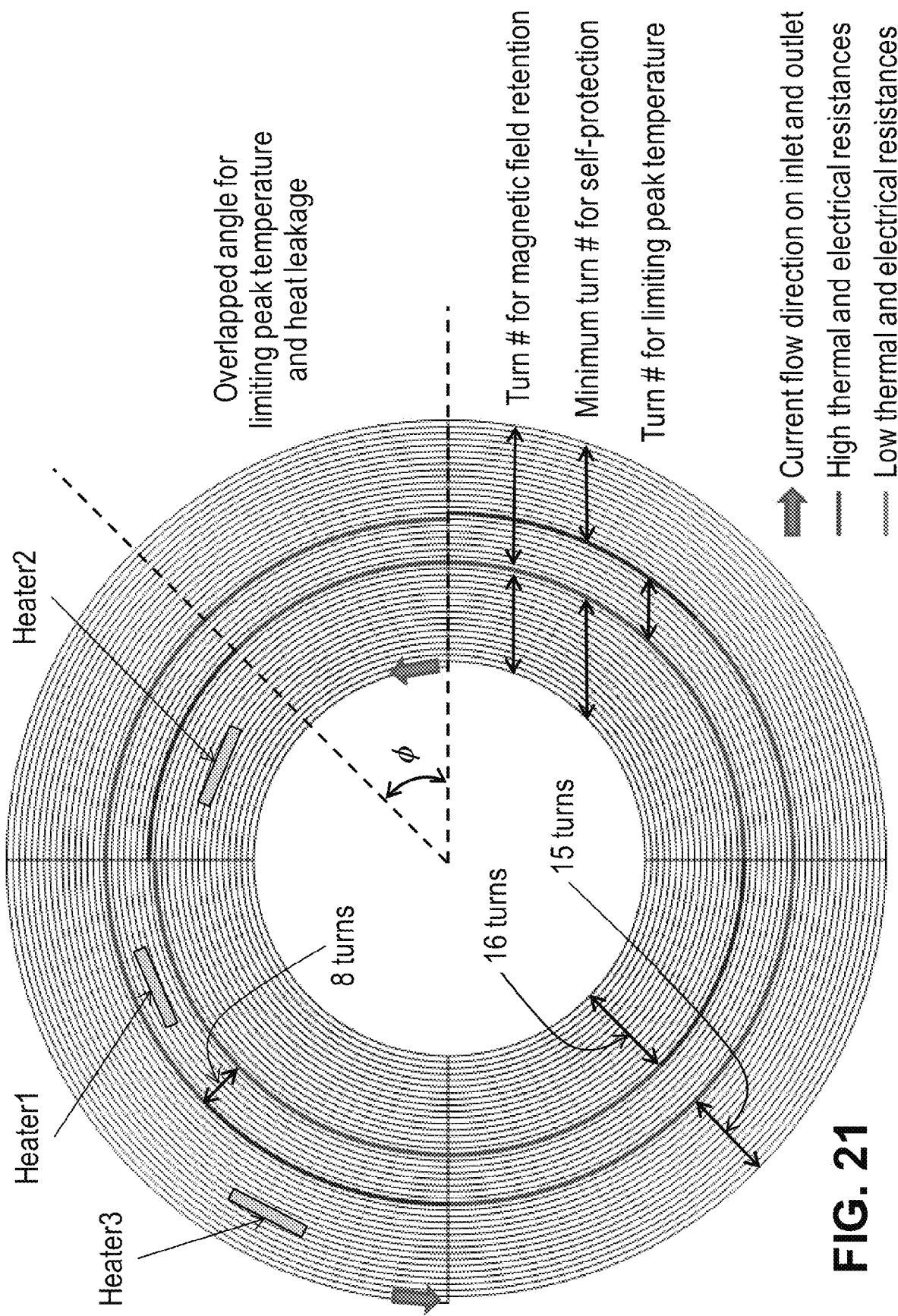
FIG. 21 illustrates a GRNI magnet with an 8-turn barrier design, in accordance with various embodiments of the present disclosure.

FIG. 21 demonstrates an effective GRNI design example applied to a 39.5-turn NI pancake coil with an inductance of 4 mH. The grading is composed of one set of two full turns of patterned thermal barriers, using 60 μm Kapton thin strip, inserted between turns 16 and 17, and between turns 24 and 25, with 8 turns between the two barriers. Electrically (and thermally) conductive arc segments of various lengths are inserted at periodic intervals along the barriers. Here, in the model, the conductive arc segments are realized by simply not adding any Kapton strip. The conductive segments allow turn-wise current sharing to occur to maintain high thermal stability and to prevent local heating, in particular, around the current input and output leads and one similar to that shown in FIG. 20, from occurring during local thermal-cutoff formation. Note that the current input and output leads of the coil shown in FIG. 21 are placed at the opposite sides of the coil. This arrangement allows more paths for the shared current to reach the current leads from the conductive segments when thermal cutoff occurs. The conductive segment on one barrier turn is covered by an insulation segment on the other barrier turn. Here, the overlapping length of the insulation segments are always confined in 45 degrees and thus the conductive segments are also confined to 45 degree. The design shown in FIG. 21 ensures that a hot-spot initiated at any location of the coil is contained by at least one layer of barrier and that current always find a path to flow without generating local heating. Hereafter, the design in FIG. 21 is referred as the "8-turn" design.

Simulation Results—77 K Cases

Figure 22A:
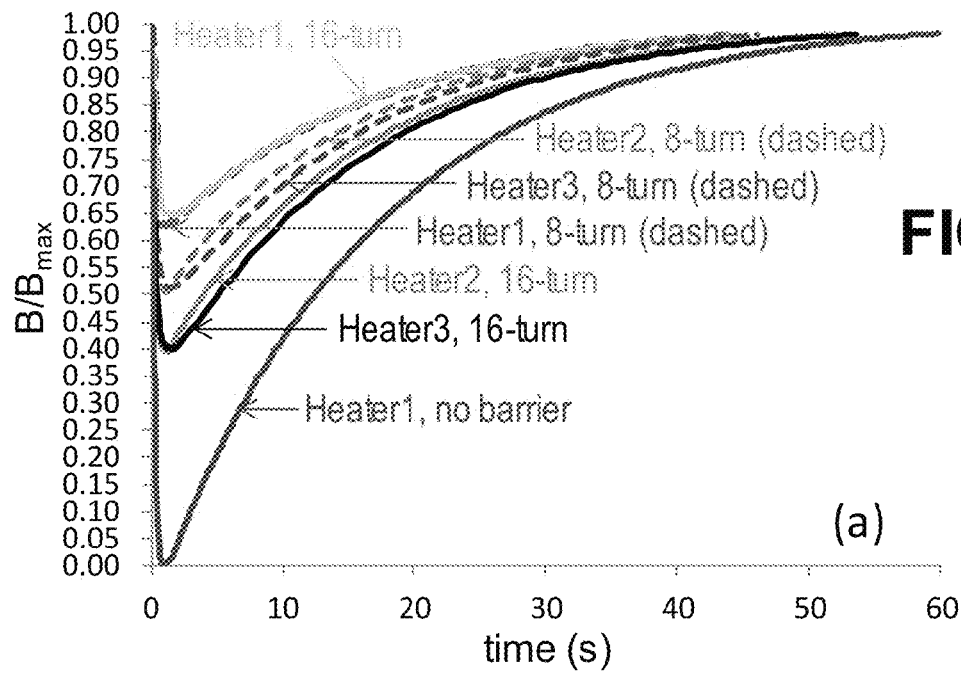
FIG. 22A is a graph showing normalized center magnetic field versus time profiles during quench-recovery at 77 K, taken from two graded NI coils installed with the 8-turn or 16-turn barrier design and from a non-graded counterpart.

To study the effectiveness of the 8-turn design, the 39.5-turn single-pancake model is tested with hot-spots initiated at different places; three of the tested hot-spot locations are shown in FIG. 21 (at Heater1, Heater2, and Heater3). These locations are keys to determine the effectiveness of the grading design in preserving the magnetic field and self-protecting capability of the coil. Table 1 lists the common key parameters used in the 77 K and 4.2 K simulations. Table 2 lists the parameters used in the 77 K simulations. FIG. 22A shows the normalized center magnetic field versus time profiles generated by a NI coil graded with the 8-turn design and a non-graded NI counterpart. All simulations are performed under the same heater energy (476 W for 40 ms) and cooling conditions with the power supply always connected. A complete thermal-cutoff similar to the one seen in FIG. 18A is induced in the non-graded NI coil by Heater1, causing the center magnetic field to drop abruptly to nearly zero, as the "Heater1, no barrier" curve in FIG. 22A shows. In contrast, more than 50% of magnetic field is preserved in all three heater cases during a quench in the graded coil, as the "Heaterx, 8-turn" dashed curves in FIG. 22A show, indicating that the heater-generated hot-spots are successfully contained and no complete thermal-cutoff results. Note that the fraction of field preserved in the "Heater1, 8-turn" case is higher than those in the "Heater2, 8-turn" and "Heater3, 8-turn" cases. This is because for the Heater1 case, there are a total of 32 turns (16 from each outer, cool side of the barriers) out of 40 turns (on the upper half of the coil) available for carrying current, whereas there are only 16 turns available for the other two heater cases.

Figure 22B:
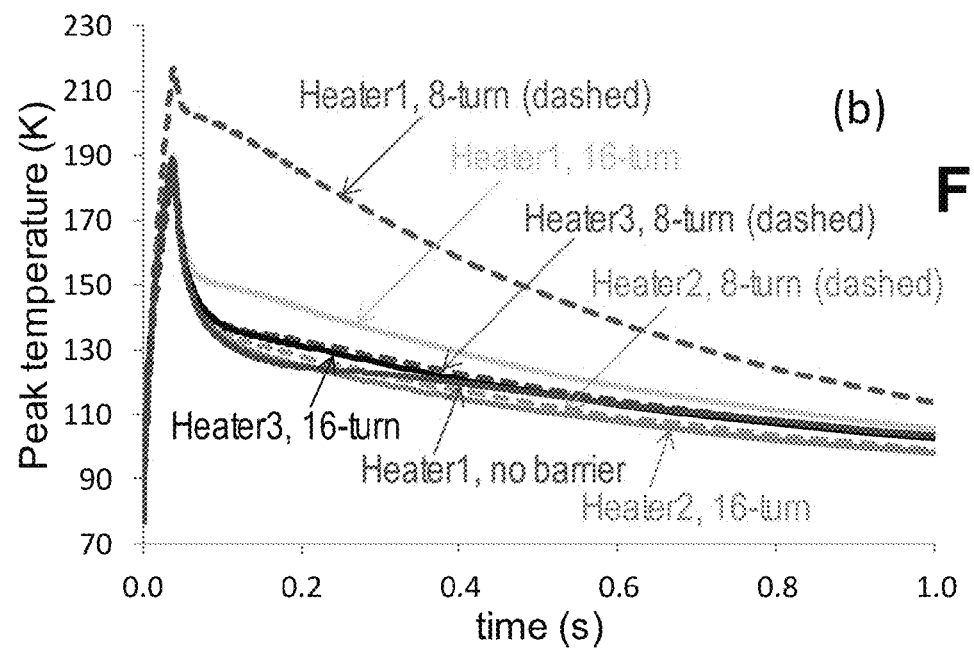
FIG. 22B is a graph showing normalized the corresponding temperature versus time profiles, in accordance with various embodiments of the present disclosure.
Figure 23A:
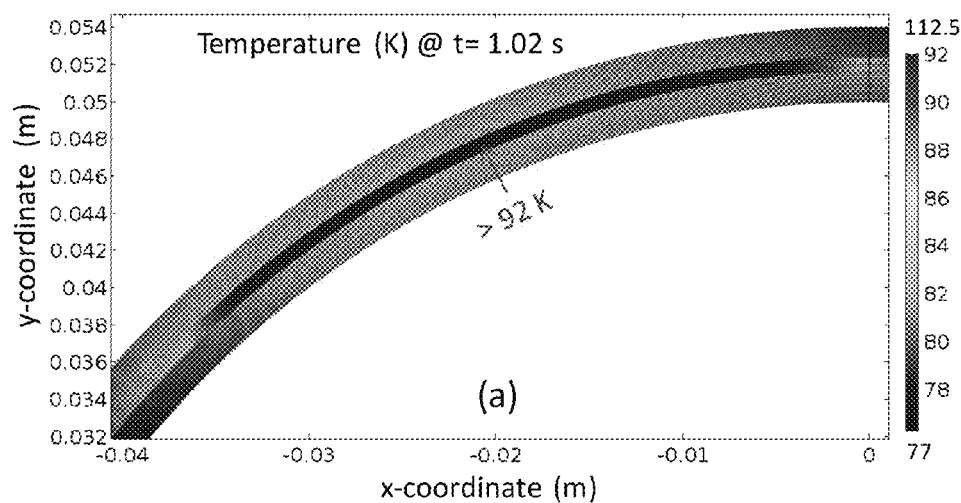
FIG. 23A is a graph showing a snapshot of the temperature distribution during a quench initiated by Heater1 in the coil with the 8-turn design at 77 K.

FIG. 22B shows peak temperature at the hot-spot versus time profiles corresponding to all cases in FIG. 22B. The peak temperatures generated by Heater2 and Heater3 are slightly lower than that of the non-graded coil, showing that the cooling on either the outer or inner radius is sufficient to dissipate the heat generated by the heaters. The peak temperature of the hot-spot generated by Heater1 is ~217 K, about 29 K higher, and decreases more slowly than the other cases. The reason for this is seen in FIG. 23A, which shows a snapshot of the thermal-cutoff generated by Heater1; much of the heat generated by Heater1 is contained between the overlapped insulation segments. The eight turns between the thermal barriers form a long, narrow heat mass channel for the heat to propagate, and as a result the heat builds up quickly and dissipates inefficiently and slowly along the contained channel. Nevertheless, a complete thermal cutoff, i.e., normal zone across the entire radial cross section of the coil, is prevented. FIG. 22B reflects the fact that despite the high peak hot-spot temperature generated by a strong heater energy at different locations, the peak temperature in each case eventually returns to the operating temperature, signifying complete recovery. In all cases, when the temperature drops below $T_c$=92 K during recovery, the magnetic field recovers slowly to the original value, but recovery in the 8-turn GRNI coil is ~23% faster than that in the non-graded NI counterpart.

Figure 24A:
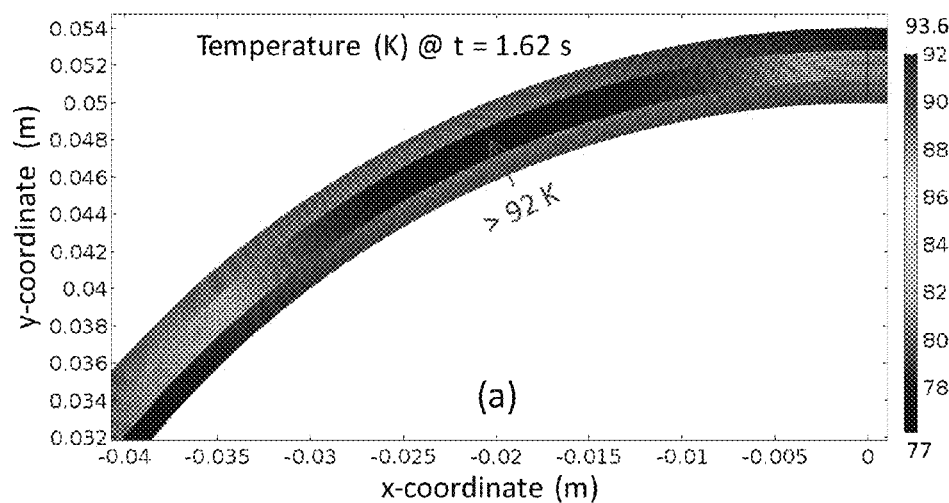
FIG. 24A is a graph showing a snapshot of the temperature distribution during a quench initiated by Heater1 in the coil with the 16-turn design at 77 K.

To demonstrate the option in lowering the peak temperature around Heater1, here the 8-turn design is modified by doubling the turn number between the double-barrier to 16 turns, with 12 turns left on each side outside of the barriers. Hereafter, this new design is referred as the "16-turn" design. The normalized center field and temperature profiles generated from the 16-turn design (labeled as "Heaterx, 16 turns", with the same heater locations as in the 8-turn cases) are also included in FIGS. 22A and 22B for easy comparison. Since now there are only 12 turns (versus 16 turns in the 8-turn design) available for carrying current near Heater2 and Heater3, the fractions of field preserved are lower in the 16-turn design (~0.4) than the 8-turn design (~0.5) in both heater cases. Surprisingly, for the Heater1 case, the fraction of field preserved is higher in the 16-turn design than that in the 8-turn design (~0.65 versus 0.63), despite the fewer current-carrying turns outside the barriers (total 24 turns versus 32 turns) near the Heater1. As expected, by increasing the number of turns between the barriers, the heat generated between the barriers by Heater1 is now dissipated more effectively along a wider heat mass channel, as shown in FIG. 24A, resulting in a lower peak temperature, which is now ~190 K, as compared to ~217 K in the 8-turn design. The peak temperature also decreases much faster than in the 8-turn design after the heater is turned off.

Simulation Results—4.2 K Cases

All 4.2 K simulations are performed using the same heater energy as in the 77 K cases under LHe pool cooling and constantly connected power supply. Table 3 lists the parameters used in the 4.2 K simulations. FIG. 25 shows the normalized center magnetic field and peak temperature versus time profiles obtained from the same non-graded NI coil and NI coils graded with the 8-turn and 16-turn designs used in the 77 K simulations. For the non-graded coil, the hot-spot created by Heater1 ("Heater1, no barrier" curves) is quickly amplified into a large "second" quench after the heater is turned off, leading to a complete thermal cutoff with a damaging peak temperature reaching 398 K. This second quench nevertheless recovers later. As a result, the center field first drops abruptly to zero and then recovers slowly. Similar behaviors occur for Heater2 (not shown) and Heater3 cases in the graded coils, as the "Heater3, 8-turn" and "Heater3, 16-turn" curves show, although the peak temperatures are now smaller than 270 K. In contrast, when the hot-spots created by Heater1 are contained by either the 8-turn barrier ("Heater1, 8-turn" curve) or 16-turn barrier ("Heater1, 16-turn" curve), no "second" quench occurs, leading to surprisingly large fractions of field preserved.

These results hint that for the 4.2 K cases, when the turn number between an insulated segment (of a barrier) and the nearest insulated segment (on another barrier) or cooling boundary is equal to or smaller than 16 turns (may be a few turns more), a hot-spot would be effectively contained and a fraction of the field would be preserved, as in the Heater1 cases. Otherwise, the hot-spot could be amplified and the field would be drop to nearly zero, as in the "no barrier" and Heater3 cases. These observations suggest a refined GRNI design demonstrated in FIG. 26. The new design, referred hereafter as the "2×8-turn" design, is composed of two sets of 8-turn barriers, with eight turns in between them. This design ensures that there is always no more than 16 turns from one insulated segment to the nearest insulated segment or cooling boundary. As a result, the conditions that would lead to an amplified hot-spot are removed.

The results in FIGS. 27A and 27B show that the 2×8-turn design works well at 4.2 K. The fractions of field preserved in all the 4.2 K graded cases are all >0.84, with peak temperatures lower than 202 K. Notice that the large, second quench occurred in the non-graded coil no longer exists with the new design. FIGS. 28A and 28B shows that the 2×8-turn design also works at 77 K (with the same parameters and cooling used in FIG. 22). The fractions of field preserved in all the 77 K cases are all >0.55, with peak temperatures lower than 217 K. These 77 K results are comparable to those for the 77 K, 8-turn design shown in FIG. 22.

The conditions for the proposed GRNI method to work properly are that the NI coil must be self-protecting and it must be able to recharge itself during recovery. The latter implies that the power supply must remain connected during the quench-recovery process. This requirement further simplifies the protection design and lowers the costs of fabrication and operation of HTS magnets.

An effective grading design must maintain the self-protecting capability of the NI coil that the grading applied to. The turn-wise current sharing self-protection mechanism shown in FIG. 17 implies that for a given NI coil, there is a minimum number of turns outside the barriers, as shown in FIG. 21, that must be present to carry the shared current and heat to maintain the self-protection capability of the coil. Once the minimum number of turns for self-protection is found, the remaining task is to design the barriers such that the benefit in field preservation balances the increased peak temperature. FIG. 22 demonstrated that a larger number of turns between the barriers lower the peak hot-spot temperature, but also reduces turns available to carry current, resulting in a smaller fraction of field preservation. Another important design parameter is the overlapping length of the insulation segments. The overlapping length must be sufficiently long to avoid the heat from leaking to the current-carrying turns through the overlapped channel to the nearest conductive opening. However, it must not be too long to obstruct the cooling and current sharing capabilities. The 8-turn, 16-turn and 2×8-turn designs always overlap the insulation arc segments in 45 degree arc angle; in this way, the conductive arc segments are left with also a 45 degree arc angle. Coils with smaller diameter may need longer overlapped insulation segments and coils with larger diameter can have shorter overlapped lengths.

Besides the design parameters shown in FIG. 21, the thickness and material properties of the barriers also affect the performance of the grading. The thicker the thermal insulation layer, the less heat leaks to the cool side of the coil, and thus the larger fraction of magnetic field preserved. Since a thicker thermal barrier also renders less heat dissipation on and cooling from the other side of the barrier, however, the peak hot-spot temperature increases with thicker barrier. Ideally, the materials used for the barriers would be thermally insulating to limit thermal-cutoff but electrically conductive to allow full capacity in turn-wise current sharing as shown, for example, in FIG. 34. In general, a material with high thermal resistivity also has high electrical resistivity. Therefore, in some embodiments disclosed herein the barrier designs are based on the assumption that the materials are either an insulator or a conductor, both thermally and electrically. The design patterns presented in FIG. 21 are not the only viable solutions; grading design based on other more efficient material properties and grading patterns and better manufacturability are possible. In general, the more turns a single coil has, the more feasibility a design has in selecting grading patterns, barrier turn placements and parameters to control the peak temperature under a safe limit and maximize the magnetic field preservation while maintaining the self-protection capability.

Figure 23B:
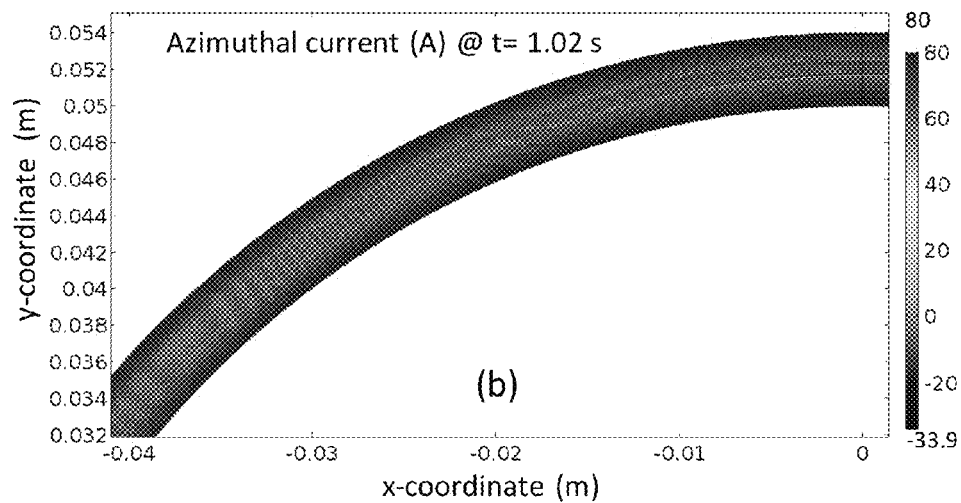
FIG. 23B is a graph showing the corresponding azimuthal current distribution, in accordance with various embodiments of the present disclosure.
Figure 24B:
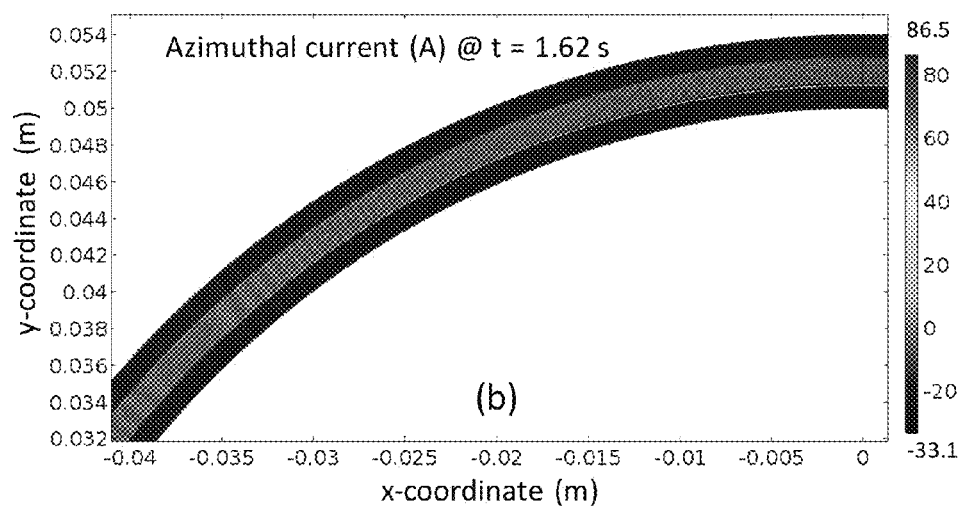
FIG. 24B is a graph showing the corresponding azimuthal current distribution, in accordance with various embodiments of the present disclosure.

Since magnetic field strength is proportional to the magnitude of the field-generating current, the theoretical fraction of preserved center magnetic field is equal to the total number of current-carrying turns on the cool side of the barriers divided by the total number of turns in the coil. So the theoretical fraction of field preserved for the Heater1 case is 32/40=0.8 for the 8-turn and 2×8-turn designs, and 24/40=0.6 for the 16-turn design. The actual fractions, however, depend on the effectiveness of the design. For example, FIG. 23A shows that for the Heater1 case of the 8-turn design, due to high heat buildup within the narrow heat mass channel, heat leaks to the cool sides of the barriers, rising the temperature there above the current-sharing temperature. This turns parts of the current-carrying turns resistive, causing them to carry a current $<=I_a$ (=80 A), as shown in FIG. 23B, resulting in lower actual fraction, at ~0.63, lower than the theoretical 0.8. FIG. 24A shows that for the Heater1 case of the 16-turn design, wider heat mass channel allows more efficient heat dissipation, resulting in less heat leak across the barriers. Therefore, the temperature outside the barriers remain below the current-sharing temperature and so the current-carrying turns are able to support an overcurrent after absorbing additional current shared from the normal turns, in addition to the transport current, as shown in FIG. 24B (with a current 86.5 A>$I_a$). As a result, the actual fraction in this case is ~0.65, higher than the theoretical 0.6. For Heater2 and Heater3 cases, since the hot-spot is cooled at one side and has more turns than the Heater1 cases act as heat mass, little heat leaks across the insulation segment. As a result, in all the designs, the actual fractions for Heater2 and Heater3 cases are higher than the respective theoretical values.

Due mainly to the low effective heat capacity at 4.2 K, a NI coil has much lower thermal stability when bath-cooled by LHe than when operated at 77 K. A local quench, if not contained, could be amplified (i.e., more turns become normal quickly) through fast heat propagation into a large-scale quench with a damaging peak temperature. Such scenario is seen from the quick "second" quench observed in the "Heater1, no barrier" case in FIG. 25B (and 15B). This second quench is induced by the remnant heat of the heater before the hot-spot temperature drops below $T_c$. Even though the peak temperature reaches 398 K, the coil eventually recovers from the second quench after much of the transport current has bypassed the thermal-cutoff region. For the "Heater3, 8-turn" and "Heater3, 16-turn" cases, the turn numbers between the cooling boundary and the nearest insulated barrier segment are 24 and 28 turns, respectively. These are greater than 16 turns, which likely is equal to or close to the threshold for effective heat containment. As a result, even though heat flow to the current-carrying turns is blocked by an insulated barrier in these designs, the hot-spots created by Heater3 are amplified after the heater is turned off, leading to a recoverable second quench. The resulted large volume of heat energy eventually causes a complete thermal-cutoff, leading to total loss of the magnetic field, as seen in FIG. 25A. FIGS. 27 and 28 show that the 2×8-turn design not only effectively preserves the magnetic field and self-protecting capability in both the 4.2 K and 77 K cases, more importantly, it also improves stability by preventing amplified quenches from happening and reduces substantially quench-induced field drops in the 4.2 K cases.

The exceedingly high peak temperature generated by the recoverable second quench seen in the "Heater1, no barrier" case in FIG. 25B tells that even a non-graded NI coil operated at 4.2 K is self-protecting, it may still need a quench protection to limit the peak temperature in the event of a quench. In a high-field coil operated at 4.2 K, the energy density can be tens to hundreds of $J/cm^3$. An accumulated turn-wise current sharing originating from multiple normal turns in such coil could create enough Joule heating along the overcurrent turns to generate a whole-coil quench. In such case, a NI coil is no longer self-protecting. A barrier design similar to the 2×8-turn design can be used to limit the number of normal turns in a thermal-cutoff and thus could potentially prevent such large-scale quench from happening and render a non-self-protecting NI coil capable of self-protecting. More detailed study is needed to explore this potential advantage.

Notice from Tables 2 and 3 the current ratios $I_d/I_c(sf, 4.2 K)=0.34$ and $I_d/I_c(B_{max}, 4.2 K)=0.68$ are about the same as $I_d/I_c(sf, 77 K)=0.36$ and $I_d/I_c(B_{max}, 77 K)=0.69$, respectively. Even so, FIGS. 15 and 16 show that the minimum fraction of field preserved among the 4.2 K cases, at 0.84, is much higher than that in the 77 K cases, at 0.55. This is because the self-field critical current $I_{c0}$ is higher and the $I_c(B, \theta)$ curve (the lift-factor curve described by equation (10)) has higher and wider field- and angular-dependent peaks near 4.2 K than near 77 K. The consequence is that the neighboring superconducting turns are able to absorb more turn-wise current shared from the normal turns, causing less overcurrent-induced Joule heating and thus smaller thermal-cutoff, in the 4.2 K cases than in the 77 K cases.

For a coil with very large number of turns or very strong cooling and operated at 77 K, complete thermal-cutoff is less likely, even for large heat disturbance energy. This is because the temperature at the turns far from the hot-spot will remain well below $T_c$. In such a scenario, multiple sets of barriers similar to the 2×8-turn design can be installed to limit the size of a thermal-cutoff region. By doing so, more current is preserved in a quench and thus recovery is faster and the magnetic field transient is smaller. Therefore, a multiple-barrier design brings the same beneficial effects discussed previously to such coils/magnets.

Figure 29:
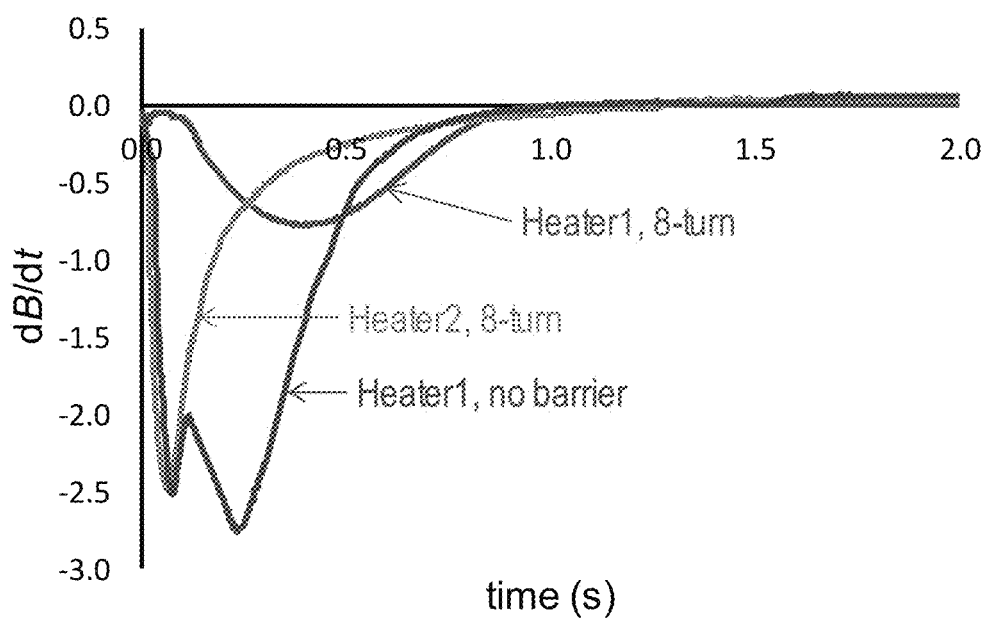
FIG. 29 is a graph showing comparison of the rates of change in preserved magnetic fields generated by the "Heater1, 8-turn", "Heater2, 8-turn" and "Heater1, no barrier" cases shown in FIG. 22A, in accordance with various embodiments of the present disclosure.
Figure 30A:
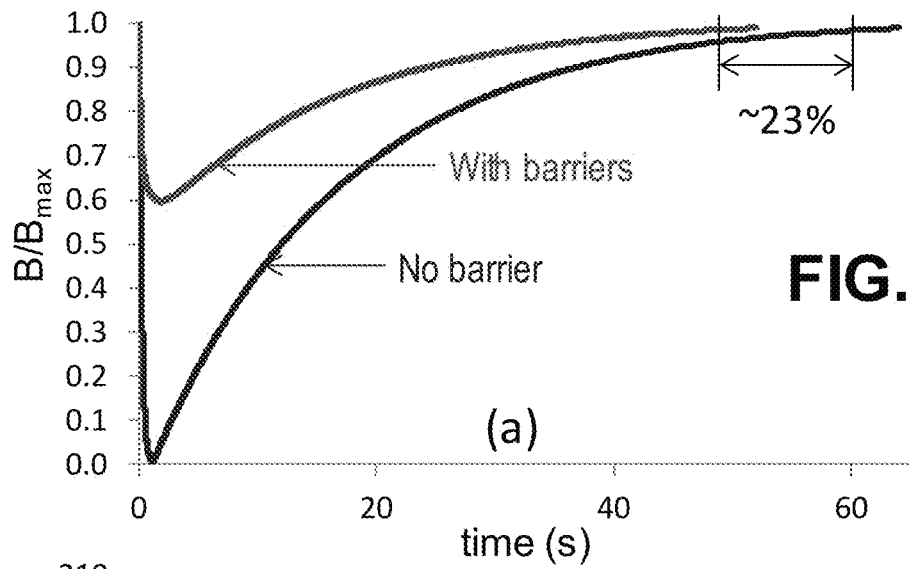
FIG. 30A shows normalized center magnetic field versus time profiles during quench-recovery at 77 K on a graded coil and non-graded counterpart, both with 4 mH inductance, in accordance with various embodiments of the present disclosure.
Figure 30B:
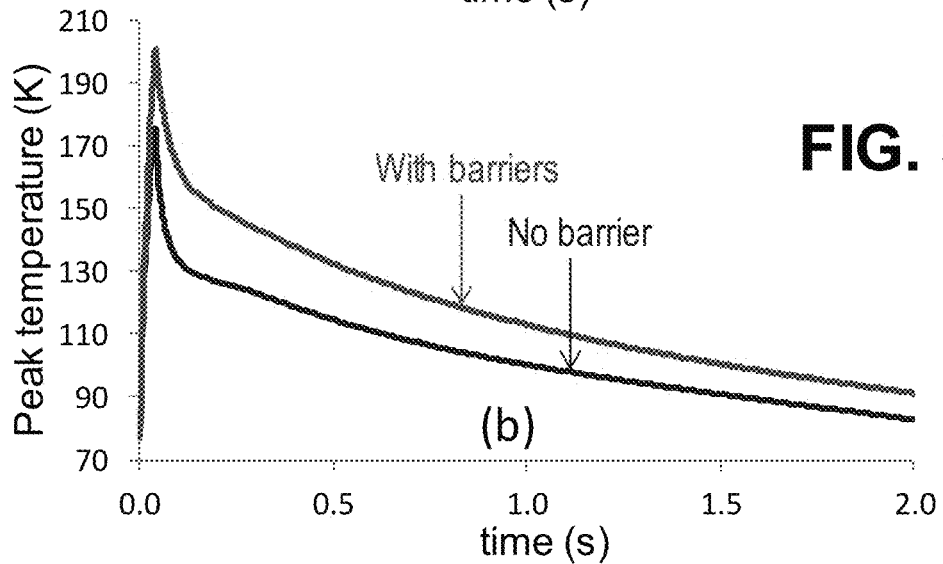
FIG. 30B is a graph showing the temperature versus time profiles corresponding to FIG. 30A.
Figure 30C:
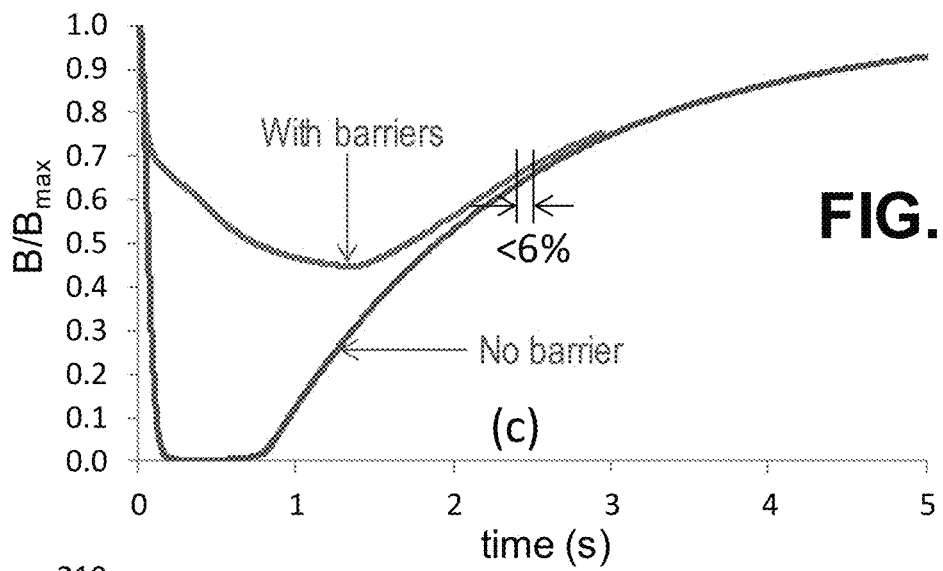
FIG. 30C shows normalized center magnetic field versus time profiles during quench-recovery at 77 K on the same graded and non-graded coils as in FIG. 30A, but both with 0.4 mH inductance, in accordance with various embodiments of the present disclosure.
Figure 30D:
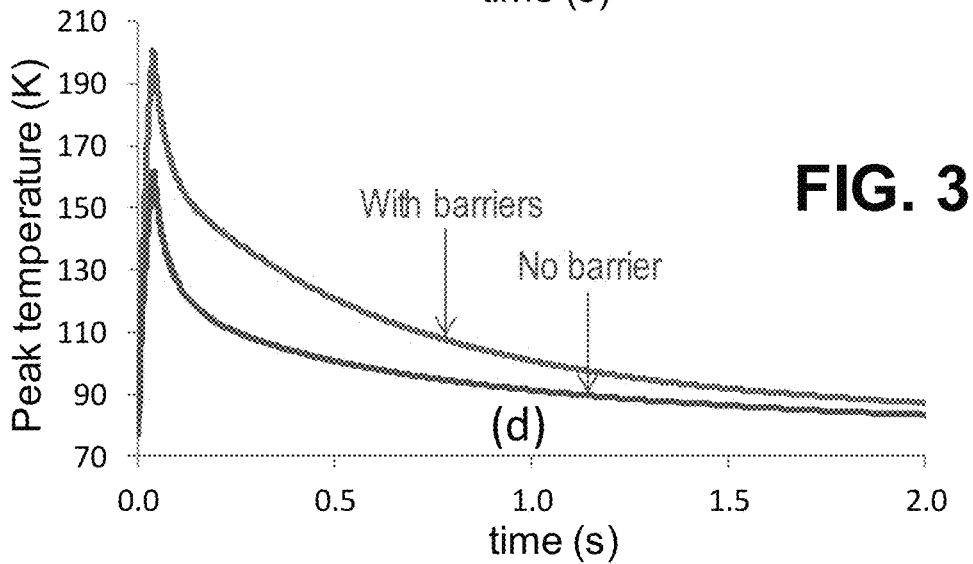
FIG. 30D is a graph showing the temperature versus time profiles corresponding to FIG. 30C, in accordance with various embodiments of the present disclosure.

A quench in a non-graded NI coil can lead to a rapid decrease, and thus a fast transient in magnetic field. As mentioned in Issue 4, experimental and computational results show that a fast magnetic field transient in one of the many coils of a multi-coil NI magnet with large inductance can inductively induce quenches in other coils. Such inductive quench propagation, though beneficial to insulated multi-coil magnets, is undesirable in a multi-coil magnet composed of self-protecting NI coils, since instead of recharging just the initially quenched coil during a recovery, all quenched coils must recover, extending the recovery time significantly. Using the GRNI approach to preserve a fraction of magnetic field during quench-recovery, the degree (rate, magnitude and duration) of magnetic field transient is reduced, lowering the likelihood of inductive quench propagation. FIG. 29 compares the rate of change (dB/dt) in the generated magnetic fields corresponding to the "Heater1, 8-turn", "Heater2, 8-turn" and "Heater1, no barrier" cases shown in FIG. 22A. As compared to the degree of transient in the "Heater1, no-barrier" case, the transient in the "Heater1, 8-turn" case is relatively much smaller and the transient in the "Heater2, 8-turn" case is slightly smaller in magnitude but much shorter in duration. A transient with either a smaller magnitude or a shorter duration reduces the inductive coupling effects on other coils of a multi-coil magnet in the event of a quench. Therefore, the GRNI method, when applied to a multi-coil NI magnet composed of self-protecting NI coils, not only increases stability but also accelerates recovery, as only the initially quenched coil needs to recover.

The beneficial effects of the proposed approach in accelerating recovery in NI coils/magnets and reducing the likelihood of quenching in multi-coil NI magnets increases with coil inductance. As predicted by equation (4), a coil with larger inductance requires longer time to recharge; so the more current preserved during a quench, the less current that needs to be re-redistributed and thus the faster the recovery in such coil. In a multi-coil magnet, the larger the inductance, the stronger the inductive coupling effects between coils and therefore inductive quench propagation becomes more likely. FIG. 30 compares the effects of the 8-turn design on two identical 39.5-turn NI coils used previously; the only difference is in their inductances. The inductance is 4 mH (as before) for the coil that generates the results shown in FIGS. 30A and 30B, and 0.4 mH for FIGS. 30C and 30D. The actual, calculated inductance for the 39.5-turn NI coil is 0.4 mH; the 4 mH inductance shown in Table 1 is numerically increased 10× to mimic the inductance effects of a (~3×) larger coil. For the 4 mH coil, when the 8-turn design is added to the coil, the quench-recovery process is accelerated by 23% when compared to the non-graded coil. In contrast, the improvement is less than 6% in the 0.4 mH coil when the same grading is added. Moreover, ~60% of the magnetic field is preserved in the 4 mH coil, whereas only ~45% in the 0.4 mH coil. In both coils, the peak temperatures corresponding to the same grading/non-grading cases are about the same. These results show that the proposed GRNI method is more effective in reducing the recovery time and increasing the stability in multi-coil magnets with larger inductance.

Any form of increasing the turn-to-turn resistance accelerates the ramp rate. From equation (4), the larger the characteristic resistance $R_r$ (i.e., total turn-to-turn resistance), the greater the improvement in ramp time. Therefore, another benefit of the proposed GRNI method is the mitigation of Issue 1, i.e., the ramp rate is improved. In fact, all results regarding recovery time in the graded coils are affected by increased $R_r$ (due to the grading), albeit the effect is very small.

Implementation of the general GRNI concept in a practical way requires the ability to control the turn-to-turn resistance, which depends on a number of parameters, including the resistivities and thicknesses of all materials present, the surface roughness, interface quality and pressure. A number of approaches can be used for achieving resistivity grading, including sputtering of metallic claddings and printing of conductive inks with varying properties directly to the conductor surface or the surface of a co-wound strip, or co-winding various sectional metallic/resistive strips with different resistivities and/or thicknesses. Sputtering is likely effective for short samples. Co-winding adds some complexity to the magnet winding process and is limited to materials available in thin strip. It also poses mechanical integrity challenge at the thickness transitions. Conductive ink printing via inkjet or 3D printing is expected to be the most accurate and feasible method, and allows control of the resistance and patterning by varying the material deposited and/or its thickness continuously in real-time and is well-suited for long-length reel-to-reel grading fabrication. Conductive ink printing is a fabrication technique based on well-established conductive metallic ink printing technologies for printed electronics. The electrical resistivity of a conductive ink can be customized, ranging from an electrical conductor to resistor or insulator. The thermal resistivity of conductive inks, though not well-documented, should in general increase with electrical resistivity.

Figure 31:
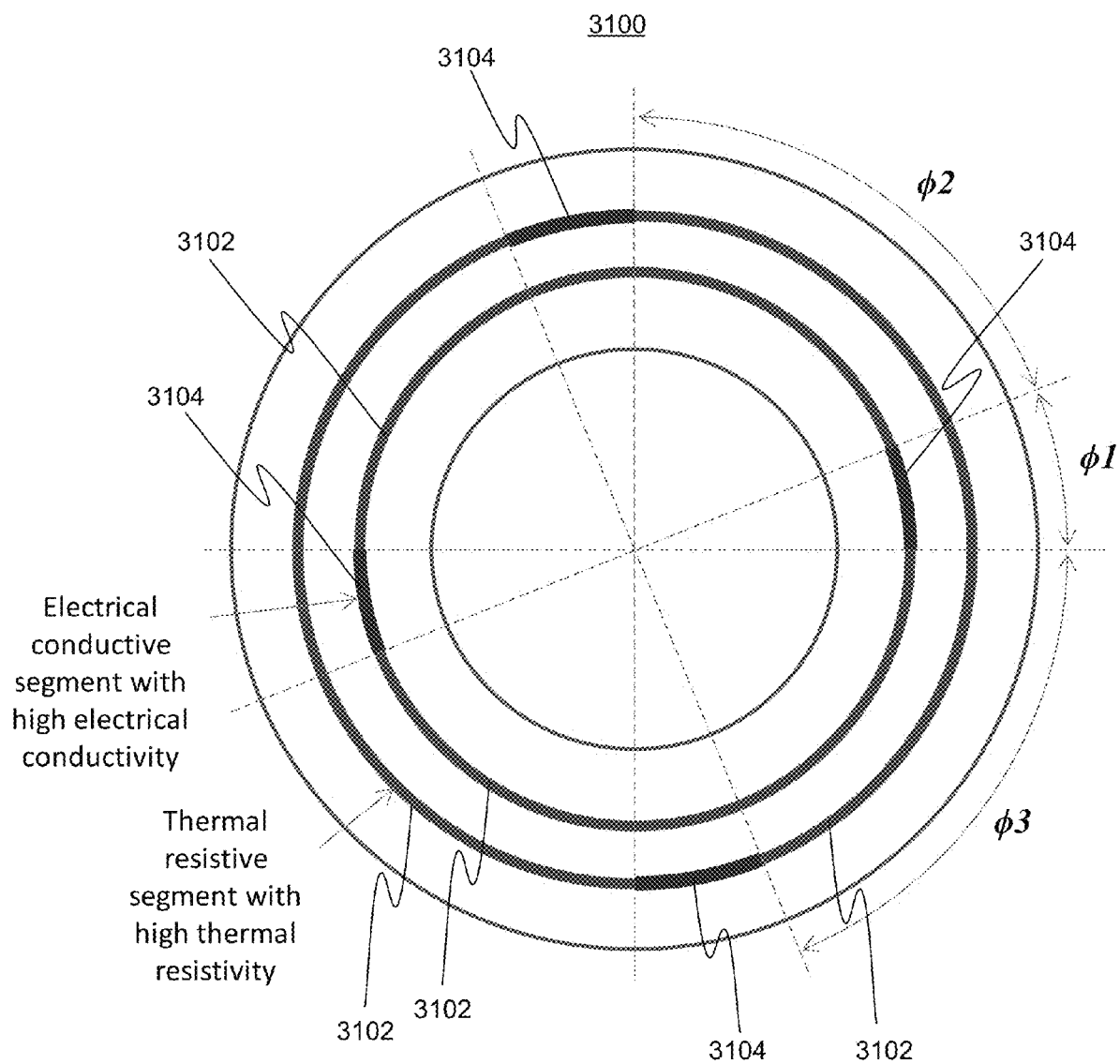
FIG. 31 illustrates arc lengths or arc angles as design parameters of a modified NI coil design, in accordance with various embodiments of the present disclosure.

FIG. 31 illustrates arc lengths (or in arc angles) $\varphi 1$, $\varphi 2$, and $\varphi 3$ as design parameters of a modified NI coil design 3100, in accordance with various embodiments of the present disclosure. Coil 3100 includes electrical conductive segments 3104 and thermal resistive segments 3102, with $\varphi 1$ representing the arc length (or in arc angle) of the electrical conductive segments 3104, and $\varphi 2$ and $\varphi 3$ representing the minimum arc lengths (or in arc angles) of the overlapped thermal resistive segments 3102 of two adjacent barriers, which extends from one end of an electrical conductive segment 3104 located on one of the barriers to the nearest end of the nearest electrical conductive segment 3102 located on the other barrier.

Any material with a thermal conductivity smaller than 0.5 W/(m.K) at room temperature (300 K) is considered a "thermal resistive" or "thermally resistive" material (resistivity being the reciprocal of conductivity). Any material with an electrical conductivity larger than $5 \times 10^5$ S/m at room temperature (300 K) is considered an "electrical conductive" or "electrically conductive" material. An electrical conductive segment/portion of a barrier can be composed of electrical conductive material or represent a gap in the barrier that permits direct turn-wise current sharing.

The arc length (or in arc angle) $\varphi 1$ is selected to be long enough to let enough current to flow across the barrier (e.g., from the normal turns to the neighboring superconducting turns during a formation of a thermal cutoff). The electrical conductive segment 3104 is in general also thermal conductive, so it also allows heat to pass through the barrier turn, which helps to dissipate heat to keep a lower peak temperature but also increases the thermal-cutoff size in radial direction since heat now passes through the barrier turn. The arc lengths (or in arc angles) $\varphi 2$ and $\varphi 3$ are selected to be long enough to minimize heat from leaking from one electrical conductive segment 3104 (which is in general also thermal conductive) on one barrier to the nearest electrical conductive segment 3104 on the other barrier.

Figure 26:
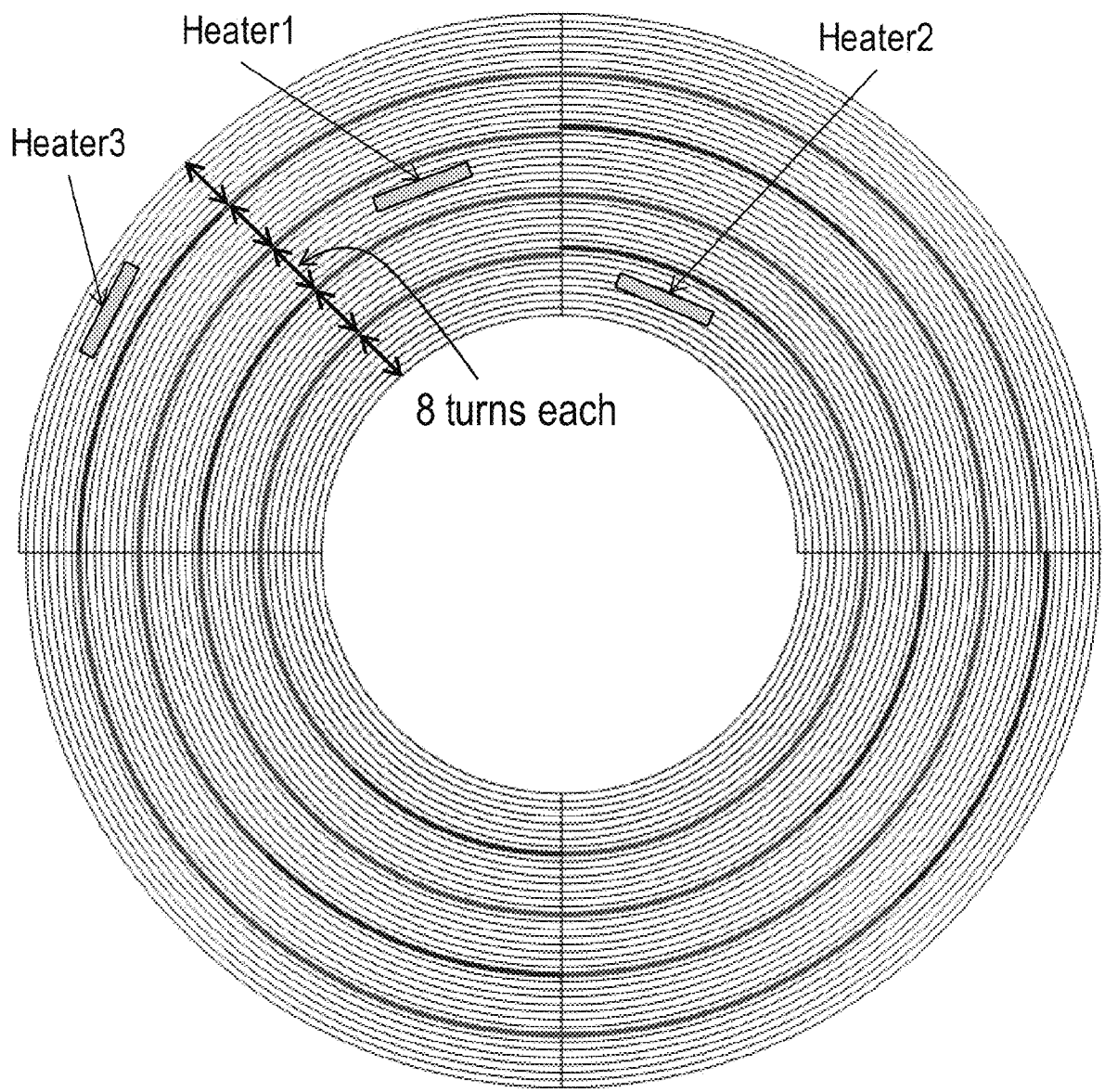
FIG. 26 illustrates a GRNI magnet with a 2×8-turn barrier design, in accordance with various embodiments of the present disclosure.

In some embodiments, the arc lengths (or arc angles) $\varphi 1$ and $\varphi 2$ can be the same as shown, for example, in FIGS. 21 and 26 which show designs with 45-degree arc lengths. The arc lengths (or in arc angles) $\varphi 1$, $\varphi 2$ and/or $\varphi 3$ can be different for different barriers as shown, for example, in FIG. 33.

In some embodiments, an ideal electrical conductive segment is also thermally resistive, and an ideal thermal resistive segment is also electrically conductive. But in general, a material with high thermal resistivity also has high electrical resistivity (i.e., low electrical conductivity), and vice versa.

Figure 32:
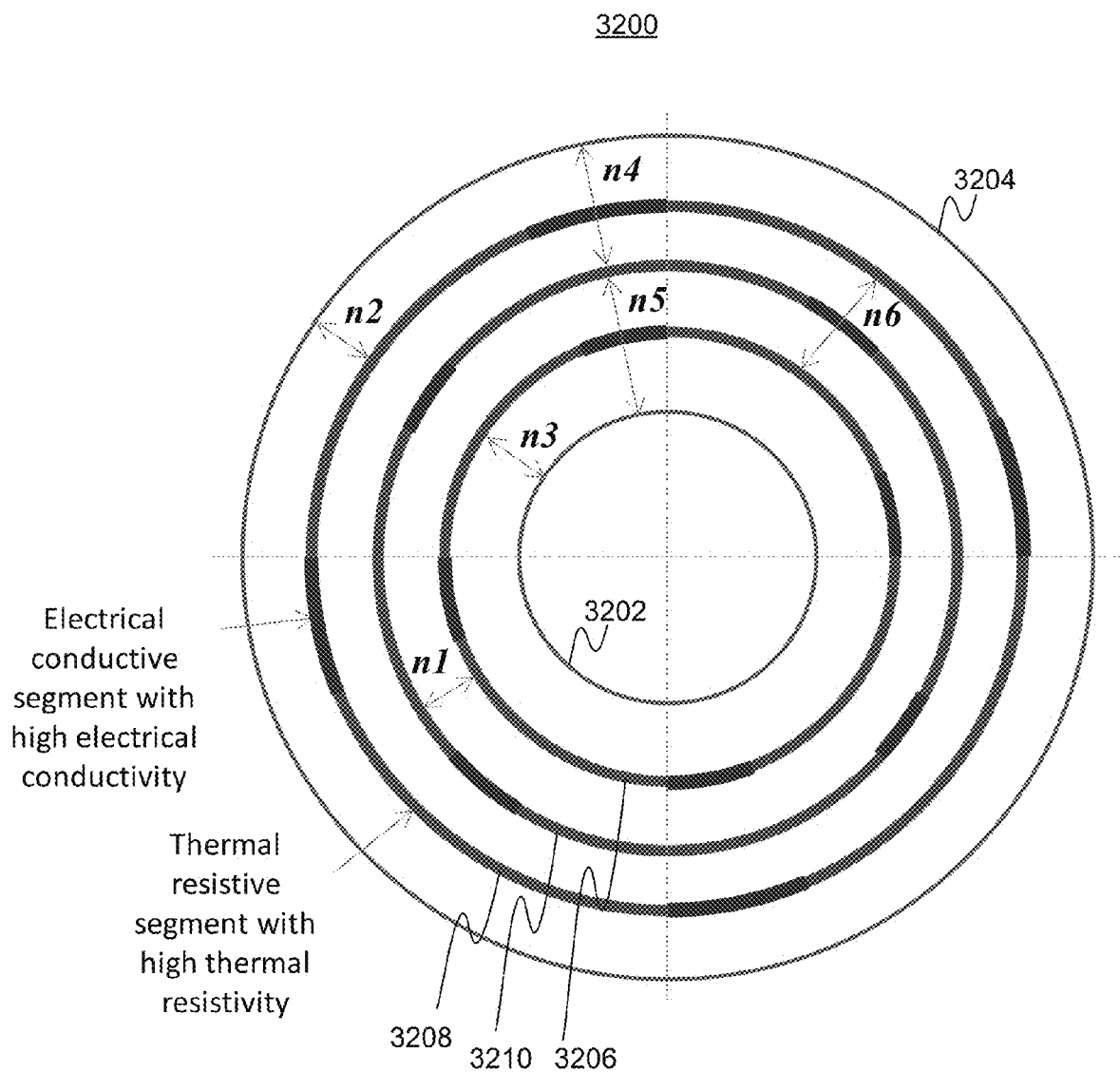
FIG. 32 illustrates turn numbers as design parameters of a modified NI coil design, in accordance with various embodiments of the present disclosure.

FIG. 32 illustrates turn numbers as design parameters of a modified NI coil design 3200, in accordance with various embodiments of the present disclosure. Coil 3200 includes an innermost turn 3202, an outermost turn 3204, an innermost barrier 3206, an outermost barrier 3208, and a middle barrier 3210. Coil 3200 can be configured by parameters n1-n6. Each of barriers 3206-3210 is considered to be adjacent to one or two of the other barriers 3206-3210. For example, middle barrier 3210 is adjacent to two different barriers: innermost barrier 3206 and outermost barrier 3208, innermost barrier 3206 is adjacent to middle barrier 3210 (and the innermost turn 3202), and outermost barrier 3208 is adjacent to middle barrier 3210 (and the outermost turn 3204). Other embodiments can include coil designs having more barriers than the three barriers 3206-3210 of coil 3200, as shown, for example, by the four-barrier coil design of FIG. 26, and each of the barriers in such a coil design will also be considered to be adjacent to one or two of the other barriers of the coil design.

Parameter n1 represents turns between two barriers (e.g., 3206 and 3210) and affects the peak temperature—the less turns, the smaller is the heat mass to dissipate the built-up heat (between the two barriers) and thus the higher the peak temperature. In general, the more n1 turns the better in the aspect of limiting peak temperature. In some embodiments, at very low cryogenic temperature, e.g., at 4.2 K, as simulations shown, there is a safe turn tolerance or limit that if not met, a large (probably recoverable) quench may be accelerated. So, there is a balance or tradeoff for the n1 turn number.

Parameter n2 is the number of turns from the outermost barrier 3208 to the outermost turn 3204 of the coil. Parameter n3 is the number of turns from the innermost barrier 3206 to the innermost turn 3202 of the coil. Parameters n4 and n5 are the number of turns from the nearest thermal resistive segment across an electrical conducting segment to the outermost turn 3204 (n4) or innermost turn 3202 (n5). Parameter n6 is the number of turns from the two nearest thermal resistive segments across an electrical conducting segment of a middle barrier such as 3210.

Parameters n2 and n3 can define the maximum ratio or fraction of current preserved, as n2 (or n3) divided by the total turn number of the coil 3200, when a thermal-cutoff occurs near the electrical conducting segment of a middle barrier such as 3210, e.g., in the region of n6, in an ideal case (i.e., when no heat leaks across the thermal resistive segments to lower the critical currents of the superconducting current-carrying turns in the regions outside of the region of n6).

Parameters n4 and n5 can define the maximum ratio or fraction of current preserved, as n4 (or n5) divided by the total turn number of the coil 3200, when a thermal-cutoff occurs in the region of n5 for the n4 parameter, or in the region of n4 for the n5 parameter, in an ideal case (i.e., when no heat leaks across the thermal resistive segment to lower the critical currents of the superconducting current-carrying turns).

In some very low cryogenic temperature cases, e.g., at 4.2 K, as simulations show, there is a safe turn tolerance or limit that must be met. If one of n1 to n6 surpasses this safe limit, a large, accelerated (probably recoverable) quench may occur. So, there is a balance or tradeoff for the turn numbers here.

Figure 33:
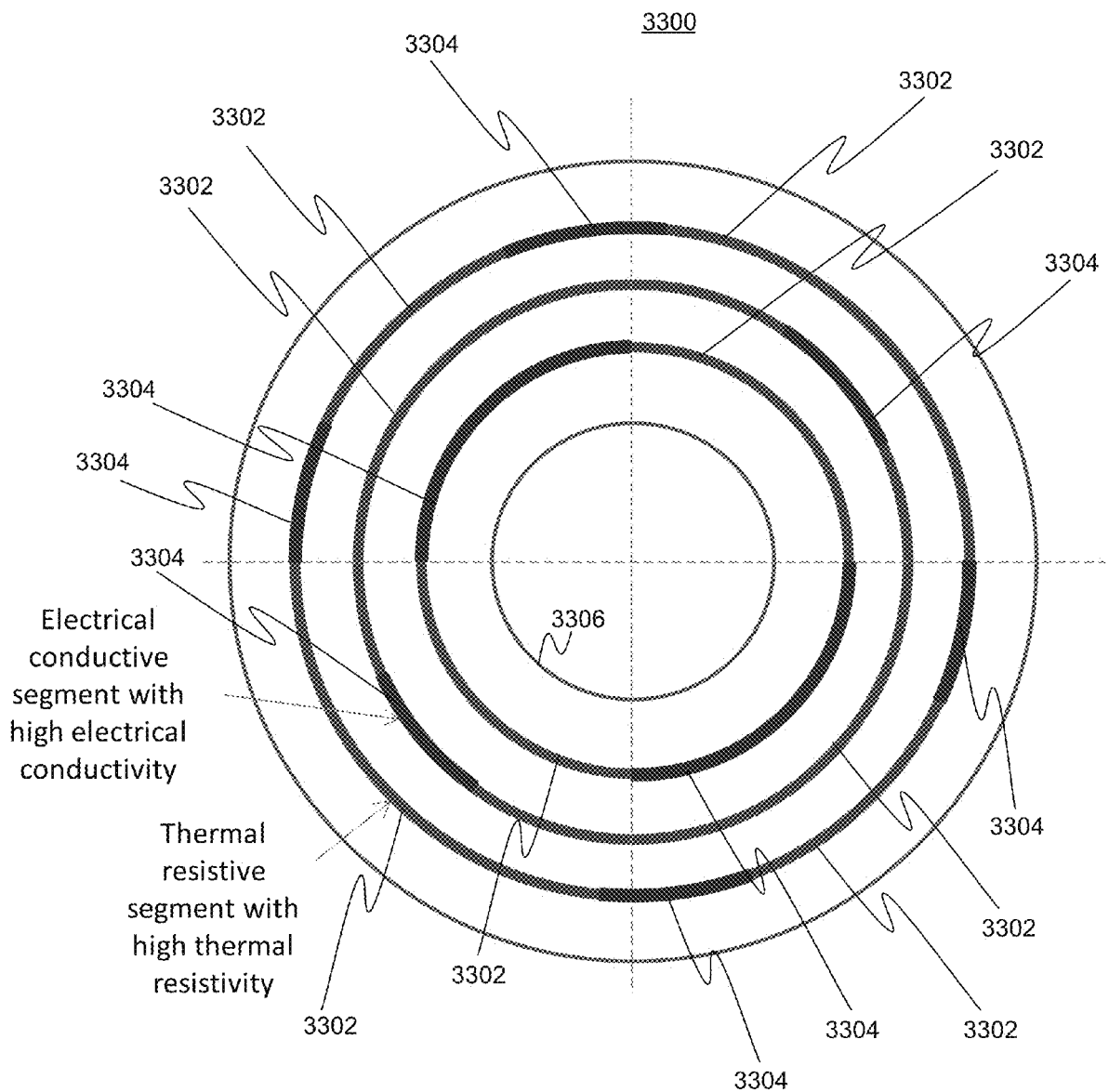
FIG. 33, illustrates a modified NI coil having arc lengths and numbers of the conductive and resistive segments varied from barrier to barrier, in accordance with various embodiments of the present disclosure.

FIG. 33, illustrates a modified NI coil 3300 having arc lengths and numbers of the conductive 3304 and resistive 3302 segments varied from barrier to barrier, in accordance with various embodiments of the present disclosure. The arc lengths and numbers of the conductive 3304 and resistive 3302 segments can be varied from barrier to barrier, to match the characteristic of a superconducting coil/magnet. For example, suppose the coil 3300 has weaker cooling on the innermost surface 3306, the electrical conductive (and in general also thermal conductive) segments 3304 on the innermost barrier (composed of segments 3302 and 3304 closest to the innermost surface 3306) are longer to let more heat to dissipate to the neighboring turns to compensate the weaker cooling on the innermost surface 3306 of the coil 3300.

Figure 34:
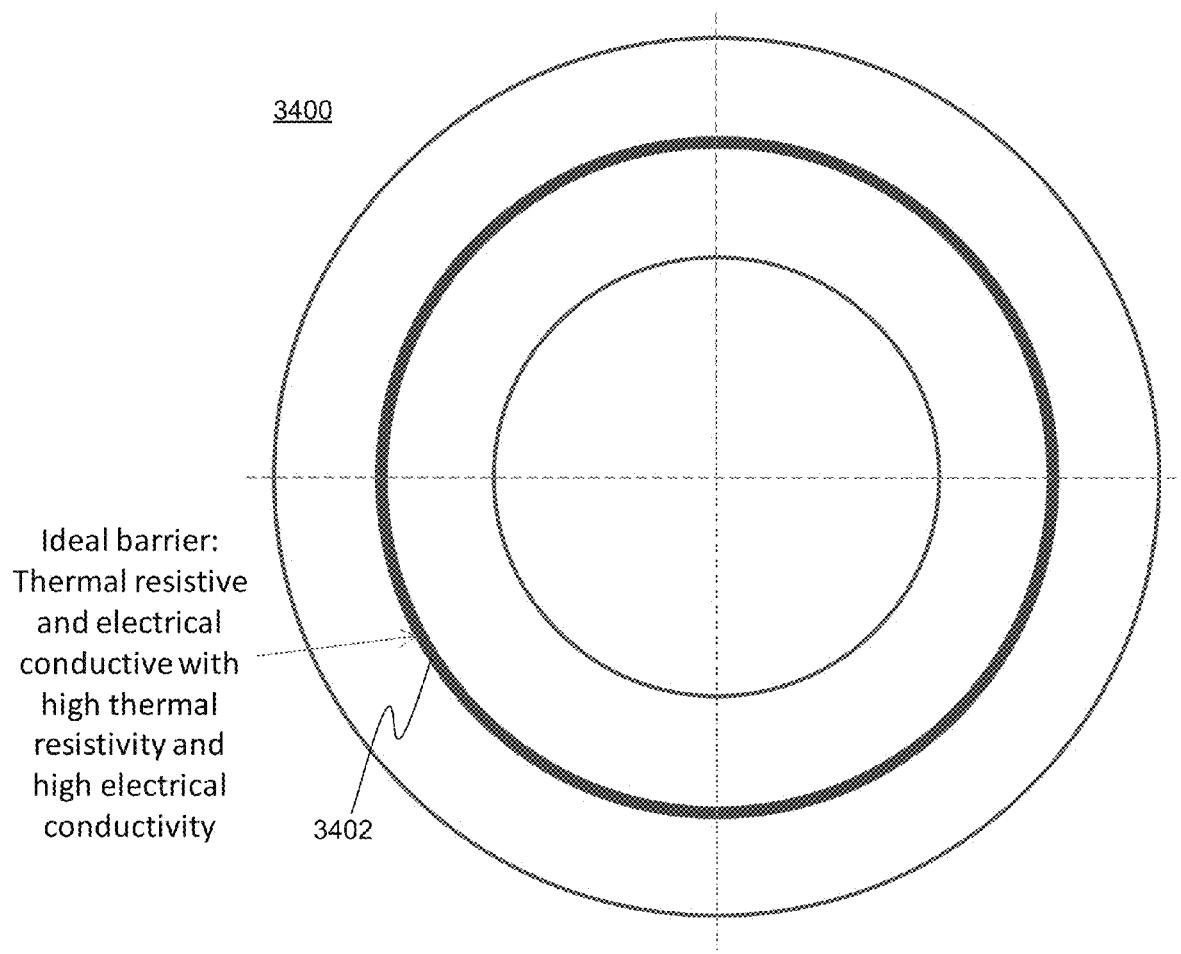
FIG. 34 illustrates a modified NI coil having a single-turn barrier, in accordance with various embodiments of the present disclosure.

FIG. 34 illustrates a modified NI coil 3400 having a single-turn barrier 3402, in accordance with various embodiments of the present disclosure. The single-turn barrier 3402 is composed of an ideal material that has very high thermal resistivity but very low electrical resistivity. Heat will be constrained to one side of barrier 3402 to reduce the size of a thermal-cutoff but current can still flow to the other side of barrier 3402 to maintain self-protection capability of the modified NI coil 3400.

GRNI designs disclosed herein can be applied to magnets with a winding conductor composed of non-insulated (e.g., in bare form or in bare, untreated form) superconductor material. For example, the GRNI designs are disclosed herein as applied to HTS NI coil magnets with a winding conductor composed of non-insulated (e.g., in bare, untreated form) REBCO superconductor tape. The designs can also be applied to any HTS NI coil magnet wound with other non-insulated HTS superconductor tapes, such as, for example, yttrium barium copper oxide (YBCO) superconductor tape and bismuth strontium calcium copper oxide (BSCCO) (Bi-2223) multi-filamentary superconductor tape.

GRNI designs disclosed herein can be applied to HTS NI coil magnets fabricated in any shape as long as the winding conductor can be wound to fit that shape. For example, the GRNI designs are disclosed herein as applied to HTS NI coil magnets in the form of circular pancake coil. The designs can also be applied to any HTS NI coil magnet fabricated in other forms, such as, for example, as a saddle-shaped racetrack coil for dipole magnet, as a twisted non-planar field coil used in the Wendelstein 7-X stellarator fusion reactor, or as a toroidal field coil used in ITER's tokamak fusion reactor.

Embodiments disclosed herein include a GRNI method designed specifically to mitigate issues including: slow recovery speed and potential quench propagation caused by fast magnetic field transient. The proposed resistance-grading method installs patterned turn-to-turn thermally (and electrically) resistive layers on selected turn-to-turn contact locations in a self-protecting NI coil to prevent the heat generated by a heat disturbance from propagating to form a large thermal-cutoff region while maintaining the turn-wise current sharing capability required for self-protection. This approach prevents the azimuthal current, and thus the magnetic field, from being reduced to nearly zero in a recoverable quench, significantly accelerating the post-quench recovery needed to bring the coil/magnet back to full functionality. When applied to multi-coil NI magnets, GRNI methods disclosed herein also reduce the likelihood of quenching, thus increasing the magnet stability.

GRNI designs disclosed herein were studied via simulations performed on a hybrid model that couples a circuit network model with 2D or 3D thermal and 3D electromagnetic models. As discussed herein, simulation results show the effects of design parameters and inductance on quench behavior, field preservation and field transient rate at 77 K and 4.2 K. Results also demonstrate that GRNI designs can effectively reduce recovery time and magnetic field drop and transient, and substantially enhance the thermal stability of NI coils operated at 4.2 K. Through the proposed method, self-protecting REBCO magnets with high operational reliability and availability can be built.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure.

What is claimed is:

1. A hypersonic aircraft having a disk-type homopolar motor/generator, the disk-type homopolar motor/generator comprising:
   an electrically conductive metal disk;
   an electrically conductive shaft coupled, mechanically and electrically, to the electrically conductive metal disk;
   a first electrical contact configured to be in electrical contact with an edge of the electrically conductive metal disk;
   a second electrical contact configured to be in electrical contact with the electrically conductive shaft; and
   a high temperature superconducting (HTS) non-insulated (NI) multi-coil magnet, comprising:
      a plurality of NI coils each comprising multiple turns and
      two or more thermal barriers each disposed between a different two adjacent turns of the NI coil, wherein an electrically conductive portion of one of the thermal barriers does not overlap with an electrically conductive portion of a different adjacent one of the thermal barriers,
   wherein the HTS NI coil magnet is arranged so that a normal component of a magnetic field generated by the HTS NI coil magnet is substantially perpendicular to a face of the metal disk.

2. The hypersonic aircraft of claim 1, wherein the electrically conductive portion of the one of the thermal barriers is covered by a thermal resistive portion of the different adjacent one of the thermal barriers.

3. The hypersonic aircraft of claim 1, wherein a thermal resistive portion of the one of the thermal barriers overlaps with a thermal resistive portion of the different adjacent one of the thermal barriers.

4. The hypersonic aircraft of claim 1, wherein the NI multi-coil comprises a winding conductor selected from a group consisting of:
   non-insulated YBCO superconductor tape;
   non-insulated REBCO superconductor tape; and
   non-insulated Bi-2223 multi-filamentary superconductor tape.

5. The hypersonic aircraft of claim 1, wherein each of the two or more thermal barriers is formed as a layer selected from the group consisting of:
   a co-wound layer having thermal resistive and electrical conductive segments;

a layer soldered or bonded to a winding conductor, the soldered or bonded layer having thermal resistive and electrical conductive segments;

a printed layer on a co-wound layer, the printed layer on the co-wound layer having thermal resistive and electrical conductive segments; and a printed layer on a surface of a winding conductor, the printed layer on the surface of the winding conductor having thermal resistive and electrical conductive segments.

6. The hypersonic aircraft of claim 1, wherein the coil is a circular pancake coil or a racetrack coil.

* * * * *